United States Patent
Takemura et al.

(10) Patent No.: US 11,768,434 B2
(45) Date of Patent: Sep. 26, 2023

(54) POLYMER HAVING A STRUCTURE OF POLYAMIDE, POLYAMIDE-IMIDE, OR POLYIMIDE, PHOTOSENSITIVE RESIN COMPOSITION, PATTERNING PROCESS, PHOTOSENSITIVE DRY FILM, AND PROTECTIVE FILM FOR ELECTRIC AND ELECTRONIC PARTS

(71) Applicant: SHIN-ETSU CHEMICAL CO., LTD., Tokyo (JP)

(72) Inventors: Katsuya Takemura, Joetsu (JP); Masashi Iio, Joetsu (JP); Hiroyuki Urano, Joetsu (JP); Kazuya Honda, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 418 days.

(21) Appl. No.: 16/512,589

(22) Filed: Jul. 16, 2019

(65) Prior Publication Data
US 2020/0041903 A1 Feb. 6, 2020

(30) Foreign Application Priority Data
Aug. 1, 2018 (JP) .................................. 2018-144831

(51) Int. Cl.
G03F 7/023 (2006.01)
G03F 7/40 (2006.01)
(Continued)

(52) U.S. Cl.
CPC ........... *G03F 7/0233* (2013.01); *C08G 69/26* (2013.01); *C08G 73/1039* (2013.01);
(Continued)

(58) Field of Classification Search
CPC ........... G03F 7/0233; G03F 7/11; G03F 7/40; C08G 73/1071; C08G 73/14; C08G 69/26;
(Continued)

(56) References Cited

U.S. PATENT DOCUMENTS 3,957,512 A 5/1976 Kleeberg et al.
4,897,461 A * 1/1990 Uekita .................. C08G 73/10 525/436
(Continued)

FOREIGN PATENT DOCUMENTS

CN 105301902 A 2/2016
EP 1375559 A1 1/2004
(Continued)

OTHER PUBLICATIONS

Aug. 18, 2021 Office Action issued in Chinese Application No. 201910708540.8.
(Continued)

*Primary Examiner* — John S Chu
(74) *Attorney, Agent, or Firm* — Oliff PLC

(57) ABSTRACT

The present invention is a polymer having a polyamide structural unit, a polyamide-imide structural unit, or a polyimide structural unit, selected from a polyamide, a polyamide-imide, a polyimide, a polyimide precursor, a polybenzoxazole, and a polybenzoxazole precursor, including a reaction product of a diamine containing at least one of a diamine shown by the following general formula (1) and a diamine shown by the following general formula (2), together with at least one of a tetracarboxylic dianhydride shown by the following general formula (3) as well as a dicarboxylic acid and a dicarboxylic halide shown by the following general formula (4). This provides a polymer which is soluble in a safe organic solvent used widely, and is usable as a base resin of a positive photosensitive resin composition that is soluble in an aqueous alkaline solution and capable of forming a fine pattern to give higher resolution.

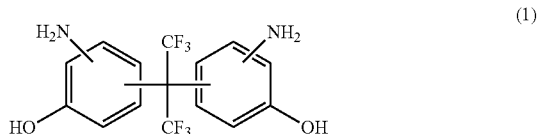

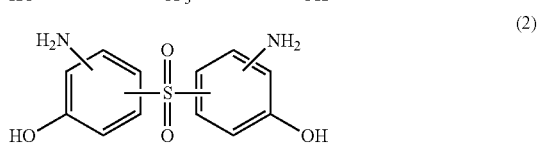

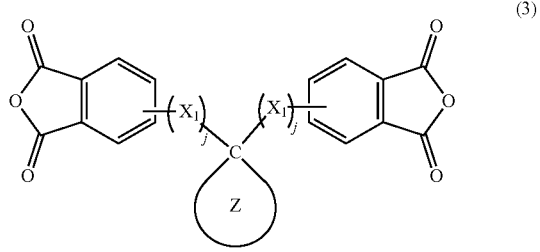

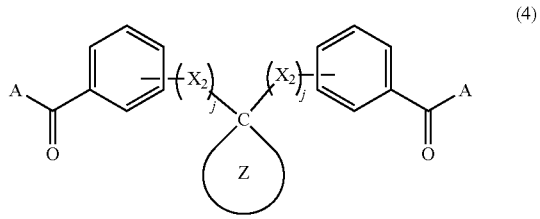

19 Claims, No Drawings

(51) Int. Cl.

| | |
|---|---|
| *C08G 73/10* | (2006.01) |
| *C08G 73/14* | (2006.01) |
| *C08G 73/22* | (2006.01) |
| *C08G 69/26* | (2006.01) |
| *G03F 7/004* | (2006.01) |
| *G03F 7/039* | (2006.01) |
| *G03F 7/038* | (2006.01) |
| *G03F 7/16* | (2006.01) |
| *G03F 7/20* | (2006.01) |
| *G03F 7/32* | (2006.01) |

(52) U.S. Cl.
CPC ..... *C08G 73/1042* (2013.01); *C08G 73/1053* (2013.01); *C08G 73/1071* (2013.01); *C08G 73/14* (2013.01); *C08G 73/22* (2013.01); *G03F 7/0045* (2013.01); *G03F 7/0382* (2013.01); *G03F 7/0392* (2013.01); *G03F 7/162* (2013.01); *G03F 7/168* (2013.01); *G03F 7/2004* (2013.01); *G03F 7/2037* (2013.01); *G03F 7/322* (2013.01); *G03F 7/40* (2013.01)

(58) Field of Classification Search
CPC .............. C08G 73/22; C08G 73/1053; C08G 73/1042; C08G 73/1039
See application file for complete search history.

(56) References Cited

U.S. PATENT DOCUMENTS

| | | | |
|---|---|---|---|
| 6,001,534 A | 12/1999 | Kato | |
| 2004/0063895 A1 | 4/2004 | Sezi et al. | |
| 2010/0258336 A1* | 10/2010 | Minegishi | C08G 73/22 174/250 |
| 2011/0143103 A1 | 6/2011 | Furuya et al. | |
| 2015/0370358 A1* | 12/2015 | Araki | C08G 73/1071 345/173 |
| 2017/0298186 A1* | 10/2017 | Takemura | G03F 7/0388 |
| 2018/0011402 A1* | 1/2018 | Yuba | C09D 179/08 |
| 2018/0024434 A1 | 1/2018 | Takemura et al. | |

FOREIGN PATENT DOCUMENTS

| | | |
|---|---|---|
| JP | S49-115541 A | 11/1974 |
| JP | S55-045746 A | 3/1980 |
| JP | 3232022 B2 | 11/2001 |
| JP | 2004-272083 A | 9/2004 |
| JP | 2005-049504 A | 2/2005 |
| JP | 3627488 B2 | 3/2005 |
| JP | 2007-199653 A | 8/2007 |
| JP | 4250982 B2 | 4/2009 |
| JP | 2011-197362 A | 10/2011 |
| JP | 2013-072935 A | 4/2013 |
| JP | 5417623 B2 | 2/2014 |
| JP | 2018-016554 A | 2/2018 |
| NO | 2013/168675 A1 | 11/2013 |
| TW | 201811728 A | 4/2018 |

OTHER PUBLICATIONS

Apr. 28, 2020 Office Action issued in Taiwanese Patent Application No. 108126869.

Jun. 19, 2020 Office Action issued in Korean Patent Application No. 10-2019-0093335.

Dec. 5, 2019 Search Report issued in European Patent Application No. 19188162.2.

May 17, 2022 Office Action issued in Japanese Application No. 2019-122661.

Sheng-Huei Hsiao et al., "Synthesis and Properties of Novel Cardo Aromatic Poly(ether-benzoxazole)s", Journal of Polymer Science: Part A: Polymer Chemistry, Aug. 22, 2001, vol. 39, Issue 22, 4014-402.

Dong-Dong Guo et al., "New poly(ether benzoxazole)s containing xanthene cardo groups", High Performance Polymers, 2016, vol. 28, Issue 3, 309-314.

* cited by examiner

POLYMER HAVING A STRUCTURE OF POLYAMIDE, POLYAMIDE-IMIDE, OR POLYIMIDE, PHOTOSENSITIVE RESIN COMPOSITION, PATTERNING PROCESS, PHOTOSENSITIVE DRY FILM, AND PROTECTIVE FILM FOR ELECTRIC AND ELECTRONIC PARTS

TECHNICAL FIELD

The present invention relates to a polymer having a structure of polyamide, polyamide-imide, or polyimide, a photosensitive resin composition, a patterning process using the composition, a photosensitive dry film, and a protective film for electric and electronic parts.

BACKGROUND ART

As various electronic devices including a personal computer, a digital camera, and a mobile phone progress toward downsizing and higher performance, requirements are rapidly increasing for further downsizing, thinning, and densifying in semiconductor devices. It is thus desired to develop a photosensitive insulating material that can accommodate an increase in surface area of a substrate for the sake of higher productivity and can form a fine pattern with high aspect ratio on a substrate, in high density mounting technologies including chip size package or chip scale package (CSP) and three-dimensional lamination.

As the photosensitive insulating material capable of forming a pattern on a substrate in the high density mounting technology including three-dimensional lamination, a polyimide film has been used for a protective film or an insulator layer. The polyimide film has attracted attention because of its insulating property, mechanical strength, and adhesiveness to a substrate, and has been still actively developed.

Conventional examples of the photosensitive polyimide material include materials using polyamic acid, which is a precursor of polyimide. For example, there are proposed materials in which a photosensitive group is introduced into a carboxy group of polyamic acid by an ester bond (Patent Documents 1 and 2). However, these proposed materials require imidization treatment at a high temperature exceeding 300° C. after forming a patterned film to obtain an intended polyimide film. Thus, these materials need to restrict a base substrate and oxidize a copper wiring in order to withstand the high temperature.

To solve such problems, there are proposed photosensitive polyimides using a solvent-soluble resin that has been already imidized to lower the temperature for post-curing (Patent Documents 3 and 4). A negative photosensitive resin composition containing the polyimide described in Patent Document 3 uses N-methyl-2-pyrrolidone (NMP) for development in patterning. However, N-methyl-2-pyrrolidone has a risk of environmental load and health hazard, especially aspiration hazard. In particular, N-methyl-2-pyrrolidone is included in SVHC (Substance of Very High Concern) by European REACH (Registration, Evaluation, Authorization and Restriction of Chemicals) regulation. Thus, the use of N-methyl-2-pyrrolidone as a solvent should be avoided as much as possible in patterning. Moreover, Patent Document 3 fails to specifically describe the resolution performance in patterning.

Patent Document 4 describes a patterning process using a photosensitive resin composition that contains a material utilizing polyamic acid, which is a precursor of polyimide, for example, a resin in which an ester bond is introduced into a carboxy group of polyamic acid. In some examples of this patterning process, a formed film is baked at a relatively low temperature of 250° C. to obtain an intended polyimide film. However, a solvent in this photosensitive resin composition is N-methyl-2-pyrrolidone, and the organic solvent used for development process is also N-methyl-2-pyrrolidone. As described above, the use of N-methyl-2-pyrrolidone as an organic solvent should be avoided as much as possible in a developer. Moreover, this patent document fails to specifically disclose the resolution performance.

Patent Document 5 refers to patterning of a negative photosensitive resin composition using a polyimide precursor. This photosensitive resin composition contains N-methyl-2-pyrrolidone-based solvent, but utilizes cyclopentanone for developing the photosensitive resin composition. This patent document discloses about the resolution performance, specifically, that an aspect ratio of 1 or more can be achieved. However, this aspect ratio is not a ratio of final film thickness or pattern height to pattern dimension, but a ratio of film thickness to dimension after coating and drying. Thus, this resolution performance is not a practical value and should be improved. Moreover, the use of cyclopentanone, which is an organic solvent widely used, sometimes causes a drawback of tending to form an overhang profile just after development due to swelling of the film during the development.

On the other hand, the photosensitive resin composition proposed in Patent Document 6 uses a base resin that has already been imidized, which is constructed in consideration of low-temperature curing. The solvent of the composition is cyclopentanone and an aqueous alkaline solution is used in the developing process, so that use of N-methyl-2-pyrrolidone can be avoided. However, the resolution performance still needs to be improved. That is, the pattern formation using the photosensitive resin composition disclosed in Patent Document 6 is carried out with an ultrathin film, and a size of the pattern to be resolved is also large. This insufficiency of the resolution performance is probably due to poor solubility of the polyimide resin, which is a base resin disclosed in Patent Document 6, in an aqueous alkaline solution used for the developing solution.

As the resolution performance of the photosensitive insulating material in the high density packaging technology such as a three-dimensional lamination in recent years, the aspect ratio (finished film thickness (or height of the pattern)/dimension of the pattern) of the formed pattern is required to be 1 or more and 2 or so. That is, when the desired finished film thickness or height of the pattern is 10 μm, a dimension of the pattern of 10 μm or less or near 5 μm must be formed.

Furthermore, Patent Document 7 refers to patterning of a negative photosensitive resin composition using a polyimide precursor. This photosensitive resin composition contains γ-butyrolactone as a solvent and utilizes an aqueous alkaline solution as a developer. In the patterning process, solubility in the alkaline developer is improved by incorporating acidic groups, i.e., alkali-soluble groups such as carboxyl groups into the resin of the polyimide precursor, and a pattern is formed by development with aqueous alkaline solution. The development with aqueous alkaline solution hardly causes swelling and can improve pattern profile and resolution performance. However, when the alkali-soluble groups are incorporated into the resin, although the resolution is improved, the resin after curing cannot withstand a removing liquid having an extremely strong alkalinity, which is used for removing a resist pattern for plating in a step of forming a metal wiring. This problem still remain unsolved.

To form an excellent insulating protective film, the alkali-soluble groups in the resin require completely sealing or completely removing from the system.

Patent Document 8 describes patterning of a negative photosensitive resin composition using a polyimide precursor. This photosensitive resin composition also employs N-methyl-2-pyrrolidone, which have to be remedied. In this photosensitive resin composition, since a polyimide precursor is used as a base resin, heat treatment is required to imidize the polyimide precursor after the patterning, and the heat treatment at 350° C. is exemplified. In the high density packaging technology such as a three-dimensional lamination, however, the heating temperature is recently desired to be 200° C. or less in view of allowable conditions of heating a device to be packaged. Accordingly, it is apparent that the above heat treatment is diverged from the actual requirement. In this photosensitive resin composition, since the base resin is a polyimide precursor, the imidization reaction in the heat treatment causes elimination reaction of the ester part, and the film shrinks largely thereby. Due to the higher density packaging, even a photosensitive resin composition with improved resolution performance fails to gain the aspect ratio of a finished pattern if the film shrinks largely after the heat treatment curing. Accordingly, the large film shrink is unfavorable.

As mentioned above, the pattern miniaturization in rewiring technology of an insulating protective film is expected to progress more and more in future with the increase of density and integration of chips. It is thus strongly desired to develop a photosensitive resin composition using a polymer having a polyimide or polyimide precursor structural unit that can achieve high resolution while maintaining excellent properties such as mechanical strength and adhesiveness of a pattern and a protective film of polyimide obtained by baking.

It is also strongly desired that the insulating protective film after patterning and curing has resistance to heat in various steps and resistance to various chemicals.

CITATION LIST

Patent Literature

Patent Document 1: Japanese Patent Laid-Open Publication No. S49-115541
Patent Document 2: Japanese Patent Laid-Open Publication No. S55-45746
Patent Document 3: Japanese Patent No. 3232022
Patent Document 4: Japanese Patent Laid-Open Publication No. 2005-49504
Patent Document 5: WO2013/168675
Patent Document 6: Japanese Patent No. 5417623
Patent Document 7: Japanese Patent No. 3627488
Patent Document 8: Japanese Patent No. 4250982

SUMMARY OF INVENTION

Technical Problem

The present invention was accomplished in view of the above-described circumstances. It is an object of the present invention to provide a polymer which is selected from a polyamide, a polyamide-imide, a polyimide, a polyimide precursor, a polybenzoxazole, and a polybenzoxazole precursor, is readily soluble in a safe organic solvent used widely, and is usable as a base resin of a positive photosensitive resin composition that is soluble in an aqueous alkaline solution and capable of forming a fine pattern to give higher resolution. Another object of the present invention is to provide a positive photosensitive resin composition that is soluble in an aqueous alkaline solution, is excellent in resolution, is capable of forming a fine pattern in patterning using the polymer, and is capable of curing at lower temperature of 200° C. or less and forming a cured film having excellent mechanical strength and heat resistance as well as higher glass transition temperature (Tg) after the patterning.

Solution to Problem

To achieve the objects, the present invention provides a polymer having a polyamide structural unit, a polyamide-imide structural unit, or a polyimide structural unit, the polymer being selected from the group consisting of a polyamide, a polyamide-imide, a polyimide, a polyimide precursor, a polybenzoxazole, and a polybenzoxazole precursor, comprising a reaction product of a diamine and at least one of a tetracarboxylic dianhydride, a dicarboxylic acid, and a dicarboxylic halide;

the diamine comprising at least one of a diamine shown by the following general formula (1) and a diamine shown by the following general formula (2);

the tetracarboxylic dianhydride comprising phthalic anhydride structures, shown by the following general formula (3); and the dicarboxylic acid and the dicarboxylic halide each comprising benzoic acid structures, shown by the following general formula (4):

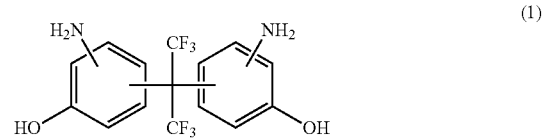
(1)

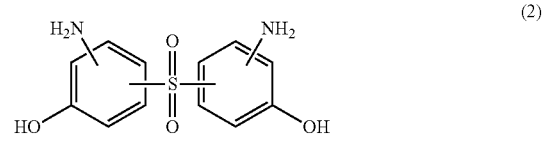
(2)

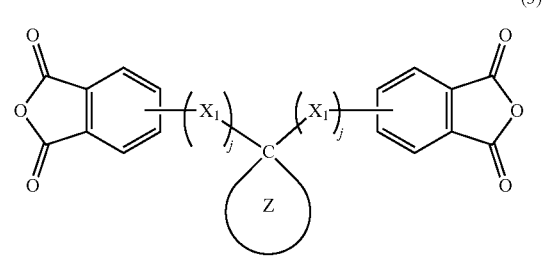
(3)

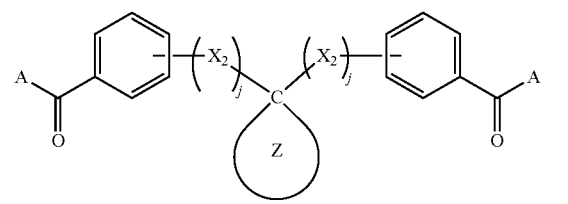
(4)

wherein Z represents a cyclic structure having 3 to 20 carbon atoms selected from an alicyclic structure, an alicyclic structure having an aromatic ring linked therewith, an alicyclic structure having a heteroatom contained or inserted therein, and an alicyclic structure having an aromatic ring linked therewith and a heteroatom contained or inserted therein; "A" represents a hydroxy group or a halogen atom; "j" represents 0 or 1; when "j" is 0, each cyclic structure Z is directly linked to the phthalic anhydride structures in the general formula (3) or the benzoic acid structures in the general formula (4); and when "j" is 1, $X_1$ and $X_2$ each represent a divalent linking group.

The inventive polymer is readily soluble in a safe organic solvent used widely, and is usable as a base resin of a positive photosensitive resin composition that is soluble in an aqueous alkaline solution and capable of forming a fine pattern to give higher resolution.

In this case, it is preferable that the cyclic structure Z in the general formulae (3) and (4) be represented by the following general formula (11) or (12):

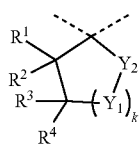
(11)

wherein the dotted line represents a bond; "k" represents an integer of 0 or more; $Y_2$ represents a divalent group selected from groups shown by the following general formulae (13), (14), (15), and (16); when "k" is 1, $Y_1$ represents a divalent group selected from groups shown by the following general formulae (17), (18), (19), and (20); and when "k" is 2 or more, $Y_1$ represents a divalent group shown by the following general formula (17):

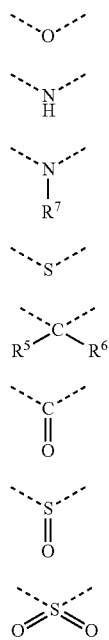

(13)

(14)

(15)

(16)

(17)

(18)

(19)

(20)

wherein the dotted line represents a bond; $R^1$, $R^2$, $R^3$, $R^4$, $R^5$, and $R^6$ are the same or different and each represent a hydrogen atom or a substituent selected from a methyl group, an ethyl group, and a linear, branched, or cyclic alkyl group having 3 to 12 carbon atoms, or alternatively, $R^1$, $R^2$, $R^3$, $R^4$, $R^5$, and $R^6$ are bonded with each other to form an alicycle or an aromatic ring; and $R^7$ represents a methyl group, an ethyl group, or a linear, branched, or cyclic alkyl group having 3 to 12 carbon atoms,

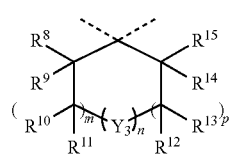
(12)

wherein the dotted line represents a bond; $R^8$, $R^9$, $R^{10}$, $R^{11}$, $R^{12}$, $R^{13}$, $R^{14}$, and $R^{15}$ are the same or different and each represent a hydrogen atom or a substituent selected from a methyl group, an ethyl group, and a linear, branched, or cyclic alkyl group having 3 to 12 carbon atoms, or alternatively, $R^8$, $R^9$, $R^{10}$, $R^{11}$, $R^{12}$, $R^{13}$, $R^{14}$, and $R^{15}$ are bonded with each other to form an alicyclic structure or an aromatic ring structure; "m" and "p" each represent an integer of 0 to 9; "n" represents 0 or 1; and $Y_3$ represents a divalent group selected from groups shown by the general formulae (13), (14), (15), (16), (17), (18), (19), and (20).

The polymer like this is more readily soluble in a safe organic solvent used widely, and is usable as a base resin of a positive photosensitive resin composition that is more soluble in an aqueous alkaline solution and capable of forming a finer pattern to give higher resolution.

In the polymer of the present invention, it is preferable that the divalent linking groups $X_1$ and $X_2$ in the general formulae (3) and (4) be each represented by any of the following general formulae (5), (6), (7), (8), (9), and (10):

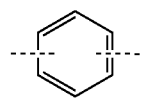
(5)

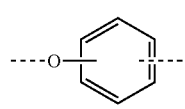
(6)

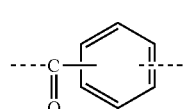
(7)

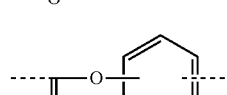
(8)

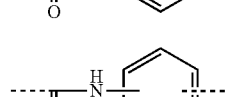
(9)

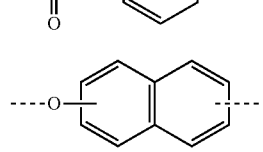
(10)

wherein the dotted line represents a bond.

The polymer like this is still more readily soluble in a safe organic solvent widely used as a solvent of a photosensitive resin composition, and is usable as a base resin of a photosensitive resin composition. This photosensitive resin composition gives a cured film, after patterning, having excellent mechanical strength and heat resistance.

In the polymer of the present invention, it is preferable that the diamine shown by the general formula (1) be represented by the following general formula (21).

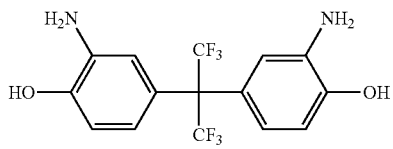

(21)

In the use of a photosensitive resin composition containing such a polymer, an aqueous alkaline developer is more favorably usable in the patterning and in the developing step, and the dissolution rate of the base resin in an aqueous alkaline developer can be easily measured and controlled. Accordingly, such a polymer allows the photosensitive resin composition to be improved in resolution.

The inventive polymer can further contain a tetracarboxylic acid diester unit shown by the following general formula (22):

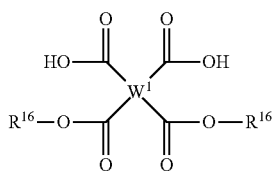

(22)

wherein W1 represents a tetravalent organic group, and $R^{16}$ represents a group shown by the following general formula (23):

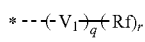

(23)

wherein the dotted line represents a bond; $V_1$ represents an organic group with a valency of r+1; Rf represents a linear, branched, or cyclic alkyl group or an aromatic group having 1 to 20 carbon atoms, with the aromatic group optionally substituted by an alkyl group, provided that all of or a part of the hydrogen atoms is substituted by a fluorine atom; "r" represents 1, 2, or 3; and "q" represents 0 or 1.

The polymer like this is still more readily soluble to in a safe organic solvent used widely.

In the polymer of the present invention, it is preferable that $R^{16}$ in the general formula (22) be an organic group selected from groups shown by the following general formulae (24), (25), (26), and (27):

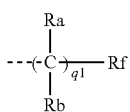

(24)

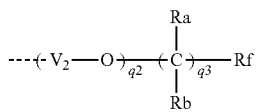

(25)

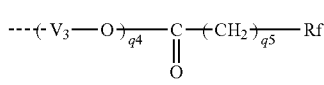

(26)

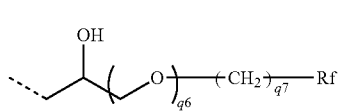

(27)

wherein the dotted line represents a bond; Rf is as defined above; Ra and Rb each represent a hydrogen atom or an alkyl group having 1 to 3 carbon atoms; $V_2$ and $V_3$ each represent a linear or branched alkylene group having 1 to 6 carbon atoms; q1 represents an integer of 0 to 6, q2 represents an integer of 1 to 6, q3 represents an integer of 0 to 6, q4 represents an integer of 1 to 6, q5 represents an integer of 0 to 6, q6 represents 0 or 1, and q7 represents 0 or 1.

In the polymer of the present invention, it is more preferable that $R^{16}$ in the general formula (22) be a group shown by the following general formula (23-1):

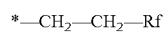

(23-1)

wherein the dotted line represents a bond; and Rf is as defined above.

The polymer like this is still more readily soluble in a safe organic solvent used widely.

In the polymer of the present invention, it is preferable that the cyclic structure Z in the general formula (3) is a tetracarboxylic dianhydride structure shown by the following general formula (Z-1) or (Z-2), and the cyclic structure Z in the general formula (4) is at least one structure selected from dicarboxylic acids or dicarboxylic halides shown by the following general formulae (Z-3), (Z-4), (Z-5), (Z-6), (Z-7), and (Z-8).

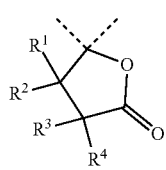

(Z-1)

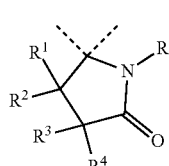

(Z-2)

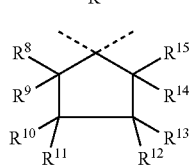

(Z-3)

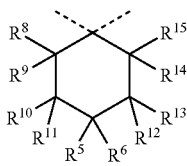
(Z-4)

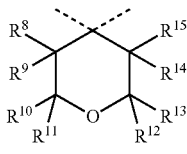
(Z-5)

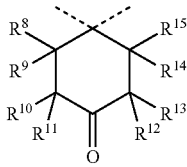
(Z-6)

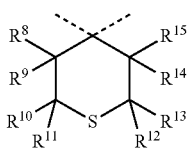
(Z-7)

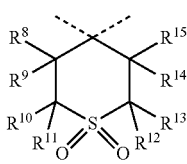
(Z-8)

In the formulae, the dotted line represents a bond; $R^1$, $R^2$, $R^3$, $R^4$, $R^5$, and $R^6$ are the same or different and each represent a hydrogen atom or a substituent selected from a methyl group, an ethyl group, and a linear, branched, or cyclic alkyl group having 3 to 12 carbon atoms, or alternatively, $R^1$, $R^2$, $R^3$, $R^4$, $R^5$, and $R^6$ are bonded with each other to form an alicycle or an aromatic ring; $R^7$ represents a methyl group, an ethyl group, or a linear, branched, or cyclic alkyl group having 3 to 12 carbon atoms; and $R^8$, $R^9$, $R^{10}$, $R^{11}$, $R^{12}$, $R^{13}$, $R^{14}$, and $R^{15}$ are the same or different and each represent a hydrogen atom or a substituent selected from a methyl group, an ethyl group, and a linear, branched, or cyclic alkyl group having 3 to 12 carbon atoms, or alternatively, $R^8$, $R^9$, $R^{10}$, $R^{11}$, $R^{12}$, $R^{13}$, $R^{14}$, and $R^{15}$ are bonded with each other to form an alicyclic structure or an aromatic ring structure.

The polymer like this is preferable because the corresponding tetracarboxylic dianhydride and dicarboxylic acid are readily available or synthesizable. Additionally, the dicarboxylic acid is also readily available or synthesizable in which the alicyclic structure Z in (4) is selected from (Z-3) to (Z-8) of the above formulae. Dicarboxylic halides can be easily obtained by reaction of these dicarboxylic acids and a halogenating agent.

The present invention also provides a positive photosensitive resin composition, comprising:
(A) the polymer described above;
(B) a compound having a quinonediazide structure for serving as a photosensitive agent to generate an acid by light, and
(D) a solvent.

The inventive positive photosensitive resin composition is soluble in aqueous alkaline solution and makes it possible to achieve excellent resolution and to form a fine pattern in its patterning. This can be cured at lower temperature of 200° C. or less to give a cured film after patterning having excellent mechanical strength, heat resistance, and higher glass transition temperature.

The inventive positive photosensitive resin composition is also capable of containing the following component (C):
(C) one or more crosslinking agents selected from an amino condensate modified with formaldehyde or formaldehyde-alcohol, a phenol compound having on average two or more methylol groups or alkoxymethyl groups per molecule, a polyhydric phenol compound in which a hydrogen atom of a phenolic hydroxy group thereof is substituted with a glycidyl group, a polyhydric phenol compound in which a hydrogen atom of a phenolic hydroxy group is substituted with a substituent shown by the following formula (C-1), and a compound containing two or more nitrogen atoms having a glycidyl group as shown by the following formula (C-2),

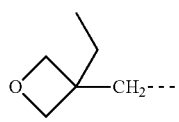
(C-1)

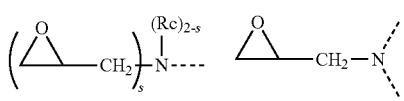
(C-2)

wherein, the dotted line represents a bond; Rc represents a linear, branched or a cyclic alkyl group having 1 to 6 carbon atoms; and "s" represents 1 or 2.

The positive photosensitive resin composition like this is particularly excellent in resolution in patterning and allows the cured film after patterning to have excellent mechanical strength and heat resistance.

It is preferable that the inventive positive photosensitive resin composition further contains (E) a compound to generate an acid or a radical by heat.

The positive photosensitive resin composition like this is allowed to accelerate the crosslinking and curing reaction to give a pattern or a film that is still more improved in mechanical strength, chemical resistance, and adhesiveness.

The present invention also provides a patterning process comprising:
(1) applying the positive photosensitive resin composition described above onto a substrate to form a photosensitive material film;
(2) exposing the photosensitive material film to a high energy beam having a wavelength of 190 to 500 nm or an electron beam via a photomask after a heat treatment; and
(3) performing development with a developer of an aqueous alkaline solution.

The inventive patterning process is capable of forming a fine pattern and giving higher resolution.

In this case, it is preferable to further include (4) post-curing a patterned film formed by the development of the photosensitive material film at a temperature of 100 to 300° C.

The patterning process like this makes it possible to increase the crosslinking density of a film, to remove the residual volatile components, and to achieve preferable adhesiveness to a substrate, heat resistance, strength, and electric characteristics.

The present invention also provides a photosensitive dry film comprising a supporting film, a protective film, and a photosensitive resin layer having a thickness of 5 to 100 μm and sandwiched between the supporting film and the protective film, wherein the photosensitive resin layer is formed from the positive photosensitive resin composition described above.

The inventive photosensitive dry film makes it possible to form a pattern on a substrate easily.

The present invention also provides a method for producing a photosensitive dry film, comprising:
(i) continuously applying the positive photosensitive resin composition described above onto a supporting film to form a photosensitive resin layer;
(ii) continuously drying the photosensitive resin layer; and further
(iii) laminating a protective film onto the photosensitive resin layer.

The method for producing a photosensitive dry film like this makes it possible to produce a photosensitive dry film easily.

The present invention also provides a patterning process comprising:
(i) separating the protective film from the photosensitive dry film described above and bringing the photosensitive resin layer thereby uncovered into close contact with a substrate;
(ii) exposing the photosensitive resin layer to a high energy beam having a wavelength of 190 to 500 nm or an electron beam via a photomask either through the supporting film or after removing the supporting film; and
(iii) performing development with a developer.

The inventive patterning process makes it possible to obtain a fine pattern conveniently and to give higher resolution.

In this case, it is preferable to further include (iv) post-curing a patterned film formed by the development of the photosensitive material film at a temperature of 100 to 300° C.

The patterning process like this makes it possible to increase the crosslinking density of a film and to achieve preferable adhesiveness to a substrate, heat resistance, strength, and electric characteristics.

The present invention further provides a protective film for electric and electronic parts, comprising a cured film in which the positive photosensitive resin composition described above is cured.

The inventive protective film for electric and electronic parts is excellent in adhesiveness to a substrate, heat resistance, electric characteristics, mechanical strength, and chemical resistance to an alkaline removing liquid and so on. This protective film is applied to a semiconductor device to give excellent reliability, and especially, can prevent generation of cracks during a thermal cycle test.

Advantageous Effects of Invention

As described above, the inventive polymer is soluble in a safe organic solvent widely used as a solvent for positive photosensitive resin compositions, and makes it possible to provide a base resin of a photosensitive resin composition.

In patterning using a photosensitive resin composition containing the inventive polymer, the development can be performed by using an aqueous alkaline solution because the inventive polymer is soluble in an aqueous alkaline solution, and it is possible to prevent residues such as scum in the bottom of an opened pattern and pattern deterioration such as footing profile to resolve a fine pattern.

DESCRIPTION OF EMBODIMENTS

As described above, it has been desired to develop a polymer that is soluble in a safe organic solvent widely used as a solvent for positive photosensitive resin compositions and can be used as a base resin of a photosensitive resin composition usable for alkaline development.

The present inventors have earnestly investigated to achieve the above object and consequently found that the polymer having a structural unit of polyamide, polyamide-imide, or polyimide is useful as a base resin of a photosensitive resin composition when the polymer is selected from a polyamide, a polyamide-imide, a polyimide, a polyimide precursor, a polybenzoxazole, and a polybenzoxazole precursor, and contains a reaction product of a diamine containing at least one of a diamine shown by the following general formula (1) and a diamine shown by the following general formula (2), together with at least one of a tetracarboxylic dianhydride shown by the following general formula (3) as well as a dicarboxylic acid and a dicarboxylic halide shown by the following general formula (4), because the polymer is readily soluble in a safe organic solvent used widely, and the polymer is soluble in an aqueous alkaline developer to be applied to a positive photosensitive resin composition that can be developed using an aqueous alkaline solution, and the use of the photosensitive resin composition gives a fine pattern having good pattern profile.

The present inventors have also found that patterning and baking of a photosensitive resin composition containing this polymer gives a film having excellent resistance to a plating-removing liquid with strong alkalinity though the polymer is soluble in an aqueous alkaline solution.

The present inventors have additionally found that patterning and baking of a photosensitive resin composition containing the polymer as a base resin gives a protective film that is excellent in mechanical strength and adhesiveness, that is, such a cured film with a pattern is excellent as a protective film for electric and electronic parts as well as an insulating protective film using the polymer as a base resin; thereby bringing this invention to completion.

That is, the present invention is a polymer having a polyamide structural unit, a polyamide-imide structural unit, or a polyimide structural unit, the polymer being selected from the group consisting of a polyamide, a polyamide-imide, a polyimide, a polyimide precursor, a polybenzoxazole, and a polybenzoxazole precursor, comprising a reaction product of a diamine and at least one of a tetracarboxylic dianhydride, a dicarboxylic acid, and a dicarboxylic halide;
the diamine comprising at least one of a diamine shown by the following general formula (1) and a diamine shown by the following general formula (2);
with the tetracarboxylic dianhydride being shown by the following general formula (3); and the dicarboxylic acid and the dicarboxylic halide being shown by the following general formula (4).

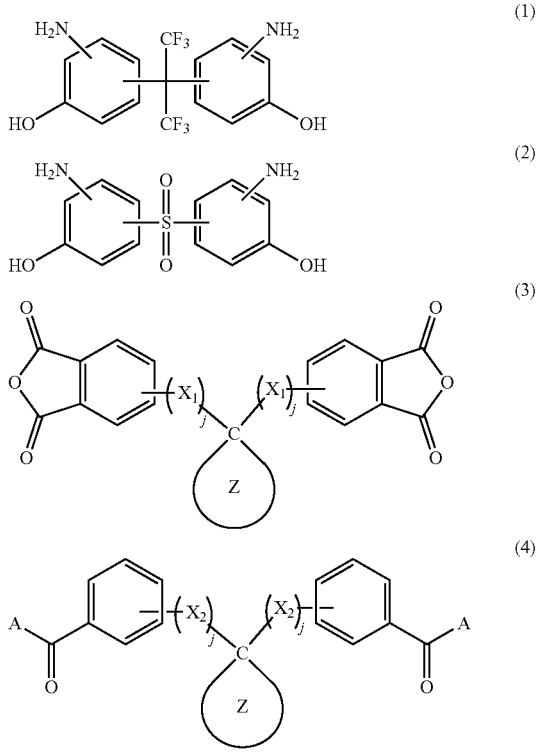

(1)

(2)

(3)

(4)

In the formulae, Z represents an alicyclic structure having 3 to 20 carbon atoms optionally having an aromatic ring linked therewith and optionally containing a heteroatom; "A" represents a hydroxy group or a halogen atom; "j" represents 0 or 1; when "j" is 0, each cyclic structure Z is directly linked to the phthalic anhydride structures in the general formula (3) or the benzoic acid structures in the general formula (4); and when "j" is 1, $X_1$ and $X_2$ each represent a divalent linking group.

Hereinafter, the present invention will be described concretely, but the present invention is not limited thereto.

[Polymer Having a Structural Unit of Polyamide, Polyamide-Imide, or Polyimide]

The inventive polymer is a polymer having a structural unit of polyamide, polyamide-imide, or polyimide; selected from a polyamide, a polyamide-imide, a polyimide, a polyimide precursor, a polybenzoxazole, and a polybenzoxazole precursor; and contains a reaction product of a diamine containing at least one of a diamine shown by the general formula (1) and a diamine shown by the general formula (2), together with at least one of a tetracarboxylic dianhydride shown by the general formula (3) as well as a dicarboxylic acid and a dicarboxylic halide shown by the general formula (4). The inventive polymer may be any polymer that satisfies the requirements described above and is not particularly limited in other points.

The polymer described above can be used as a base resin of a positive photosensitive resin composition to improve the mechanical strength and to increase the glass transition temperature, is readily soluble in a safe organic solvent used widely, and is soluble in an aqueous alkaline developer.

The inventive polymer has an amide structural unit or an imide structural unit that is already formed in synthesizing the polymer. Accordingly, in heat curing of a photosensitive resin composition using the polymer after patterning, reaction such as imidization ring-closure reaction is not necessary, and the heating temperature does not have to be so high as in imidization reaction. In the polymer, an amide structural unit or an imide structural unit is already formed, and elimination reaction does not occur thereby to bring an advantage of smaller film shrink in the heat treatment.

As a method for improving the properties of an obtained pattern after the curing, particularly mechanical strength such as tensile strength and Tg, it has been commonly known to introduce a biphenyl structural unit or a terphenyl structural unit into a polymer. However, the polymer having such an introduced structural unit is markedly lowered in solubility in a safe organic solvent used widely and is unfavorable because it becomes a polymer that is soluble only in N-methyl-2-pyrrolidone or insoluble in any organic solvents. On the other hand, the inventive polymer is soluble in a safe organic solvent widely used as a solvent for a photosensitive resin composition without having such a method and can have a positive photosensitive resin composition capable of forming a cured film after patterning having excellent mechanical strength and heat resistance of higher glass transition temperature.

In the polymer of the present invention, it is preferable that the alicyclic structure Z in the general formulae (3) and (4) be represented by the following general formula (11) or (12):

(11)

wherein the dotted line represents a bond; "k" represents an integer of 0 or more; $Y_2$ represents a divalent group selected from groups shown by the following general formulae (13), (14), (15), and (16); when "k" is 1, $Y_1$ represents a divalent group selected from groups shown by the following general formulae (17), (18), (19), and (20); when "k" is 2 or more, $Y_1$ represents a divalent group shown by the following general formula (17); and $R^4$, $R^2$, $R^3$, $R^4$, $R^5$, and $R^6$ are the same or different and each represent a hydrogen atom or a substituent selected from a methyl group, an ethyl group, and a linear, branched, or cyclic alkyl group having 3 to 12 carbon atoms, or alternatively, $R^2$, $R^2$, $R^3$, $R^4$, $R^5$, and $R^6$ are bonded with each other to form an alicycle or an aromatic ring.

(13)

(14)

(15)

(16)

(17)

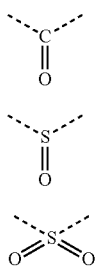
(18)

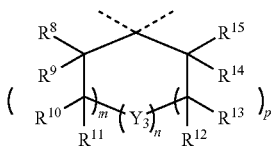
(19)

(20)

In the formulae, the dotted line represents a bond; and $R^7$ represents a methyl group, an ethyl group, or a linear, branched, or cyclic alkyl group having 3 to 12 carbon atoms.

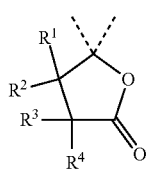
(12)

In the formulae, the dotted line represents a bond; $R^8$, $R^9$, $R^{10}$, $R^{11}$, $R^{12}$, $R^{13}$, $R^{14}$, and $R^{15}$ are the same or different and each represent a hydrogen atom or a substituent selected from a methyl group, an ethyl group, and a linear, branched, or cyclic alkyl group having 3 to 12 carbon atoms, or alternatively, $R^8$, $R^9$, $R^{10}$, $R^{11}$, $R^{12}$, $R^{13}$, $R^{14}$, and $R^{15}$ are bonded with each other to form an alicyclic structure or an aromatic ring structure; "m" and "p" each represent an integer of 0 to 9; "n" represents 0 or 1; and $Y_3$ represents a divalent group selected from groups shown by the general formulae (13), (14), (15), (16), (17), (18), (19), and (20).

In the polymer of the present invention, it is preferable that the alicyclic structure Z in the general formula (3) be a tetracarboxylic dianhydride structure shown by the general formula (Z-1) or (Z-2), and the alicyclic structure Z in the general formula (4) is at least one structure selected from dicarboxylic acids or dicarboxylic halides shown by the following general formulae (Z-3) to (Z-8).

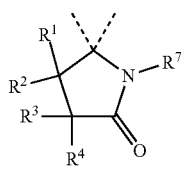
(Z-1)

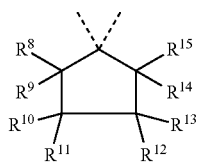
(Z-2)

(Z-3)

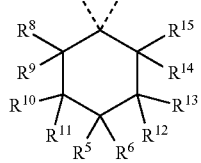
(Z-4)

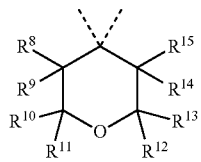
(Z-5)

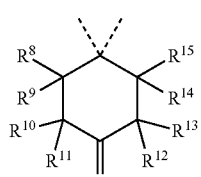
(Z-6)

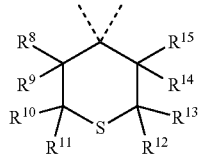
(Z-7)

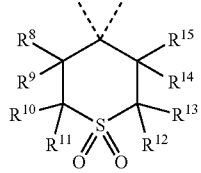
(Z-8)

In the formulae, the dotted line represents a bond; $R^1$, $R^2$, $R^3$, $R^4$, $R^5$, and $R^6$ are the same or different and each represent a hydrogen atom or a substituent selected from a methyl group, an ethyl group, and a linear, branched, or cyclic alkyl group having 3 to 12 carbon atoms, or alternatively, $R^1$, $R^2$, $R^3$, $R^4$, $R^5$, and $R^6$ are bonded with each other to form an alicycle or an aromatic ring; $R^7$ represents a methyl group, an ethyl group, or a linear, branched, or cyclic alkyl group having 3 to 12 carbon atoms; and $R^8$, $R^9$, $R^{10}$, $R^{11}$, $R^{12}$, $R^{13}$, $R^{14}$, and $R^{15}$ are the same or different and each represent a hydrogen atom or a substituent selected from a methyl group, an ethyl group, and a linear, branched, or cyclic alkyl group having 3 to 12 carbon atoms, or alternatively, $R^8$, $R^9$, $R^{10}$, $R^{11}$, $R^{12}$, $R^{13}$, $R^{14}$, and $R^{15}$ are bonded with each other to form an alicyclic structure or an aromatic ring structure.

The tetracarboxylic dianhydride is readily available or synthesizable when the alicyclic structure Z in the general formula (3) is represented by any of the general formula (Z-1) and (Z-2). The dicarboxylic acid is readily available or synthesizable when the alicyclic structure Z in the general formula (4) is represented by any of the general formula (Z-3) to (Z-8). Dicarboxylic halides can be readily obtained by reaction of these dicarboxylic acids with a halogenating agent.

In the alicyclic structure Z in the general formulae (3) and (4), illustrative examples of the preferable structure shown by the general formula (11) include the following, although not limited thereto.

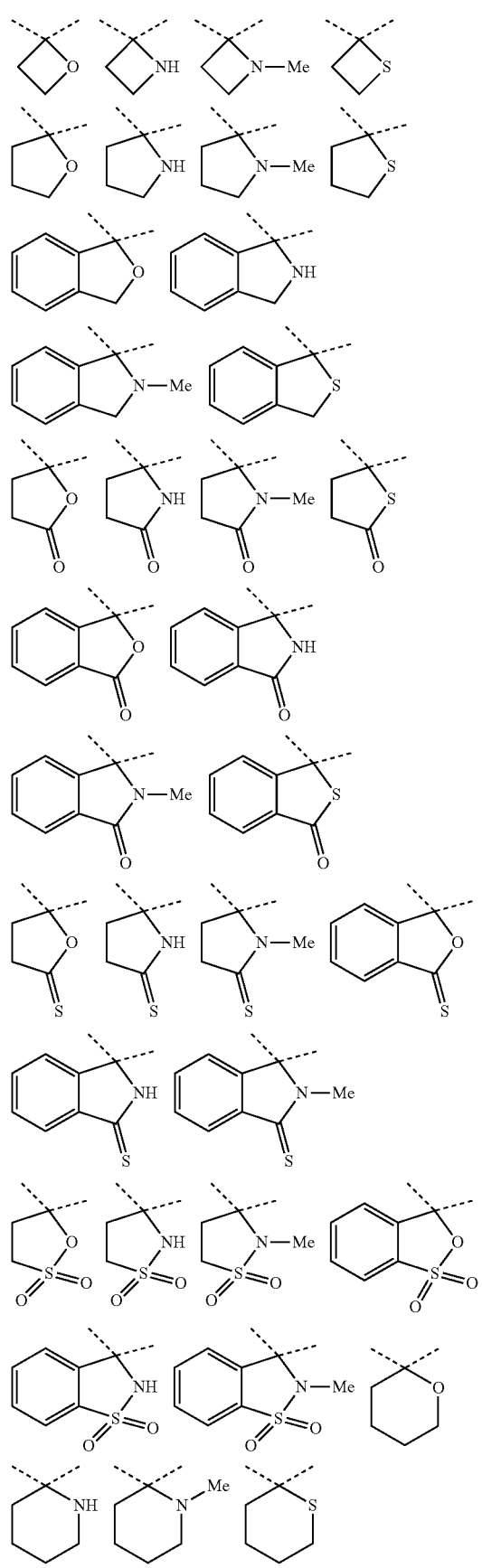
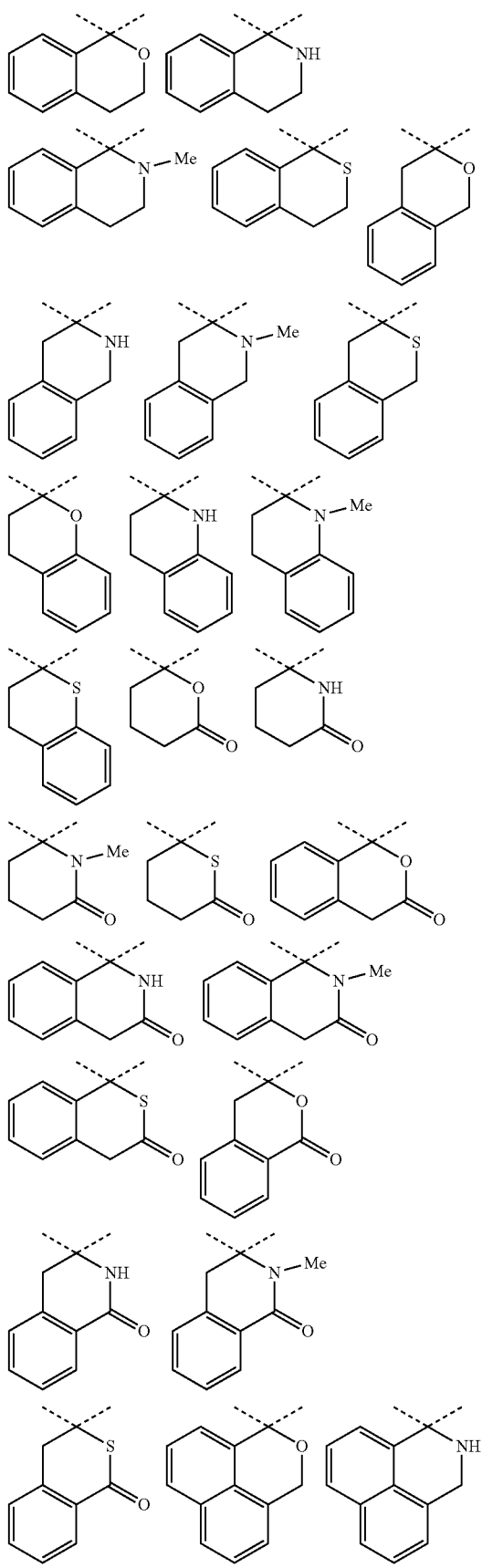

-continued
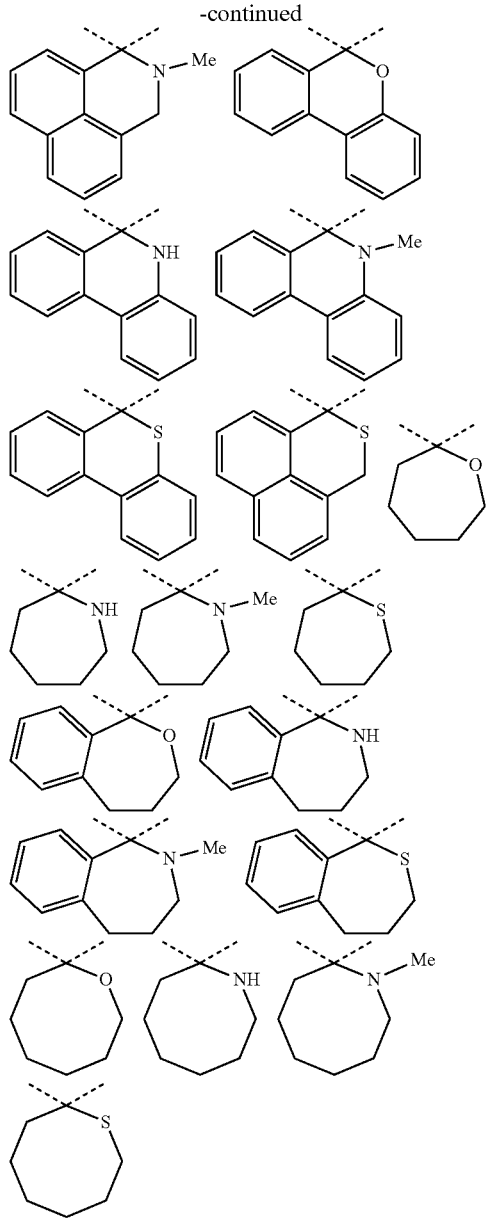
In the formulae, the dotted line represents a bond.
In the alicyclic structure Z in the general formulae (3) and (4), concrete examples of the preferable structure shown by the general formula (12) include the following, but are not limited thereto.
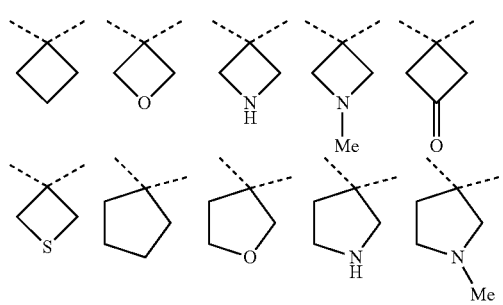
-continued
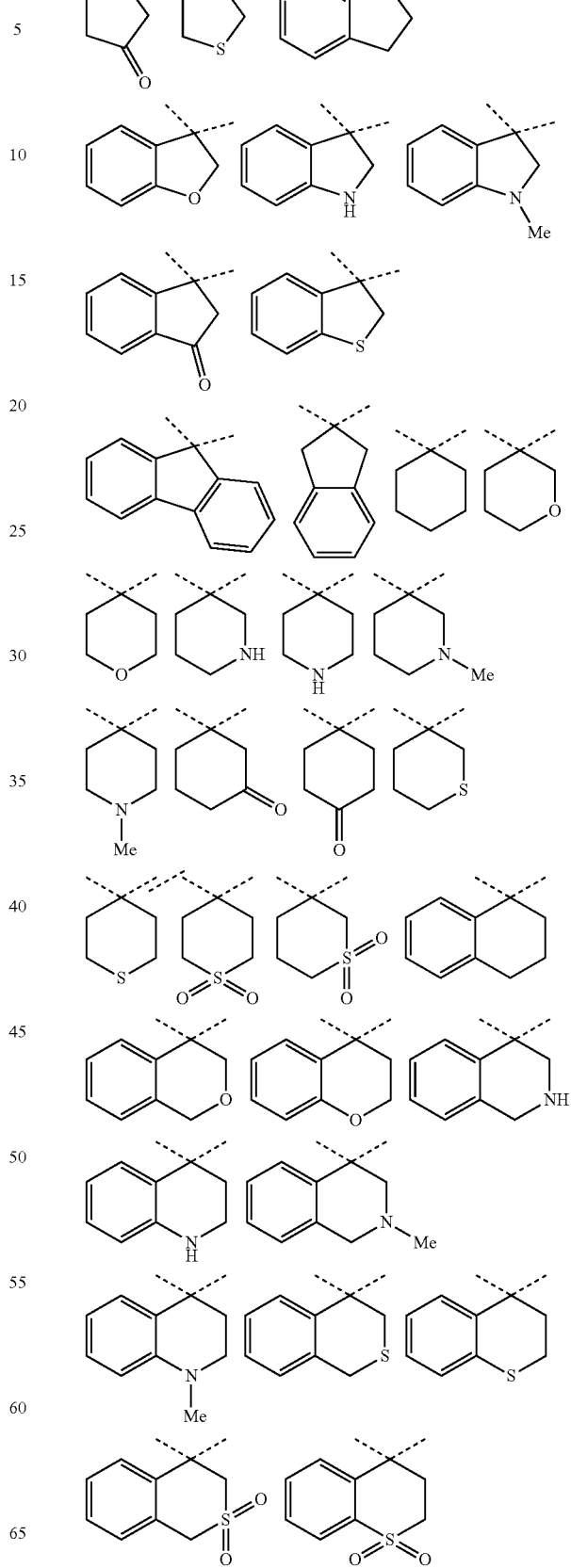

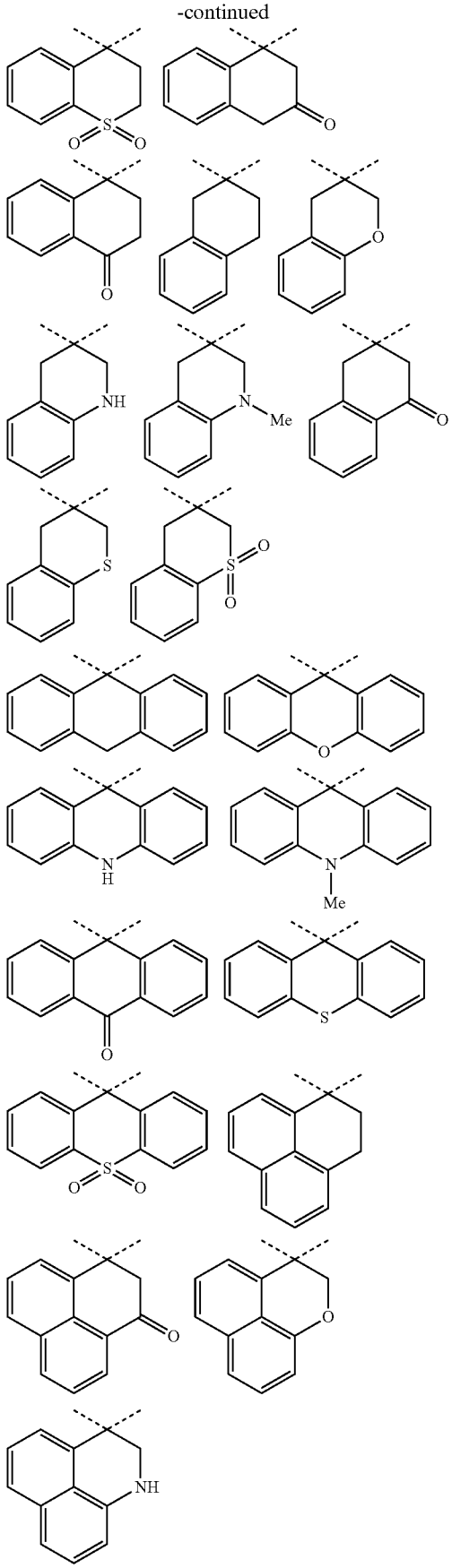
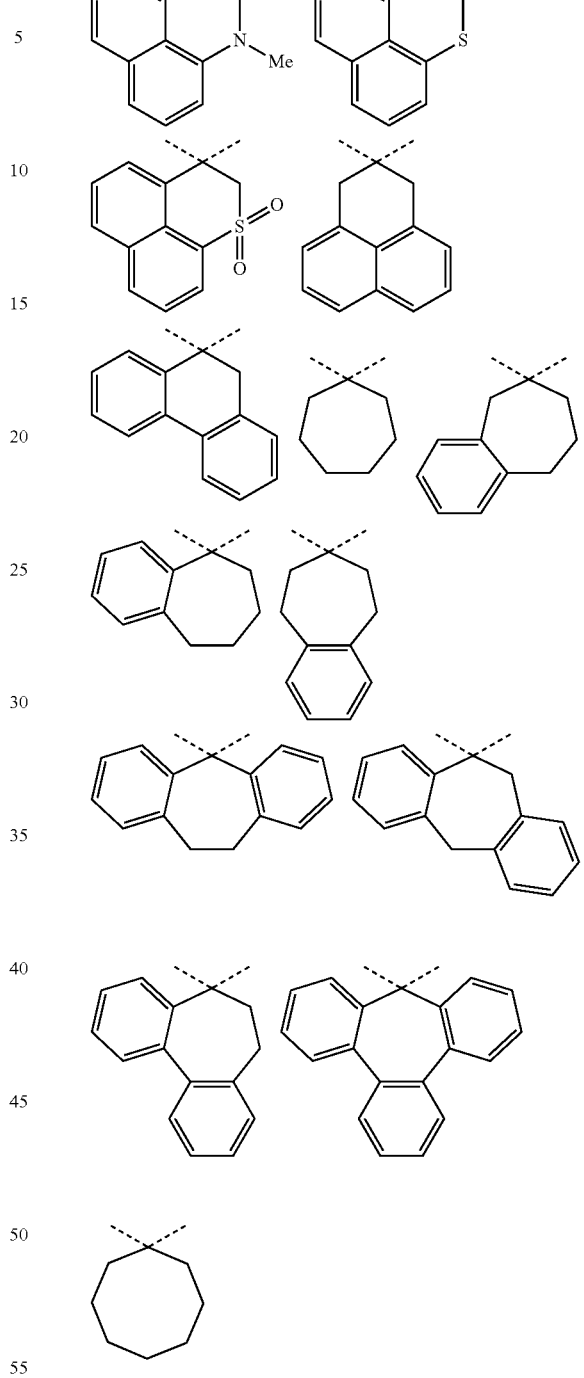

In the formulae, the dotted line represents a bond.

The general formulae (3) and (4) in which "j" is 0 represents that each cyclic structure Z is directly linked to the phthalic anhydride structures in the general formula (3) or the benzoic acid structures in the general formula (4). Accordingly, as a structure in which the aforementioned structure is directly bonded to the phthalic anhydride structures or the benzoic acid structures through the parts of dotted lines, the following general formulae (3-1), (3-2), (3-3), and (4-1) to (4-6) are exemplified preferably.

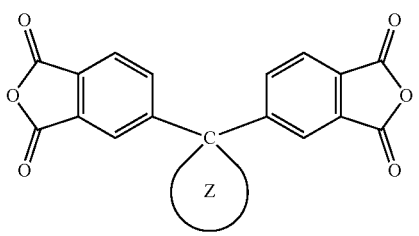 (3-1)

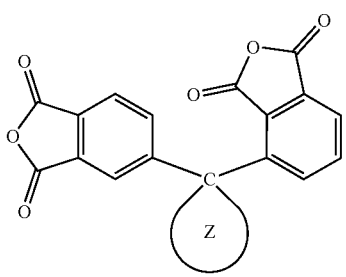 (3-2)

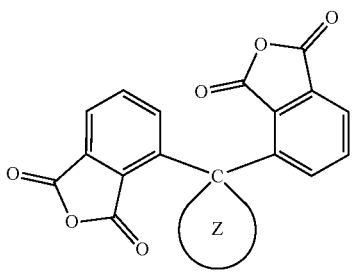 (3-3)

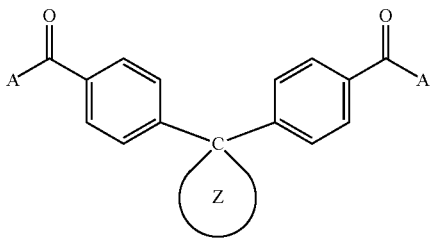 (4-1)

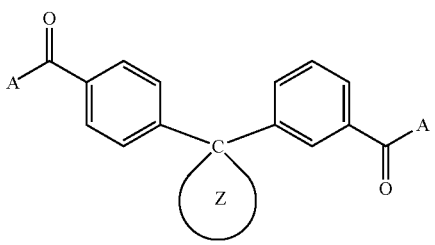 (4-2)

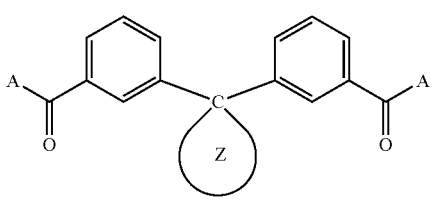 (4-3)

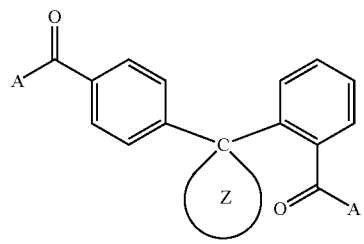 (4-4)

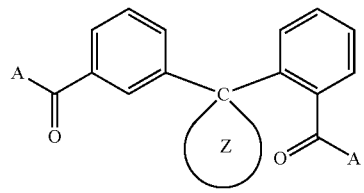 (4-5)

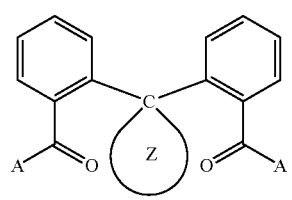 (4-6)

In the formulae, Z and A are as defined above.

In the general formula (3), the general formula (3-1) is preferable in view of easiness of synthesis method and acquisition. In the general formula (4), the general formula (4-1) is preferable in view of easiness of synthesis method and acquisition.

When "j" is 1, in the general formulae (3) and (4), $X_1$ and $X_2$ each represent a divalent linking group. Illustrative examples of the preferable linking groups $X_1$ and $X_2$ include the structures shown by the following general formulae (5), (6), (7), (8), (9), and (10).

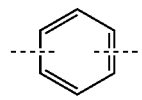 (5)

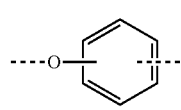 (6)

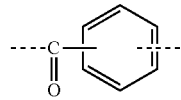 (7)

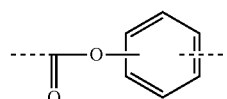 (8)

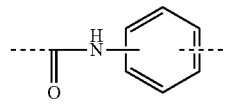 (9)

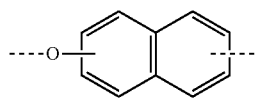
(10)
In the formulae, the dotted line represents a bond.
As a preferable structure shown by the general formula (3) in which j is 1, the concrete examples include the following, but are not limited thereto.
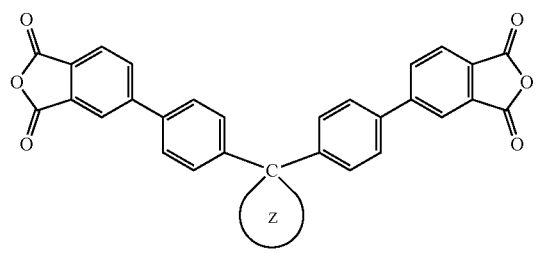
(3-4)
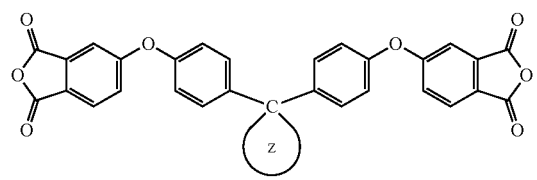
(3-5)
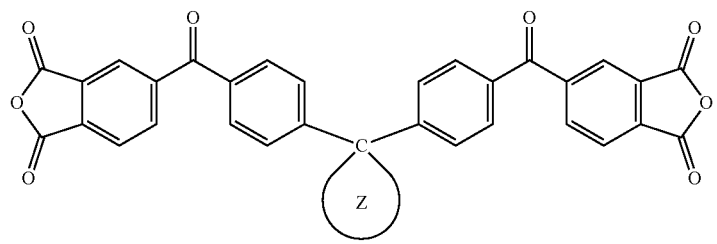
(3-6)
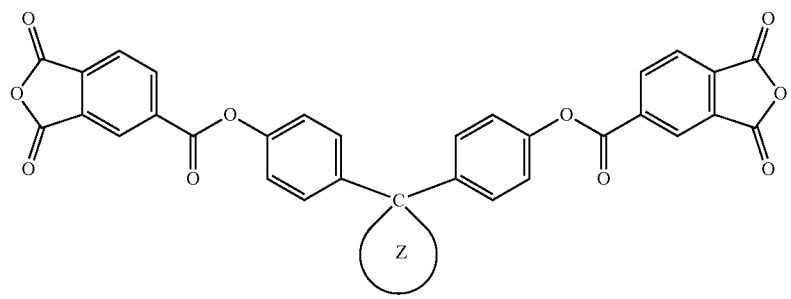
(3-7)
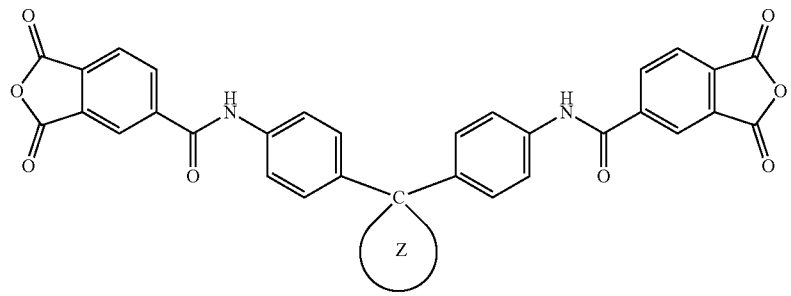
(3-8)

-continued

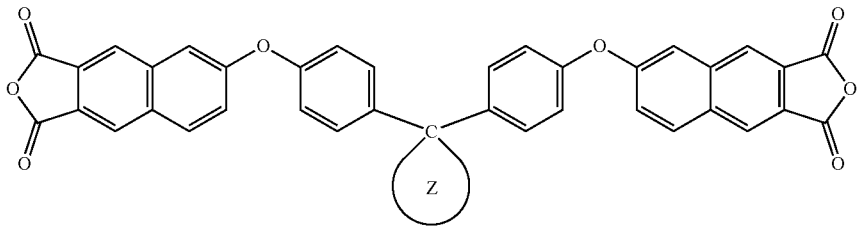
(3-9)

In the formulae, Z is as defined above.

In these general formulae (3-4) to (3-9) described above, the general formulae (3-5), (3-7), and (3-8) are preferable in view of easiness of synthesis method and acquisition.

Particularly, the general formulae (3-5) and (3-7) are preferable.

As a preferable structure shown by the general formula (4) in which j is 1, the concrete examples include the following, but are not limited thereto.

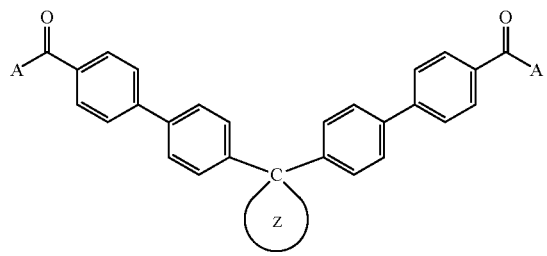
(4-7)

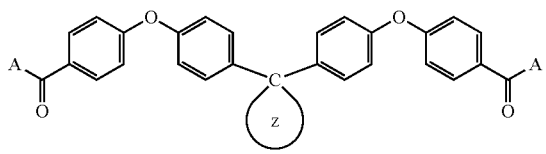
(4-8)

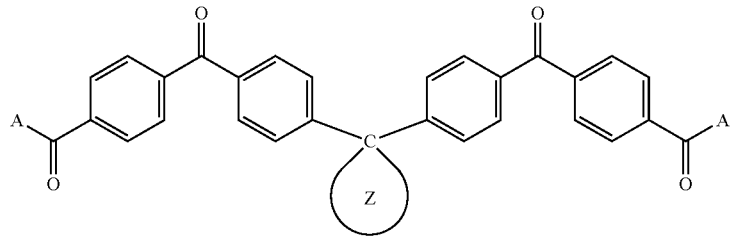
(4-9)

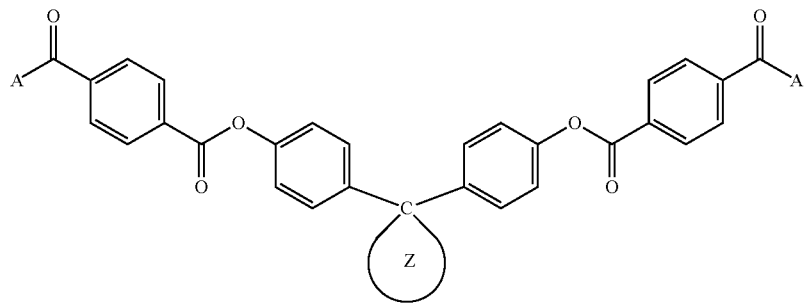
(4-10)

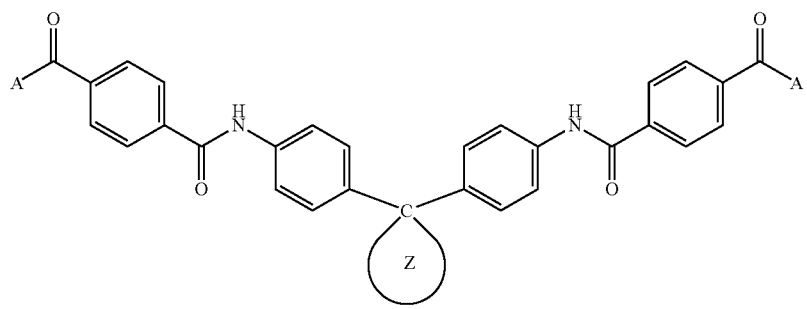
(4-11)

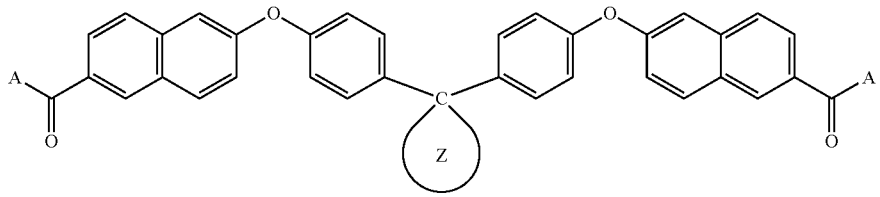

(4-12)

In these general formulae (4-7) to (4-12) described above, the general formulae (4-8), (4-10), and (4-11) are preferable in view of easiness of synthesis method and acquisition. Particularly, the general formulae (4-8) and (4-10) are preferable.

Additionally, the diamine shown by the general formula (1) is preferably a diamine shown by the general formula (21).

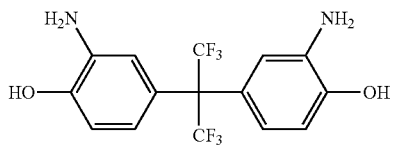

(21)

When the diamine of the general formula (1) is represented by the general formula (21), an aqueous alkaline developer can be used in patterning and a developing step. The use of an aqueous alkaline developer helps to improve the resolution of a photosensitive resin composition because the dissolution rate of a base resin in an aqueous alkaline developer can be easily measured and controlled.

Additionally, the polymer containing a tetracarboxylic acid diester unit shown by the general formula (22) is still more readily soluble in a safe organic solvent used widely.

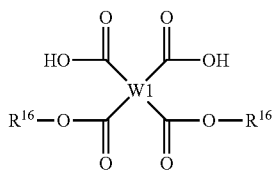

(22)

In the formula, W1 represents a tetravalent organic group, and $R^{16}$ represents a group shown by the following general formula (23):

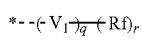

(23)

wherein the dotted line represents a bond; $V_1$ represents an organic group with a valency of r+1; Rf represents a linear, branched, or cyclic alkyl group or an aromatic group having 1 to 20 carbon atoms, with the aromatic group optionally substituted by an alkyl group, provided that all of or a part of the hydrogen atoms is substituted by a fluorine atom; "r" represents 1, 2, or 3; and "q" represents 0 or 1.

In this case, $R^{16}$ in the general formula (22) is preferably an organic group selected from groups shown by the following general formulae (24), (25), (26), and (27):

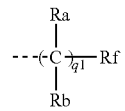

(24)

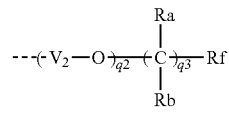

(25)

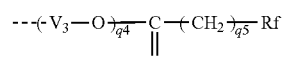

(26)

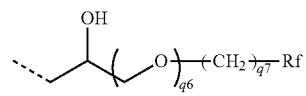

(27)

wherein the dotted line represents a bond; Rf is as defined above; Ra and Rb each represent a hydrogen atom or an alkyl group having 1 to 3 carbon atoms; $V_2$ and $V_3$ each represent a linear or branched alkylene group having 1 to 6 carbon atoms; q1 represents an integer of 0 to 6, q2 represents an integer of 1 to 6, q3 represents an integer of 0 to 6, q4 represents an integer of 1 to 6, q5 represents an integer of 0 to 6, q6 represents 0 or 1, and q7 represents 0 or 1.

It is also preferable that $R^{16}$ in the general formula (22) be a group shown by the following general formula (23-1):

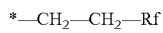

(23-1)

wherein the dotted line represents a bond; and Rf is as defined above.

In the organic group shown by the general formula (24), concrete examples of the organic group that can be used preferably include the following, but are not limited thereto.

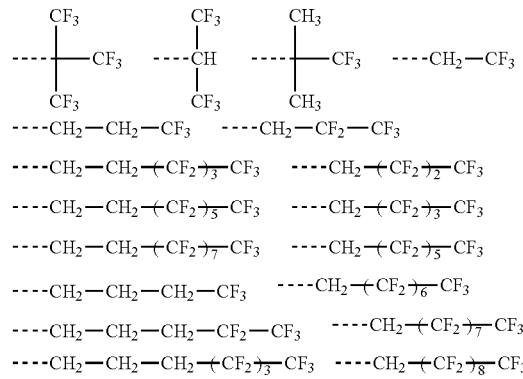

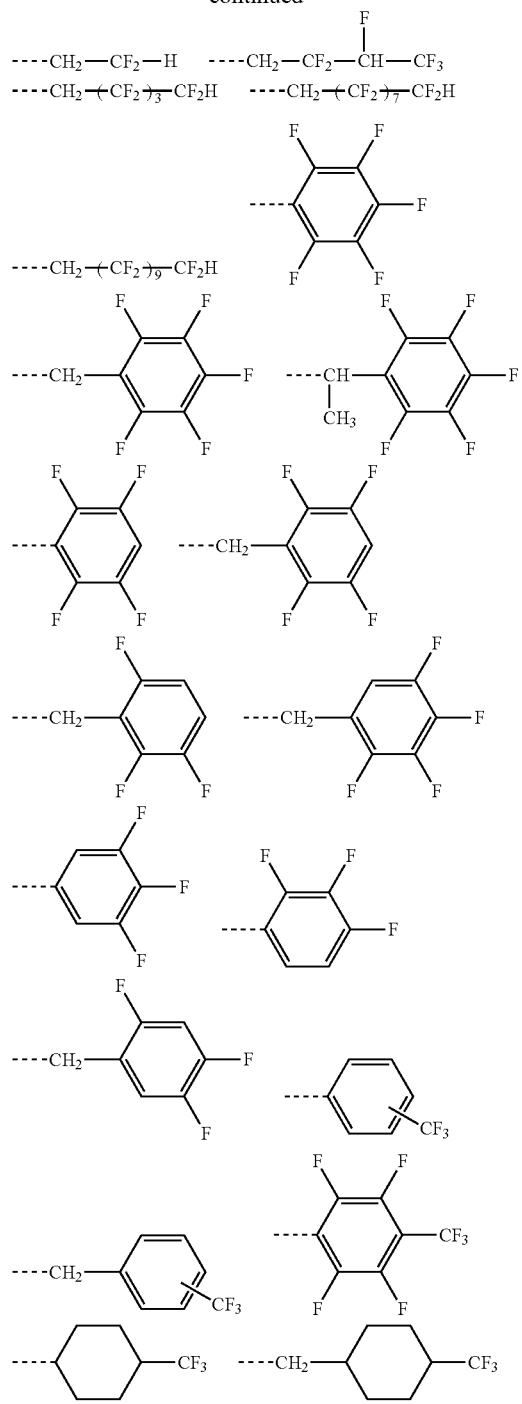
In the formulae, the dotted line represents a bond.
In the organic group shown by the general formula (25), concrete examples of the organic group that can be used preferably include the following, but are not limited thereto.
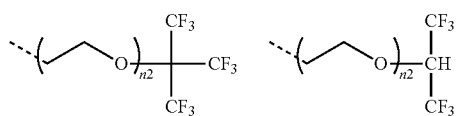
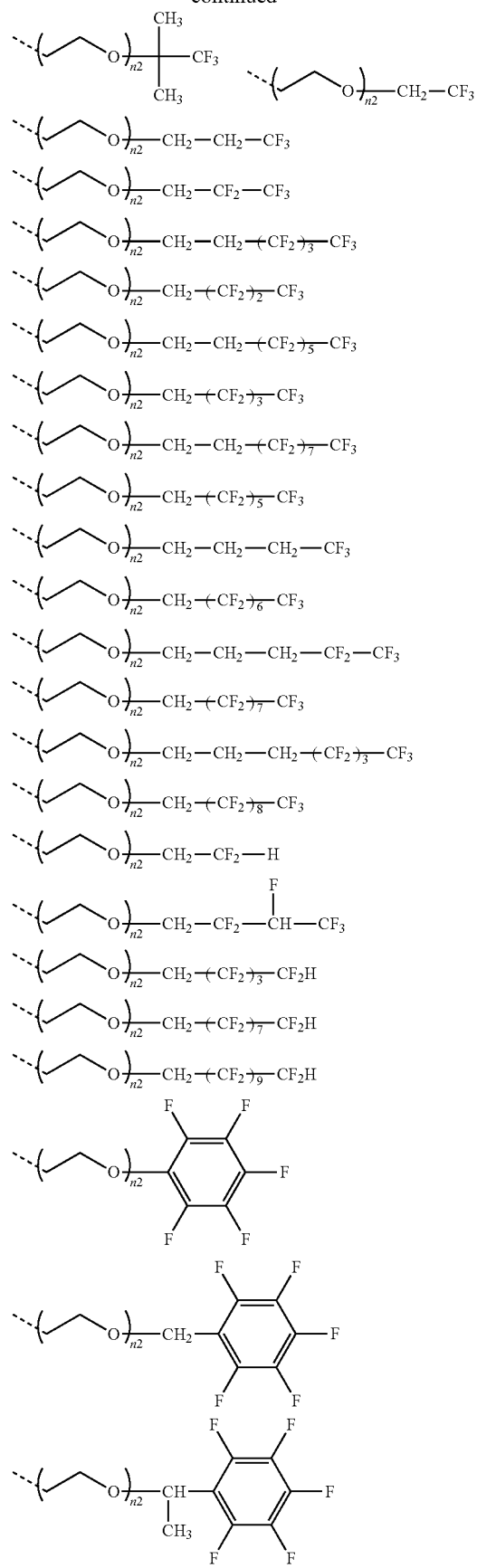

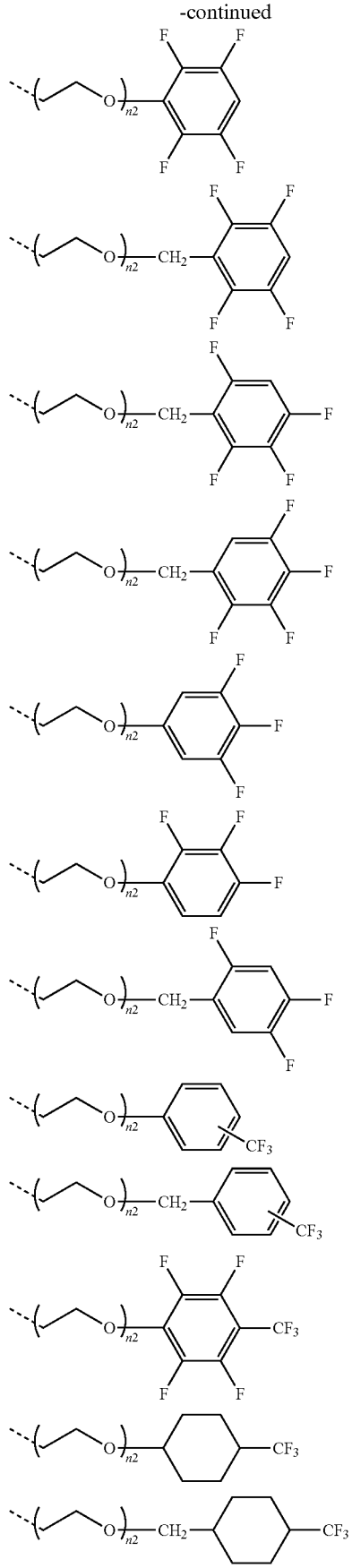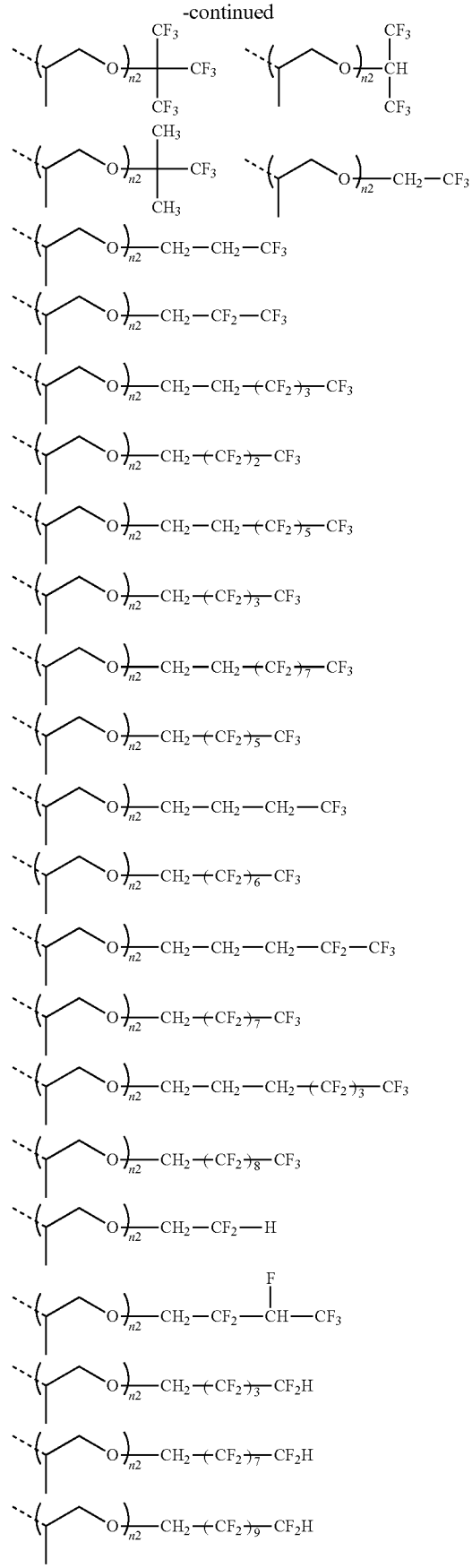

-continued
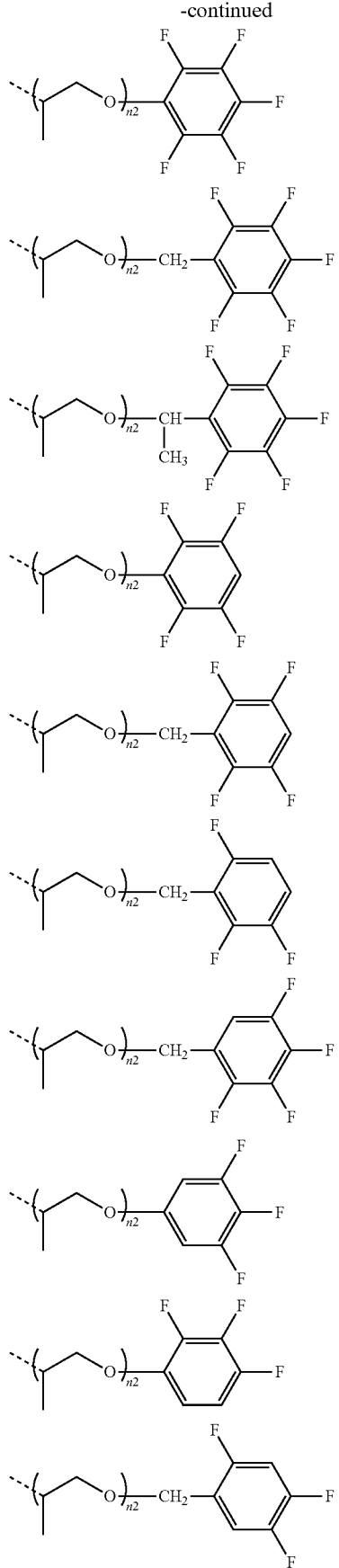
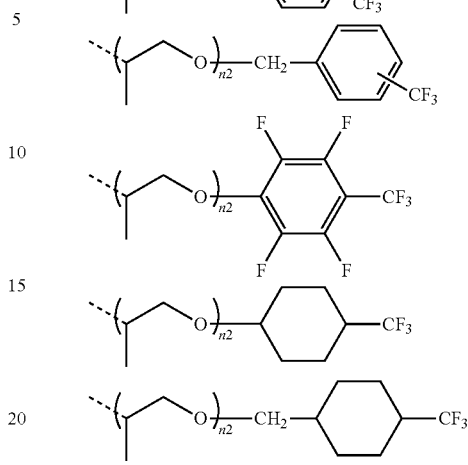
In the formulae, the dotted line represents a bond; and n2 is an integer of 1 to 6, preferably an integer of 1 to 3, more preferably 1 or 2, most preferably 1.
In the organic group shown by the general formula (26), concrete examples of the organic group that can be used preferably include the following, but are not limited thereto.
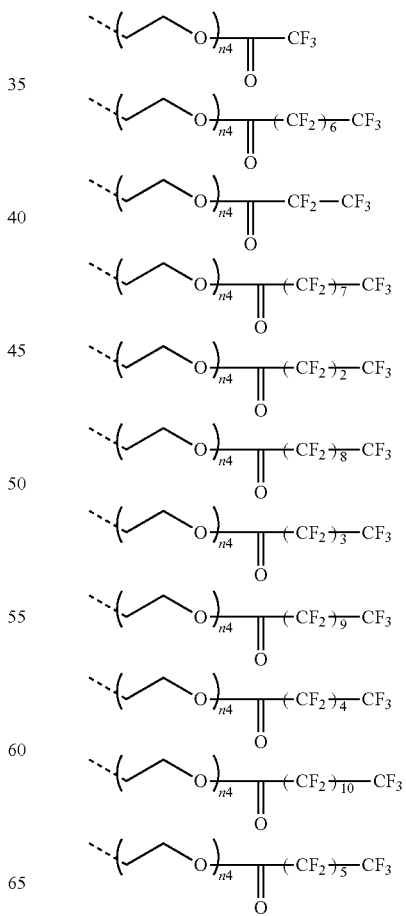

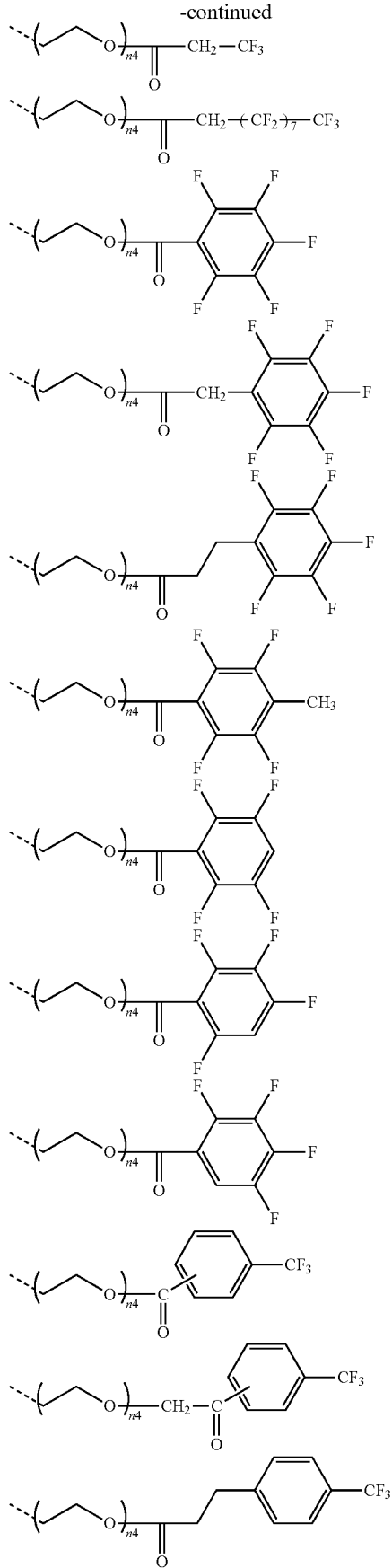
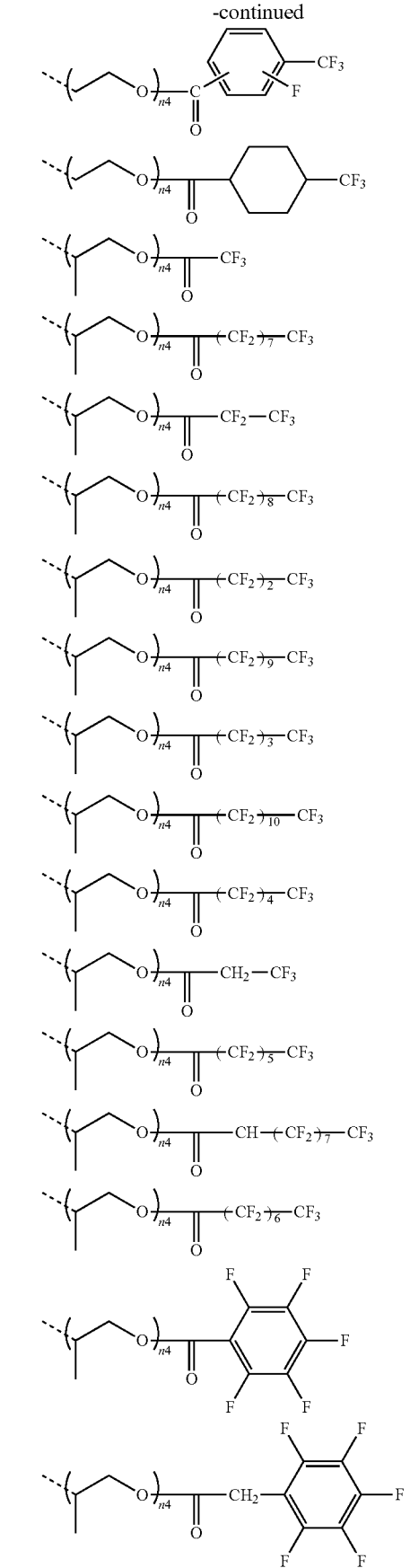

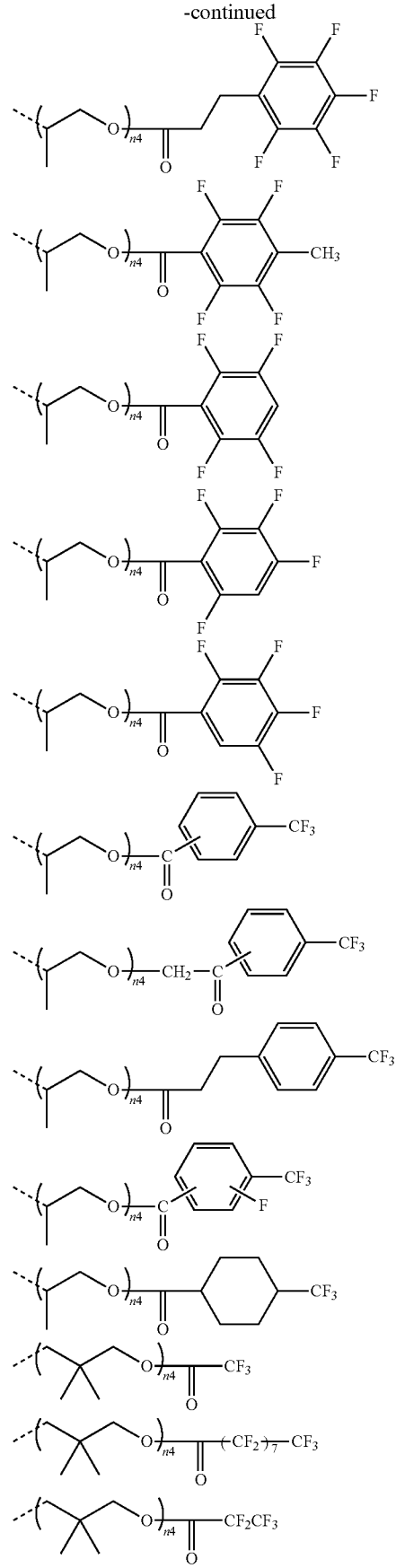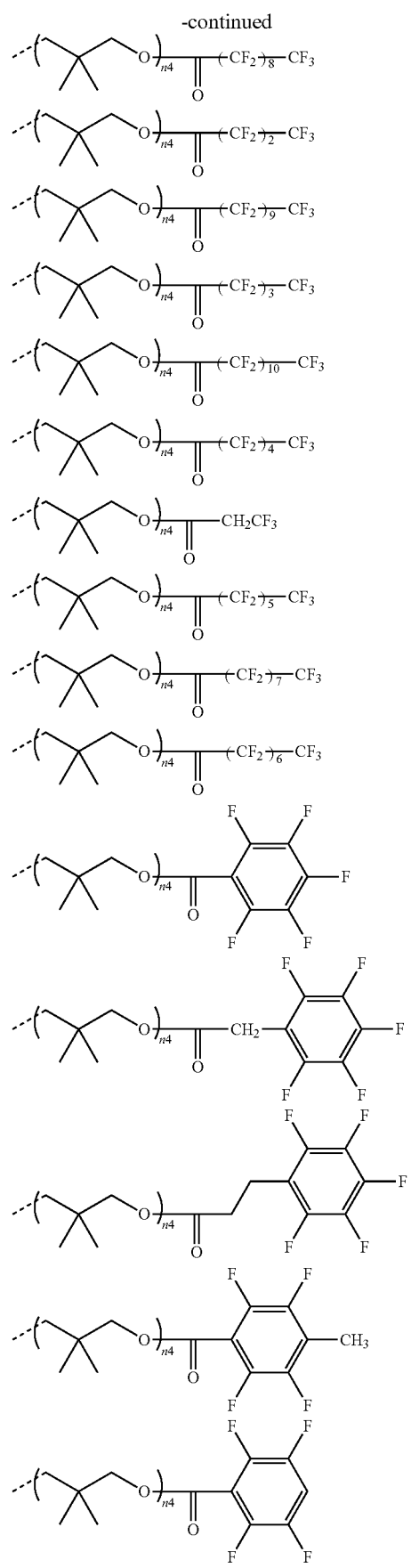

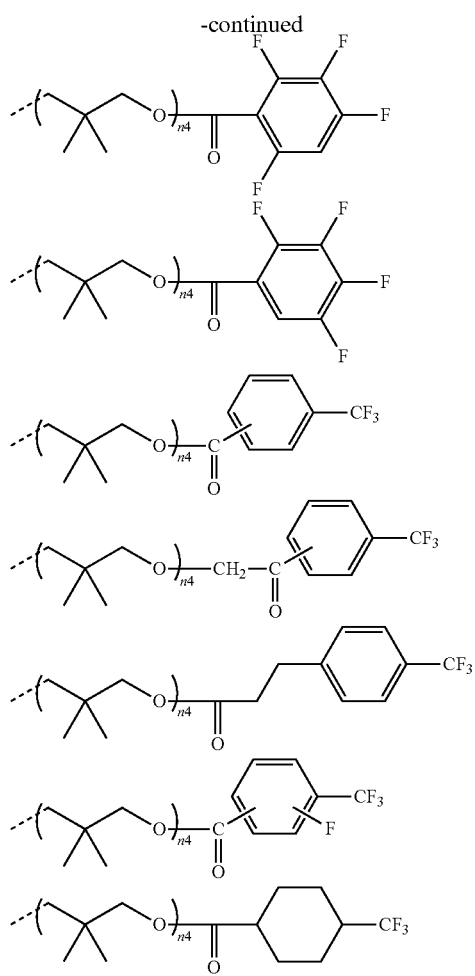

In the formulae, the dotted line represents a bond; and n4 is an integer of 1 to 6, preferably an integer of 1 to 3, more preferably 1 or 2, most preferably 1.

In the organic group shown by the general formula (27), concrete examples of the organic group that can be used preferably include the following, but are not limited thereto.

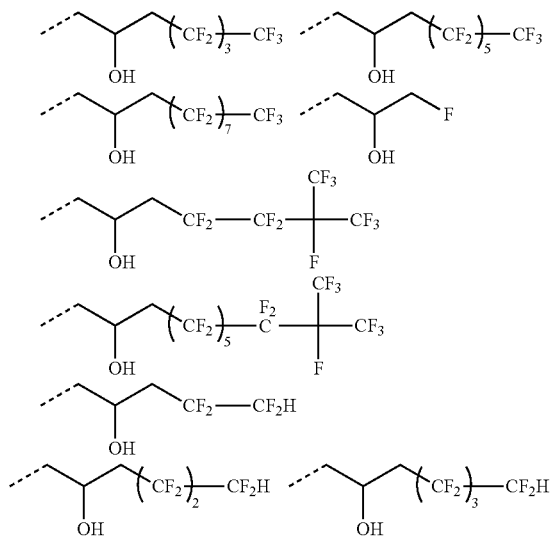

In the formulae, the dotted line represents a bond.

In this regard, after patterning of a photosensitive resin composition using the inventive polymer having the tetracarboxylic acid diester unit shown by the general formula (22), the polyimide precursor structural unit undergoes imidization ring-closure reaction by baking for post-curing. At this time, the introduced $R^{16}$ is eliminated and removed from the system, and thus the thickness of the formed film is reduced. Accordingly, $R^{16}$ more preferably has lower molecular weight to minimize the film loss during post-curing.

The tetracarboxylic acid diester unit can be introduced into the inventive polymer, for example, by reaction using an excess diamine containing at least one of a diamine shown by the general formulae (1) and (2), together with a tetracarboxylic dianhydride shown by the general formula (3) to synthesize an amic acid oligomer having amino group terminals, followed by reaction of the amino group terminals of the amic acid oligomer and the tetracarboxylic acid diester compound shown by the general formula (22). Alternatively, the tetracarboxylic acid diester unit can be introduced into the polymer by the same reaction using the excess diamine and at least one of the dicarboxylic acid and the dicarboxylic halide shown by the general formula (4).

As a preferable method for producing a tetracarboxylic acid diester compound shown by the general formula (22), $R^{16}$ can be introduced by reaction of tetracarboxylic dianhydride shown by the following general formula (28) and a compound having a hydroxy group at the terminal shown by the following general formula (29) in the presence of a basic catalyst such as pyridine.

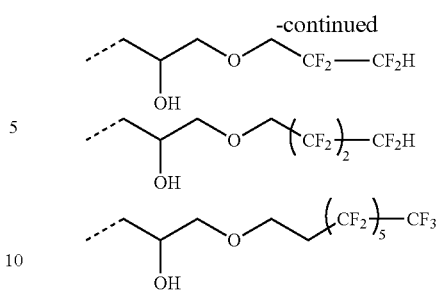

(28)

In the formula, W1 is as defined above.

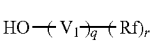

(29)

In the formula, $V_1$, Rf, "q", and "r" are as defined above.

Preferable examples of the tetracarboxylic dianhydride shown by the general formula (28) include aromatic dianhydrides, alicyclic dianhydrides, and aliphatic dianhydrides. Examples of the aromatic dianhydride include pyromellitic dianhydride, 3,3',4,4'-biphenyltetracarboxylic dianhydride, 2,3,3',4'-biphenyltetracarboxylic dianhydride, 2,3,2',3'-biphenyltetracarboxylic dianhydride, 3,3',4,4'-terphenyltetracarboxylic dianhydride, 3,3',4,4'-oxyphthalic dianhydride, 2,3,3',4'-oxyphthalic dianhydride, 2,3,2',3'-oxyphthalic dianhydride, diphenylsulfone-3,3',4,4'-tetracarboxylic dianhydride, benzophenone-3,3',4,4'-tetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 1,4-(3,4-dicarboxyphenoxy)benzene dianhydride, p-phenylene bis (trimellitic acid monoester anhydride), bis(1,3-dioxo-1,3-dihydroisobenzofuran-5-carboxylic acid)-1,4-phenylene, 2,2-bis(4-(4-aminophenoxy)phenyl)propane, 1,2,5,6-naphthalenetetracarboxylic dianhydride, 2,3,6,7-naphthalenetetracarboxylic dianhydride, 9,9-bis(3,4-dicarboxyphenyl)fluorene dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, 2,2-bis(4-(3,4-dicarboxybenzoyloxy)phenyl)hexafluoropropane dianhydride, 1,6-difluoropromellitic dianhydride, 1-trifluoromethylpyromellitic dianhydride, 1,6-ditrifluoromethylpyromellitic dianhydride, 2,2'-bis(trifluoromethyl)-4,4'-bis(3,4-dicarboxyphenoxy)biphenyl dianhydride, 2,2'-bis[(dicarboxyphenoxy)phenyl]propane dianhydride, 2,2'-bis[(dicarboxyphenoxy)phenyl]hexafluoropropane dianhydride, and acid dianhydride compounds obtained by substituting the aromatic ring of the above compounds with a substituent such as an alkyl group, an alkoxy group, or a halogen atom, although not limited thereto.

Examples of the alicyclic dianhydride include 1,2,3,4-cyclobutanetetracarboxylic dianhydride, 1,2,3,4-cyclopentanetetracarboxylic dianhydride, 1,2,4,5-cyclohexanetetracarboxylic dianhydride, 1,2,4,5-cyclopentanetetracarboxylic dianhydride, 1,2,3,4-tetramethyl-1,2,3,4-cyclobutanetetracarboxylic dianhydride, 1,2-dimethyl-1,2,3,4-cyclobutanetetracarboxylic dianhydride, 1,3-dimethyl-1,2,3,4-cyclobutanetetracarboxylic dianhydride, 1,2,3,4-cycloheptanetetracarboxylic dianhydride, 2,3,4,5-tetrahydrofurantetracarboxylic dianhydride, 3,4-dicarboxy-1-cyclohexylsuccinic dianhydride, 2,3,5-tricarboxycyclopentylacetic dianhydride, 3,4-dicarboxy-1,2,3,4-tetrahydro-1-naphthalenesuccinic dianhydride, bicyclo[3.3.0]octane-2,4,6,8-tetracarboxylic dianhydride, bicyclo[4.3.0]nonane-2,4,7,9-tetracarboxylic dianhydride, bicyclo[4.4.0]decane-2,4,7,9-tetracarboxylic dianhydride, bicyclo[4.4.0]decane-2,4,8,10-tetracarboxylic dianhydride, tricyclo[6.3.0.0$^{2,6}$]undecane-3,5,9,11-tetracarboxylic dianhydride, bicyclo[2.2.2]octane-2,3,5,6-tetracarboxylic dianhydride, bicyclo[2.2.2]oct-7-ene-2,3,5,6-tetracarboxylic dianhydride, bicyclo[2.2.1]heptane tetracarboxylic dianhydride, bicyclo[2.2.1]heptane-5-carboxymethyl-2,3,6-tricarboxylic dianhydride, 7-oxabicyclo[2.2.1]heptane-2,4,6,8-tetracarboxylic dianhydride, octahydronaphthalene-1,2,6,7-tetracarboxylic dianhydride, tetradecahydroanthracene-1,2,8,9-tetracarboxylic dianhydride, 3,3',4,4'-dicyclohexanetetracarboxylic dianhydride, 3,3',4,4'-oxydicyclohexanetetracarboxylic dianhydride, 5-(2,5-dioxotetrahydro-3-furanyl)-3-methyl-3-cyclohexene-1,2-dicarboxylic anhydride, and "RIKACID" (registered trade mark) BT-100 (manufactured by New Japan Chemical Co., Ltd), derivatives thereof, and acid dianhydride compounds obtained by substituting the alicyclic ring of the above compounds with a substituent such as an alkyl group, an alkoxy group, or a halogen atom, although not limited thereto.

Examples of the aliphatic dianhydride include 1,2,3,4-butanetetracarboxylic dianhydride, 1,2,3,4-pentanetetracarboxylic dianhydride, and derivative thereof, although not limited thereto.

These aromatic dianhydrides, alicyclic dianhydrides, and aliphatic dianhydrides may be used alone or in combination of two or more kinds.

For the reaction of the tetracarboxylic dianhydride shown by the general formula (28) with the compound having a hydroxy group at the terminal shown by the general formula (29), the tetracarboxylic dianhydride shown by the general formula (28) and the compound having a hydroxy group at the terminal shown by the general formula (29) are stirred, dissolved, and mixed in the presence of a basic catalyst such as pyridine in a reaction solvent, at a reaction temperature of 20 to 50° C., over 4 to 10 hours. In this manner, half-esterification reaction of the acid dianhydride progresses, and a solution in which an intended tetracarboxylic acid diester compound shown by the general formula (28) is dissolved in the reaction solvent can be obtained.

The obtained tetracarboxylic acid diester compound may be isolated, or the obtained solution as is may be used for a subsequent reaction with a diamine.

The reaction solvent is preferably a solvent that can favorably dissolve the above tetracarboxylic acid diester compound and a polymer having a polyimide precursor structural unit obtained by the subsequent polycondensation reaction of the tetracarboxylic acid diester compound with a diamine. Examples of the solvent include N-methyl-2-pyrrolidone, N,N-dimethylacetamide, N,N-dimethylformamide, dimethylsulfoxide, tetramethylurea, and γ-butyrolactone. In addition, ketones, esters, lactones, ethers, halogenated hydrocarbons, and hydrocarbons can also be used. Illustrative examples thereof include acetone, methyl ethyl ketone, methyl isobutyl ketone, cyclohexanone, methyl acetate, ethyl acetate, butyl acetate, diethyl oxalate, ethylene glycol dimethyl ether, diethylene glycol dimethyl ether, tetrahydrofuran, dichloromethane, 1,2-dichloroethane, 1,4-dichlorobutane, chlorobenzene, o-dichlorobenzene, hexane, heptane, benzene, toluene, and xylene. These solvents may be used alone or in combination of two or more kinds as needed.

The inventive polymer may also be a polymer having a structure obtained by reaction of diamines containing another diamine shown by the following general formula (30), together with the above diamine containing at least one of the diamine shown by the general formula (1) and the diamine shown by the general formula (2) as well as at least one of the tetracarboxylic dianhydride shown by the general formula (3), the dicarboxylic acid and the dicarboxylic halide shown by the general formula (4).

$$H_2N-T-NH_2 \qquad (30)$$

In the structural unit (30), T is a divalent organic group, which is any divalent organic group, is preferably a divalent organic group having 6 to 40 carbon atoms, more preferably a cyclic organic group containing 1 to 4 aromatic or alicyclic rings each having a substituent, or an aliphatic group or siloxane group having no cyclic structure. Still more preferably, T is a structure shown by the following formula (31) or (32). The structure of T may be one kind or a combination of two or more kinds.

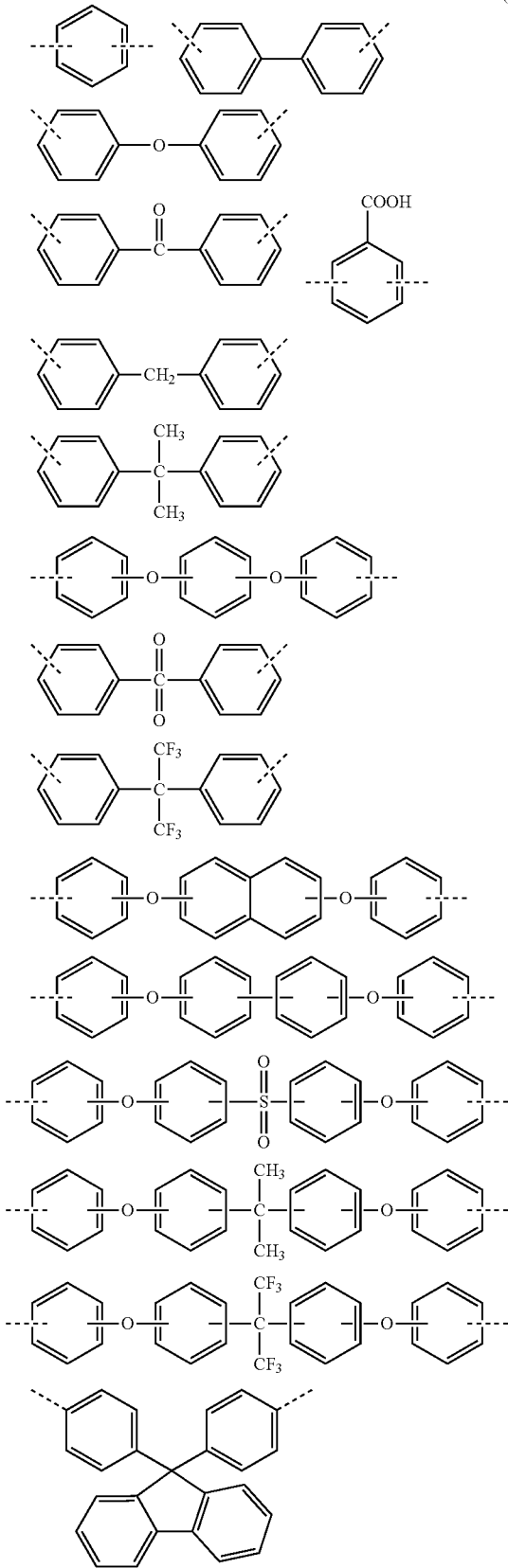

(31)

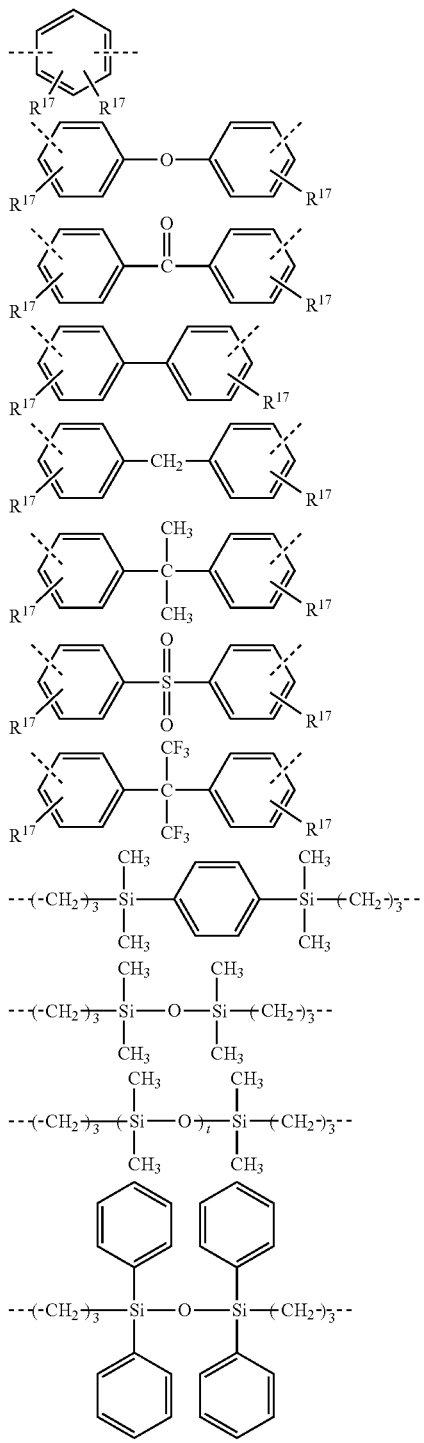

(32)

In the formulae, the dotted line represents a bond with an amino group.

In the formulae, the dotted line represents a bond with an amino group; each $R^{17}$ independently represents a methyl group, an ethyl group, a propyl group, an n-butyl group, or a trifluoromethyl group; and "t" represents a positive number of 2 to 20.

The inventive polymer may be a polymer that has a structure obtained by reaction of another tetracarboxylic dianhydride shown by the following general formula (33), which is contained together with a diamine containing at least one of a diamine shown by the general formula (1) and a diamine shown by the general formula (2), and at least one of a tetracarboxylic dianhydride shown by the general formula (3) as well as a dicarboxylic acid and a dicarboxylic halide shown by the general formula (4).

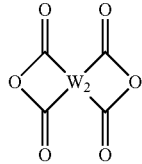
(33)

In the formula of the tetracarboxylic dianhydride shown by the general formula (33), $W_2$ is preferably a tetravalent organic group similar to W1 in the general formula (28). As a favorable tetracarboxylic dianhydride shown by the general formula (33), the tetracarboxylic dianhydride shown by the general formula (28) can be exemplified.

Additionally, the inventive polymer may be a polymer that has a structure obtained by reaction of another dicarboxylic acid or dicarboxylic halide shown by the following general formula (34), which is contained together with a diamine containing at least one of a diamine shown by the general formula (1) and a diamine shown by the general formula (2), and at least one of a tetracarboxylic dianhydride shown by the general formula (3) as well as a dicarboxylic acid and a dicarboxylic halide shown by the general formula (4).

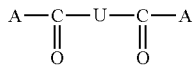
(34)

In the formula, "A" is as defined above.

In the formula, U represents a divalent organic group of an aliphatic chain-lengthening structure or an alicyclic aliphatic group having 4 to 40 carbon atoms, or an aromatic group; more preferably, a divalent organic group shown by the following formula (34-1). The structure of U may be one kind or a combination of two or more kinds.

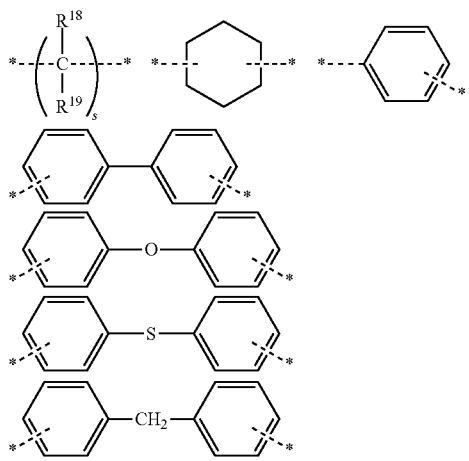
(34-1)

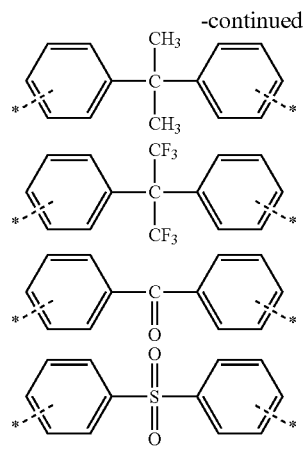

In the formulae, $R^{18}$ and $R^{19}$ each independently represent a hydrogen atom, a fluorine atom, or an alkyl group having 1 to 6 carbon atoms; "s" represents an integer of 1 to 30; and the dotted line represents a bond with a carboxy group or a carboxy halide group.

In the dicarboxylic acid and the dicarboxylic halide shown by the general formula (34), U is preferably a divalent organic group of chain-lengthening structure because the photosensitive resin composition, using the inventive polymer as a base resin, is allowed to be improved in mechanical strength of the cured film, particularly its elongation.

The dicarboxylic acid compound represented by the general formula (34) may be mentioned, for example, malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, glutaric acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, diglycolic acid, and the like.

Furthermore, the dicarboxylic acid compound having an aromatic ring may be mentioned, for example, phthalic acid, isophthalic acid, terephthalic acid, 4,4'-diphenyl ether dicarboxylic acid, 3,4'-diphenyl ether dicarboxylic acid, 3,3'-diphenyl ether dicarboxylic acid, 4,4'-biphenyl dicarboxylic acid, 3,4'-biphenyl dicarboxylic acid, 3,3'-biphenyl dicarboxylic acid, 4,4'-benzophenone dicarboxylic acid, 3,4'-benzophenone dicarboxylic acid, 3,3'-benzophenone dicarboxylic acid, 4,4'-hexafluoroisopropylidene dibenzoic acid, 4,4'-dicarboxydiphenylamide, 1,4-phenylenediethanoic acid, bis(4-carboxyphenyl)sulfide, 2,2-bis(4-carboxyphenyl)-1,1,1,3,3,3-hexafluoropropane, bis(4-carboxyphenyl) tetraphenyldisiloxane, bis(4-carboxyphenyl) tetramethyldisiloxane, bis(4-carboxyphenyl)sulfone, bis(4- carboxyphenyl)methane, 5-tert-butylisophthalic acid, 5-bromoisophthalic acid, 5-fluoroisophthalic acid, 5-chloroisophthalic acid, 2,2-bis-(p-carboxyphenyl)propane, and 2,6-naphthalene dicarboxylic acid, although not limited thereto. Also, these materials may be used singly or in admixture.

[Polymer Having a Structural Unit of Polyamide, Polyamide-Imide, or Polyimide, and Method for Producing the Polymer]

(Structural Unit of Polyamide, Polyamide-Imide, or Polyimide)

The inventive polymer is a polymer characterized by having a structural unit of polyamide, polyamide-imide, or polyimide obtained by reaction of a diamine containing at least one of a diamine shown by the general formula (1) and a diamine shown by the general formula (2), together with at least one of a tetracarboxylic dianhydride shown by the general formula (3) as well as a dicarboxylic acid and a dicarboxylic halide shown by the general formula (4).

The polyamide structural unit is represented by polyamide structural units shown by the following general formulae (35) and (36), each of which is obtained by reaction of a diamine containing at least one of a diamine shown by the general formula (1) and a diamine shown by the general formula (2), together with at least one of a dicarboxylic acid and a dicarboxylic halide shown by the general formula (4).

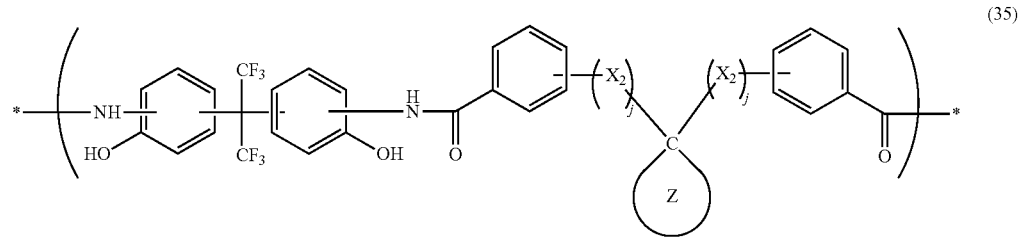

(35)

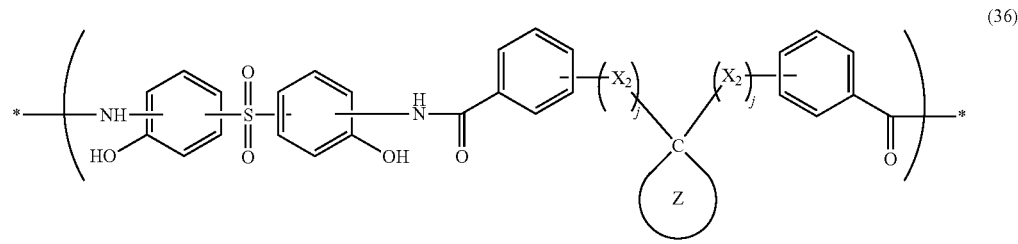

(36)

The polyimide structural unit is represented by polyimide structural units shown by the following general formulae (37) and (38), each of which is obtained by reaction of a diamine containing at least one of a diamine shown by the general formula (1) and a diamine shown by the general formula (2), together with a tetracarboxylic dianhydride shown by the general formula (3).

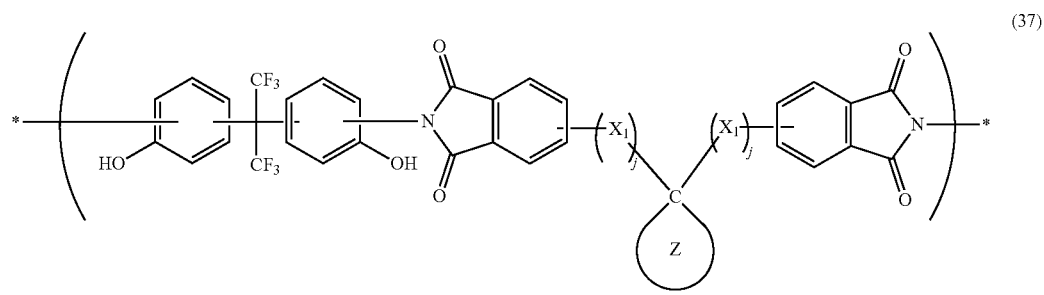

(37)

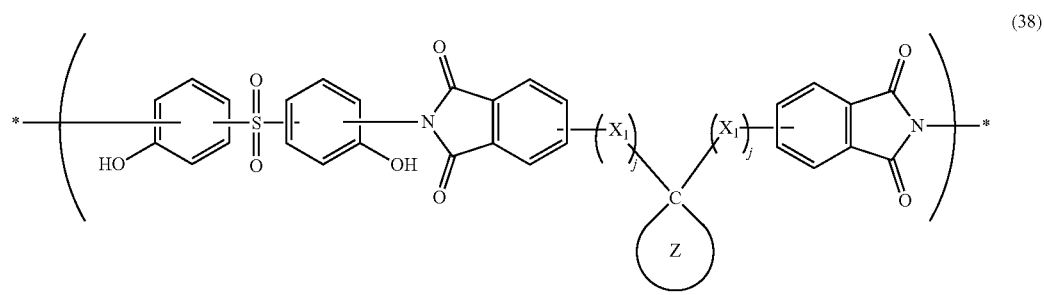

(38)

The polyamide-imide structural unit is represented by a polyamide-imide structural unit having at least one of structural units of the general formulae (35) and (36) as well as at least one of structural units of the general formulae (37) and (38), which is obtained by simultaneous reaction of a diamine containing at least one of a diamine shown by the general formula (1) and a diamine shown by the general formula (2), together with at least one of a tetracarboxylic dianhydride shown by the general formula (3) as well as a dicarboxylic acid and a dicarboxylic halide shown by the general formula (4); or by reactions of obtaining a polyimide structure, followed by adding at least one of a dicarboxylic acid and a dicarboxylic halide shown by the general formula (4).

(Method for Producing a Structural Unit of Polyamide, Polyamide-Imide, or Polyimide)

The polymer containing a polyamide structural unit of the structural unit (35) or (36) can be obtained by reaction of dicarboxylic acid of the general formula (4) in which "A" is a hydroxy group in the presence of a dehydration condensation agent or to convert to an acid halide compound using a halogenating agent, followed by reaction with a diamine; or reaction using a dicarboxylic halide of the general formula (4) in which "A" is a halogen atom, together with a diamine.

As the halogenating agent to convert the dicarboxylic acid to an acid halide compound, a chlorinating agent such as thionyl chloride and oxalyl dichloride can be exemplified. In the synthesis method, the conversion to acid chloride is followed by reaction with a diamine.

In the reaction of the dicarboxylic acid using a chlorinating agent to convert to an acid chloride, a basic compound may be used. Examples of the basic compound include pyridine, dimethylaminopyridine, 1,8-diazabicyclo[5.4.0]undec-7-ene, and 1,5-diazabicyclo[4.3.0]non-5-ene.

As the solvent in the method via an acid chloride or the solvent in the reaction of obtaining a polyimide structure using a previously prepared dicarboxylic halide of the general formula (4) in which "A" represents a halogen atom, it is preferable to use a solvent that can favorably dissolve the acid chloride, the dicarboxylic halide, and the polymer having a polyamide structure obtained by polycondensation reaction with a diamine. Illustrative examples thereof include N-methyl-2-pyrrolidone, N,N-dimethylacetamide, N,N-dimethylformamide, dimethylsulfoxide, tetramethylurea, hexamethylphosphoric triamide, and γ-butyrolactone. In addition to polar solvents, ketones, esters, lactones, ethers, halogenated hydrocarbons, and hydrocarbons can also be used. Illustrative examples thereof include acetone, diethyl ketone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, tetrahydrofuran, dichloromethane, 1,2-dichloroethane, 1,4-dichlorobutane, trichloroethane, chlorobenzene, o-dichlorobenzene, hexane, heptane, octane, benzene, toluene, and xylene. These solvents may be used alone or in combination of two or more kinds.

Another possible method includes reaction of a diamine containing at least one of a diamine shown by the general formula (1) and a diamine shown by the general formula (2), together with a dicarboxylic acid of the general formula (4) in which "A" represents a hydroxy group in the presence of a dehydration condensation agent. That is, the polymer containing the structural unit (35) or (36) can be obtained by reaction using the dicarboxylic acid of the general formula (4) in which "A" represents a hydroxy group such that the dicarboxylic acid is dissolved in the same reaction solvent as described above; to this reaction solvent, a known dehydration condensation agent (for example, dicyclohexylcarbodiimide, 1-ethoxycarbonyl-2-ethoxy-1,2-dihydroquinoline, 1,1-carbonyldioxy-di-1,2,3-benzotriazole, or N,N'-disuccinimidylcarbonate) is added and mixed under ice-cooling to obtain a polyacid anhydride of the dicarboxylic acid compound of the general formula (4) in which "A" represents a hydroxy group; and then, the diamine shown by the general formula (1) and the diamine shown by the general formula (2) are separately dissolved or dispersed in a solvent, and this solution or dispersion is added dropwise thereto to perform polycondensation.

In producing a polymer containing a polyamide structural unit of the structural unit (35) or (36), it is possible to obtain the inventive polymer that inevitably contains a polyamide structural unit using the diamine shown by the general formula (1) and the diamine shown by the general formula (2), together with a diamine other than these, such as another diamine shown by the general formula (30).

In producing a polymer containing a polyamide structural unit of the structural unit (35) or (36), it is also possible to obtain the inventive polymer that inevitably contains a polyamide structural unit using the dicarboxylic acid or the dicarboxylic halide shown by the general formula (4), together with a dicarboxylic acid or a dicarboxylic halide other than these, that is, another dicarboxylic acid or dicarboxylic halide shown by the general formula (34).

The following describes a method for producing the polyimide structure shown by the general formula (37) or (38). The polyimide structure shown by the general formula (37) or (38) is formed by reaction of a diamine containing at least one of a diamine shown by the general formula (1) and a diamine shown by the general formula (2), together with a tetracarboxylic dianhydride shown by the general formula (3) to synthesize an amic acid at first, followed by heat dehydration to form a polyimide structure.

The polyimide structure can be produced such that a diamine is dissolved into a high boiling point solvent with higher polarity such as γ-butyrolactone and N-methyl-2-pyrrolidone, then an acid anhydride is added thereto to react at 0 to 80° C., preferably 10 to 50° C. to an amic acid, non-polar solvent such as xylene is added subsequently, and this is heated to 100 to 200° C., preferably 130 to 180° C. to perform imidization reaction while removing water from the reaction system.

In producing a polymer containing a polyimide structure of the general formula (37) or (38), it is possible to obtain the inventive polymer that inevitably contains a polyimide structural unit using the tetracarboxylic dianhydride shown by the general formula (3), together with another tetracarboxylic dianhydride, that is, a tetracarboxylic dianhydride shown by the general formula (33).

In producing a polymer containing a polyimide structure of the general formula (37) or (38), it is possible to obtain the inventive polymer that inevitably contains a polyimide structural unit using a diamine containing at least one of the diamine shown by the general formula (1) and the diamine shown by the general formula (2), together with a diamine other than these, that is, another diamine shown by the general formula (30), for example.

In producing a polymer containing a polyamide-imide structure having at least one of the structures of the general formulae (35) and (36) as well as at least one of the structures of the general formulae (37) and (38), it is possible to form the polyamide-imide structure by reaction of a diamine containing at least one of the diamine shown by the general formula (1) and the diamine shown by the general formula (2), together with a tetracarboxylic dianhydride shown by the general formula (3) to form an amic acid, followed by heat dehydration of the dicarboxylic acid of the general formula (4) in which "A" represents a hydroxy group added to the same system of this amic acid.

There is another method for producing a polyamide-imide structure. In producing the polymer containing a polyimide structure shown by the general formula (37) or (38), the polyamide-imide structure can be obtained by reaction using a diamine containing at least one of the diamine shown by the general formula (1) and the diamine shown by the general formula (2), together with a tetracarboxylic dianhydride shown by the general formula (3) to synthesize an amic acid oligomer having terminal amino groups, followed by reaction of the terminal amino groups of the amic acid oligomer and the dicarboxylic acid shown by the general formula (4) using the same method for producing the polyamide structure.

In the same way as described above, also in producing a polymer containing a polyamide-imide structure, it is possible to use a diamine containing at least one of the diamine shown by the general formula (1) and the diamine shown by the general formula (2), together with a diamine other than these, such as shown by the general formula (30). It is also possible to use the tetracarboxylic dianhydride shown by the general formula (3), together with a tetracarboxylic dianhydride other than that, that is, the tetracarboxylic dianhydride shown by the general formula (33); alternatively it is possible to use the dicarboxylic acid or the dicarboxylic halide shown by the general formula (4), together with a dicarboxylic acid or a dicarboxylic halide other than these, that is, the dicarboxylic acid or dicarboxylic halide shown by the general formula (34).

(Introduction of Tetracarboxylic Acid Diester Unit Shown by the General Formula (22))

Subsequently, the method for introducing a tetracarboxylic acid diester unit shown by the general formula (22) will be described. As a method for introducing the tetracarboxylic acid diester unit shown by the general formula (22) into the inventive polymer characterized by containing a structural unit of polyamide, polyamide-imide, or polyimide obtained by reaction of a diamine containing at least one of the diamine shown by the general formula (1) and the diamine shown by the general formula (2), together with at least one of a tetracarboxylic dianhydride shown by the general formula (3) as well as a dicarboxylic acid and a dicarboxylic halide shown by the general formula (4), the tetracarboxylic acid diester unit shown by the general formula (22) can be introduced by reaction using an excess amount of diamine containing at least one of the diamine shown by the general formula (1) and the diamine shown by the general formula (2), together with a tetracarboxylic dianhydride shown by the general formula (3) to synthesize an amic acid oligomer having terminal amino groups, followed by reaction of the terminal amino groups of the amic acid oligomer and the dicarboxylic acid shown by the general formula (22) using the same method as the method for obtaining the polyamide structure.

Alternatively, the tetracarboxylic acid diester unit shown by the general formula (22) can be introduced by reaction using an excess amount of diamine containing at least one of the diamine shown by the general formula (1) and the diamine shown by the general formula (2), together with at least one of a dicarboxylic acid and a dicarboxylic halide shown by the general formula (4) to synthesize an amide oligomer having terminal amino groups, followed by reaction of the terminal amino groups and the tetracarboxylic acid diester compound shown by the general formula (22) by the same method for obtaining the polyamide structure.

(Molecular Weight of Polymer and Introduction of End Blocking Agent)

In the inventive polymer characterized by having a structural unit of polyamide, polyamide-imide, or polyimide obtained by reaction of a diamine containing at least one of the diamine shown by the general formula (1) and the diamine shown by the general formula (2), together with at least one of a tetracarboxylic dianhydride shown by the general formula (3) as well as a dicarboxylic acid and a dicarboxylic halide shown by the general formula (4), the molecular weight is preferably 5,000 to 100,000, more preferably 7,000 to 30,000. The molecular weight of 5,000 or more allows the photosensitive resin composition using the polymer as a base resin to form a film easily with a desired film thickness on a substrate. The molecular weight of 100,000 or less prevents the photosensitive resin composition from increasing the viscosity extremely high to prevent the risk of failing to form a film.

The inventive polymer may be blocked with an end-blocking agent at the both terminals to control the molecular weight at polycondensation reaction and to inhibit time-dependent change of the molecular weight of the obtained polymer, i.e., to inhibit gelation. An end-blocking agent for the acid dianhydride may be a monoamine or a monohydric alcohol. An end-blocking agent for the diamine compound may be an acid anhydride, a monocarboxylic acid, a mono-acid chloride compound, a mono-active ester compound, a dicarbonic acid ester, or a vinyl ether. In addition, reaction of the end-blocking agent allows various organic groups to be introduced into the terminal.

Examples of the monoamine used as the end-blocking agent for the acid anhydride terminal include aniline, 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, ameride, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, 2-ethynylaniline, 3-ethynylaniline, 4-ethynylaniline, 2,4-diethynylaniline, 2,5-diethynylaniline, 2,6-diethynylaniline, 3,4-diethynylaniline, 3,5-diethynylaniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-aminonaphthalene, 3,6-diethynyl-1-aminonaphthalene, 3,6-diethynyl-2-aminonaphthalene, 3,7-diethynyl-1-aminonaphthalene, 3,7-diethynyl-2-aminonaphthalene, 4,8-diethynyl-1-aminonaphthalene, and 4,8-diethynyl-2-aminonaphthalene, although not limited thereto. These compounds may be used alone or in combination of two or more kinds.

Examples of the monohydric alcohol used as the end-blocking agent for the acid anhydride terminal include methanol, ethanol, 1-propanol, 2-propanol, 1-butanol, 2-butanol, 1-pentanol, 2-pentanol, 3-pentanol, 1-hexanol, 2-hexanol, 3-hexanol, 1-heptanol, 2-heptanol, 3-heptanol, 1-octanol, 2-octanol, 3-octanol, 1-nonanol, 2-nonanol, 1-decanol, 2-decanol, 1-undecanol, 2-undecanol, 1-dodecanol, 2-dodecanol, 1-tridecanol, 2-tridecanol, 1-tetradecanol, 2-tetradecanol, 1-pentadecanol, 2-pentadecanol, 1-hexadecanol, 2-hexadecanol, 1-heptadecanol, 2-heptadecanol, 1-octadecanol, 2-octadecanol, 1-nonadecanol, 2-nonadecanol, 1-icosanol, 2-methyl-1-propanol, 2-methyl-2-propanol, 2-methyl-1-butanol, 3-methyl-1-butanol, 2-methyl-2-butanol, 3-methyl-2-butanol, 2-propyl-1-pentanol, 2-ethyl-1-hexanol, 4-methyl-3-heptanol, 6-methyl-2-heptanol, 2,4,4-trimethyl-1-hexanol, 2,6-dimethyl-4-heptanol, isononyl alcohol, 3,7-dimethyl-3-octanol, 2,4-dimethyl-1-heptanol, 2-heptylundecanol, ethylene glycol monoethyl ether, ethylene glycol monomethyl ether, ethylene glycol monobutyl ether, propylene glycol 1-methyl ether, diethylene glycol monoethyl ether, diethylene glycol monomethyl ether, diethylene glycol monobutyl ether, cyclopentanol, cyclohexanol, cyclopentane monomethylol, dicyclopentane monomethylol, tricyclodecane monomethylol, norborneol, and terpineol, although not limited thereto. These compounds may be used alone or in combination of two or more kinds.

Examples of the acid anhydride, the monocarboxylic acid, the monoacid chloride compound, and the mono-active ester compound used as the end-blocking agent for terminal amino groups include acid anhydrides such as phthalic anhydride, maleic anhydride, nadic anhydride, cyclohexanedicarboxylic anhydride, and 3-hydroxyphthalic anhydride; monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, 2-ethynylbenzoic acid, 3-ethynylbenzoic acid, 4-ethynylbenzoic acid, 2,4-diethynylbenzoic acid, 2,5-diethynylbenzoic acid, 2,6-diethynylbenzoic acid, 3,4-diethynylbenzoic acid, 3,5-diethynylbenzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1-naphthoic acid, 2-ethynyl-2-naphthoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid, and 8-ethynyl-2-naphthoic acid, and monoacid chloride compounds obtained by acid-chloridizing carboxyl groups of the above monocarboxylic acids; monoacid chloride compounds obtained by acid-chloridizing only a monocarboxy group of dicarboxylic acids such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, and 2,7-dicarboxynaphthalene; and active ester compounds obtained by reaction of a monoacid chloride compound with N-hydroxybenzotriazole or N-hydroxy-5-norbornene-2,3-dicarboxyimide.

Examples of the dicarbonic acid ester used as the end-blocking agent for terminal amino groups include di-tert-butyl dicarbonate, dibenzyl dicarbonate, dimethyl dicarbonate, and diethyl dicarbonate.

Examples of the vinyl ether compound used as the end-blocking agent for terminal amino groups include butyl vinyl ether, cyclohexyl vinyl ether, ethyl vinyl ether, 2-ethylhexyl vinyl ether, isobutyl vinyl ether, isopropyl vinyl ether, n-propyl vinyl ether, tert-butyl vinyl ether, and benzyl vinyl ether.

Examples of other compounds used as the end-blocking agent for terminal amino groups include chloroformic acid esters such as fluorenylmethyl chloroformate, 2,2,2-trichloroethyl chloroformate, tert-butyl chloroformate, n-butyl chloroformate, isobutyl chloroformate, benzyl chloroformate, allyl chloroformate, ethyl chloroformate, and isopropyl chloroformate; isocyanate compounds such as butyl isocyanate, 1-naphthyl isocyanate, octadecyl isocyanate, and phenyl isocyanate; benzoyl chloride, methanesulfonyl chloride, and p-toluenesulfonyl chloride.

The introduction rate of the end-blocking agent for acid anhydride terminal is preferably in a range of 0.1 to 60 mol %, more preferably 5 to 50 mol %, much more preferably 5 to 20 mol %, with respect to tetracarboxylic dianhydride components shown by the general formulae (3) and (33) or carboxylic acid components shown by the general formulae (4) and (34). Additionally, the introduction rate of the end-blocking agent for terminal amino groups is preferably in a range of 0.1 to 100 mol %, particularly preferably 5 to 90 mol %, with respect to the diamine containing at least one of the diamine shown by the general formula (1) and the diamine shown by the general formula (2) as well as the diamine component shown by the general formula (30). Moreover, multiple different terminal groups may be introduced by reaction with multiple end-blocking agents.

[Photosensitive Resin Composition]

Subsequently, the photosensitive resin composition having the inventive polymer as a base resin will be described. In the present invention, a positive photosensitive resin composition can be obtained by using the inventive polymer described above as a base resin.

[Positive Photosensitive Resin Composition]

Among the photosensitive resin compositions having the inventive polymer as a base resin, a positive photosensitive resin composition, which can be developed with alkali, will be described at first. The inventive positive photosensitive resin composition is not limited thereto.

The inventive positive photosensitive resin composition contains (A) the inventive polymer, (B) a compound having a quinonediazide structure, which is a photosensitive agent to generate an acid by light, and (D) a solvent.

The inventive positive photosensitive resin composition can further contain the following component (C):

(C) one or more crosslinking agents selected from an amino condensate modified with formaldehyde or formaldehyde-alcohol, a phenol compound having on average two or more methylol groups or alkoxymethyl groups per molecule, a polyhydric phenol compound in which a hydrogen atom of a phenolic hydroxy group thereof is substituted with a glycidyl group, a polyhydric phenol compound in which a hydrogen atom of a phenolic hydroxy group is substituted with a substituent shown by the following formula (C-1), and a compound containing two or more nitrogen atoms having a glycidyl group as shown by the following formula (C-2),

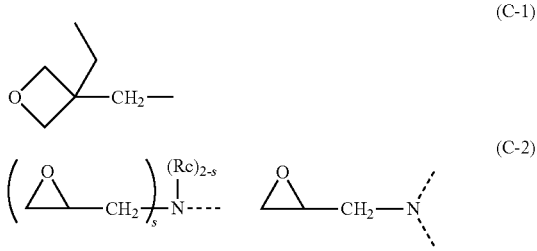

wherein, the dotted line represents a bond; Rc represents a linear, branched or a cyclic alkyl group having 1 to 6 carbon atoms; and "s" represents 1 or 2.

In view of obtaining alkali-solubility, the inventive positive photosensitive resin composition can be expressed by the molar number of the phenolic hydroxy group, which is derived from the diamine containing at least one of the diamine shown by the general formula (1) and the diamine shown by the general formula (2), with respect to 100 g of the component (A). That is, in 100 g of the component (A), the molar number of the phenolic hydroxy group is preferably 0.10 mol or more and 0.40 mol or less, more preferably 0.20 mol or more and 0.35 mol or less, most preferably 0.25 mol or more and 0.35 mol or less. When the molar number of the phenolic hydroxy group is 0.10 mol or more, a desired alkali dissolution rate can be obtained with respect to an aqueous alkaline developer, and failure at pattern opening and scum in pattern bottom are not caused in patterning, thus preventing reduction in resolution. On the other hand, possible amount of the phenolic hydroxy group that can be introduced into 100 g of the component (A) is about 0.40 mol in design of the inventive polymer. This amount enables higher solubility in an aqueous alkaline developer. The inventive photosensitive resin composition is post-cured after patterning to form a cured film, however, and the cured film sometimes contains many phenolic hydroxy groups that is alkali-soluble remained therein to increase the solubility of the obtained cured film to alkaline chemicals. Accordingly, the preferable amount of introduced phenolic hydroxy groups is controlled in accordance with the alkali-solubility.

The component (B) in the inventive positive photosensitive resin composition, which is a photosensitive agent capable of generating an acid by light and increasing a dissolution rate in an aqueous alkaline solution, is a compound having a quinonediazide structure. The component (B) may be a compound having a 1,2-naphthoquinone diazide sulfonyl group in its molecule.

Examples of the compound having a 1,2-naphthoquinone diazide sulfonyl group in its molecule include compounds having a 1,2-naphthoquinone diazide sulfonyl group shown by the following general formula.

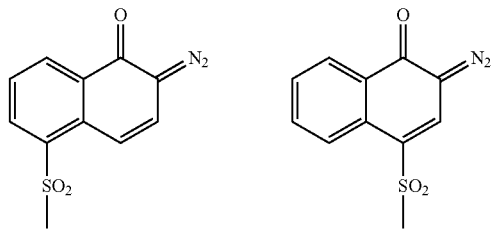

Illustrative examples of a preferable parent compound into which the 1,2-naphthoquinone diazide sulfonyl group is introduced include trihydroxybenzophenone, tetrahydroxybenzophenone, a ballast molecule having a phenolic hydroxy group as shown by the following general formula (38') (hereinafter, also referred to as "low nuclear compound", and a novolac resin having a repeating unit shown by the following formula (43) with a weight average molecular weight of 2,000 to 20,000, preferably 3,000 to 10,000. That is, a compound obtained by substituting a hydrogen atom of a hydroxy group of the following resin or compound having the phenolic hydroxy group with a 1,2-naphthoquinone diazide sulfonyl group is preferably used as the component (B).

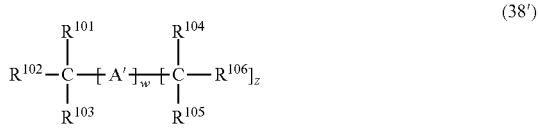

In the above formula, $R^{101}$ to $R^{106}$ independently represent a hydrogen atom, a methyl group, a group shown by the following formula (39), or a group shown by the following formula (40); "w" represents an integer of 0 to 2; and "z" represents an integer of 0 to 2, provided that when "z" is 0, "w" is 1 or 2. When "z" is 0 and "w" is 1, A' is a hydrogen atom, a methyl group, or a group shown by the following formula (39). When "z" is 0 and "w" is 2, one A' is a methylene group or a group shown by the following formula (41) and the other A' is a hydrogen atom, a methyl group, or a group shown by the following formula (39). When "z" is 1, A' is a methylene group or a group shown by the following formula (41). When "z" is 2 and "w" is 1, A' is a methine group or a group shown by the following formula (42). When "z" is 2 and "w" is 2, one A' is a methylene group or a group shown by the following formula (41) and the other A' is a methine group or a group shown by the following formula (42).

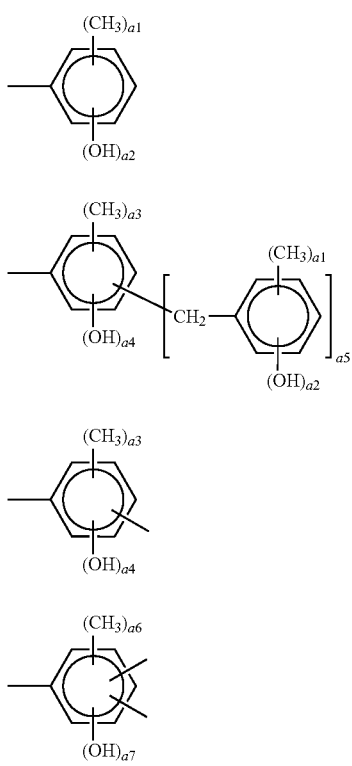

(39)

(40)

(41)

(42)

In the formulae, a1, a2, a3, a4, a5, a6, and a7 each represent an integer of 0 to 3 and satisfy a1+a2≤5, a3+a4≤4, a6+a7≤3.

In this case, the low nuclear compound (ballast molecule) of the formula (38') is preferably designed such that the number of benzene rings is 2 to 20, more preferably 2 to 10, much more preferably 3 to 6, and a ratio of the number of phenolic hydroxy groups to the number of benzene rings ranges from 0.5 to 2.5, more preferably from 0.7 to 2.0, much more preferably from 0.8 to 1.5.

Examples of the low nuclear compound (ballast molecule) include the following compounds.

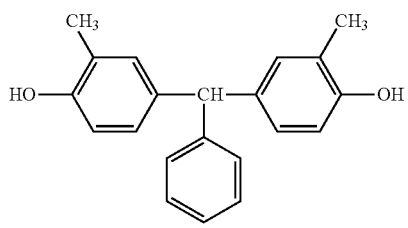

(B-1)

(B-2)

(B-3)

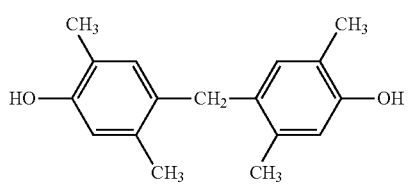

(B-4)

(B-5)

(B-6)

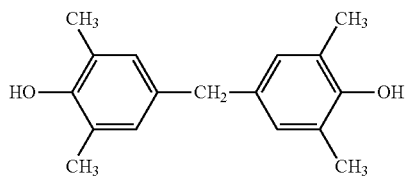

(B-7)

(B-8)

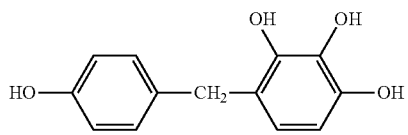

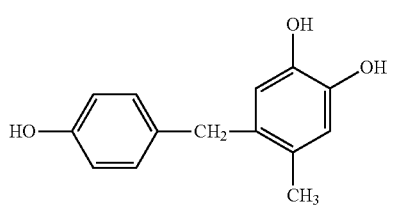

(B-9)

(B-10)

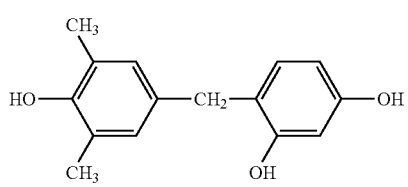

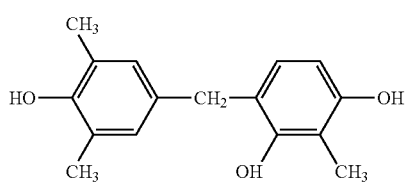

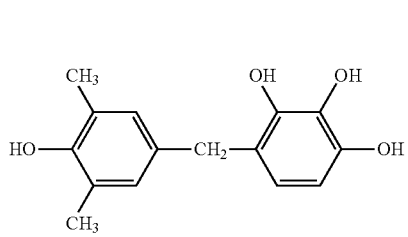

(B-11)

(B-12)
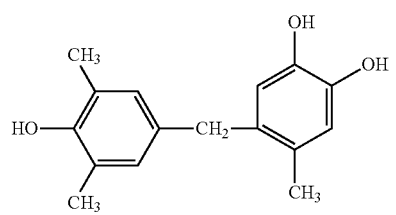
(B-13)
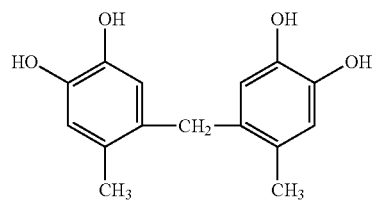
(B-14)
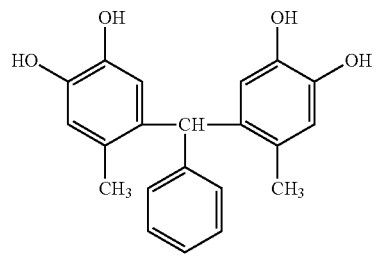
(B-15)
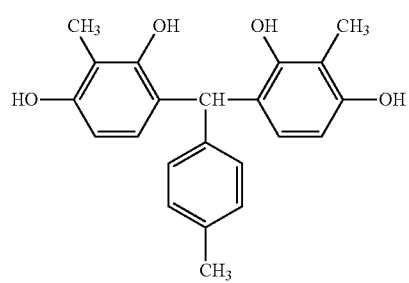
(B-16)
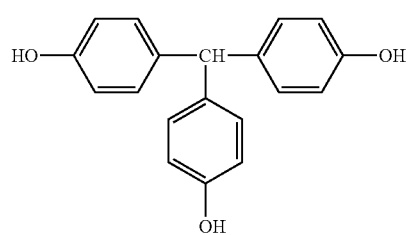
(B-17)
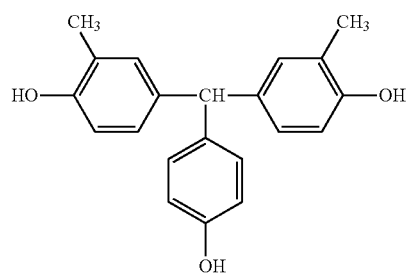
(B-18)
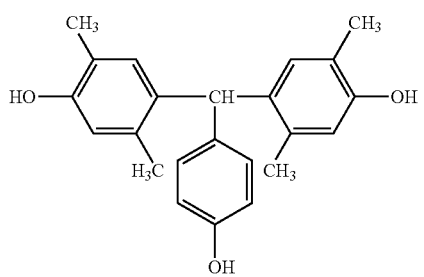
(B-19)
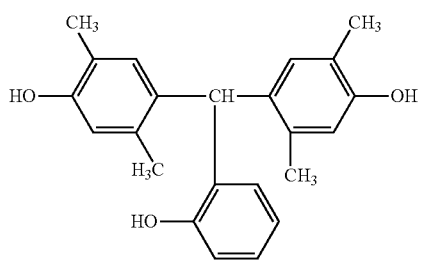
(B-20)
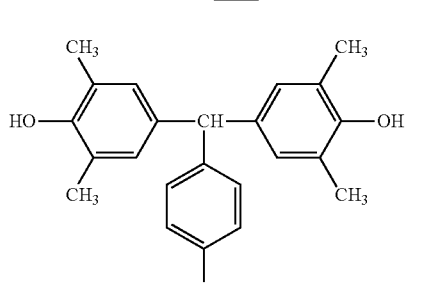
(B-21)
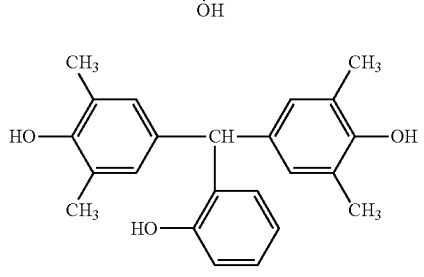
(B-22)
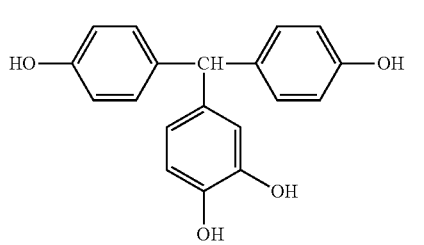
(B-23)
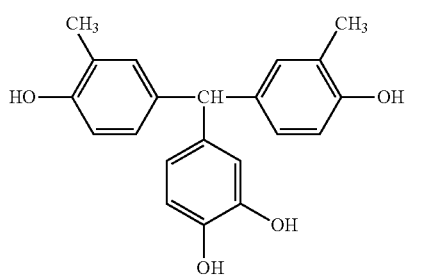

(B-24)
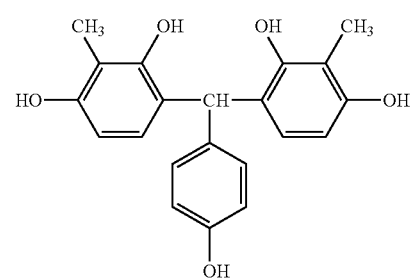
(B-25)
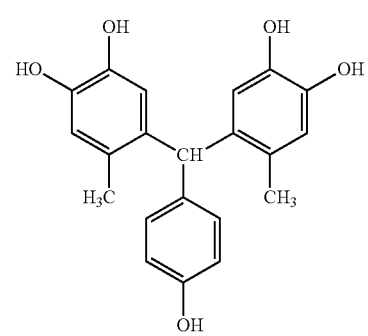
(B-26)
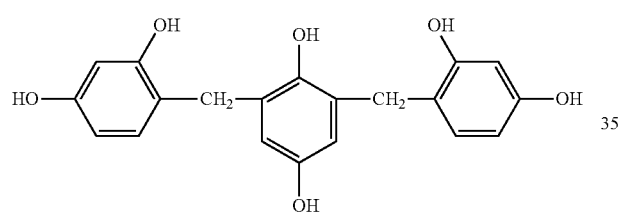
(B-27)
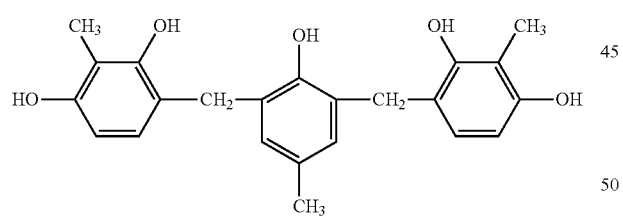
(B-28)
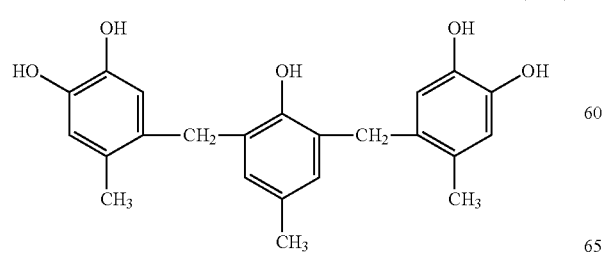
(B-29)
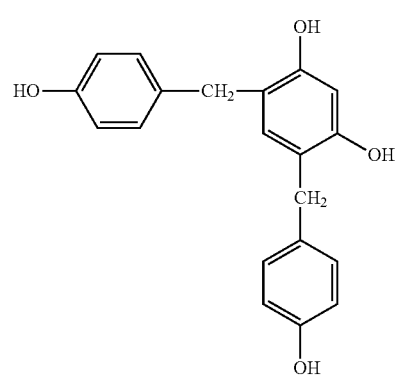
(B-30)
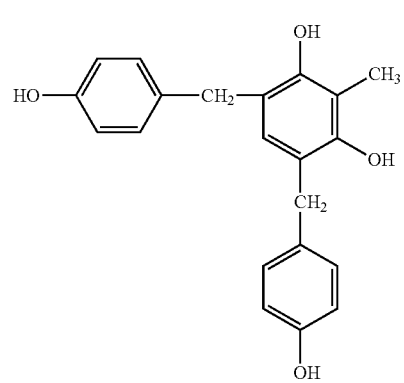
(B-31)
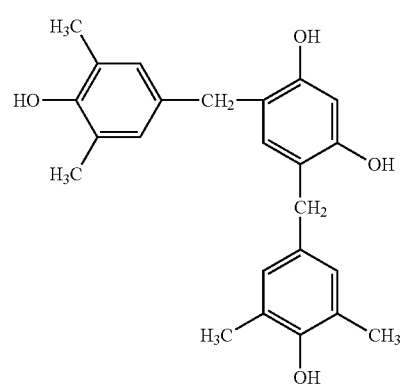
(B-32)
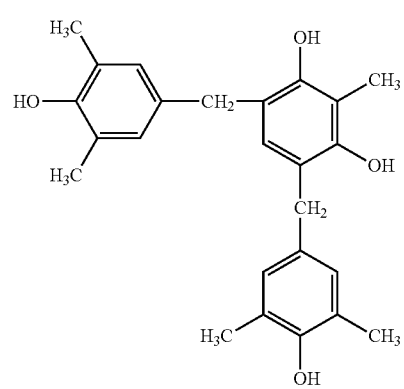

(B-33)
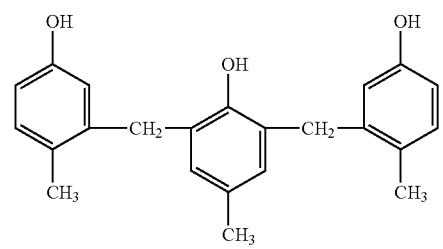
(B-34)
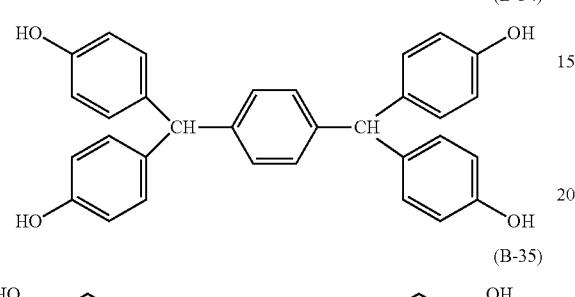
(B-35)
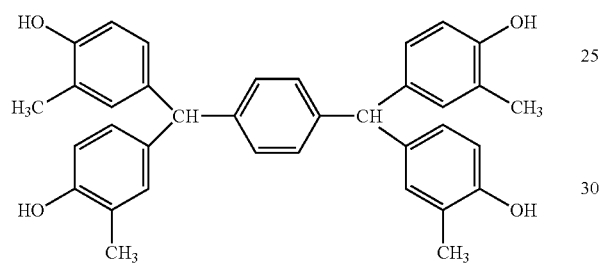
(B-36)
(B-37)
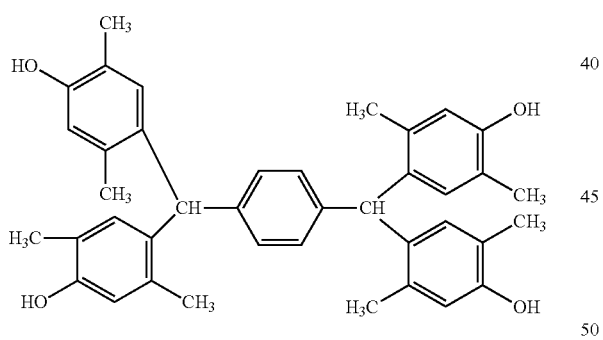
(B-38)
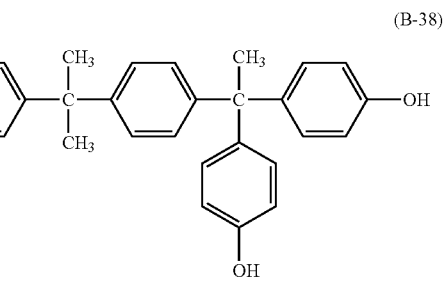
(B-39)
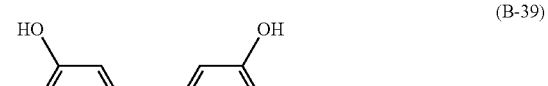
(B-40)
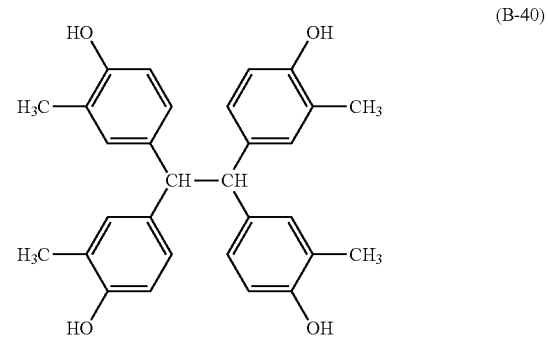
(B-41)
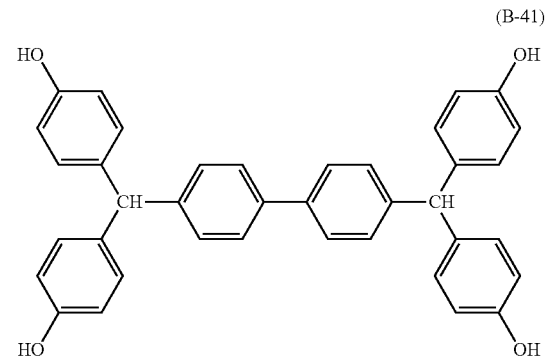
(B-42)
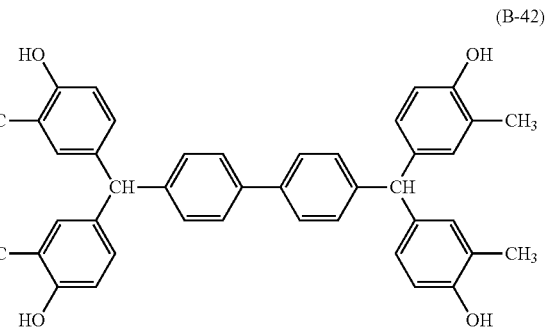
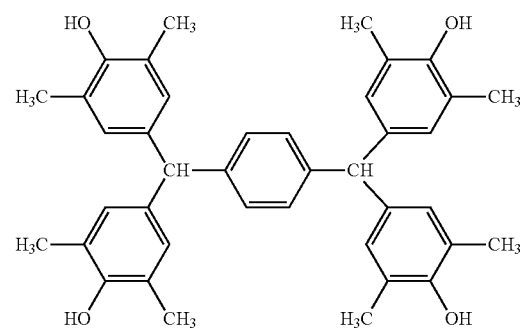

-continued

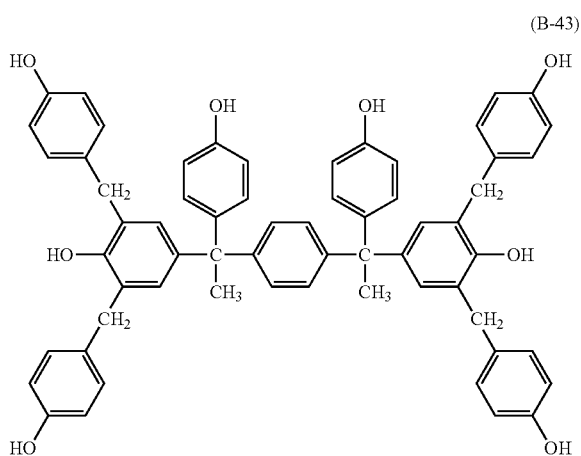
(B-43)

(B-44)

Among the low nuclear compounds (ballast molecules) shown above, (B-3), (B-29), (B-33), and (B-38) are preferable, and a compound obtained by substituting a hydrogen atom of a phenolic hydroxy group of these ballast molecules with a 1,2-naphthoquinone diazide sulfonyl group is preferably used for the component (B) in the inventive positive photosensitive resin composition.

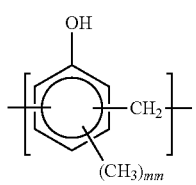
(43)

In the formula, mm represents an integer of 0 to 3.

The novolac resin having the repeating unit shown by the formula (43) can be synthesized by condensation of a phenol shown by the following formula (44), specifically, at least one phenol compound selected from o-cresol, m-cresol, p-cresol, and 3,5-xylenol, with an aldehyde according to a usual method.

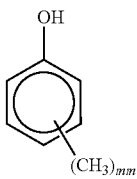
(44)

In the formula, mm represents an integer of 0 to 3.

Examples of the aldehyde used in this reaction include formaldehyde, paraformaldehyde, acetaldehyde, and benzaldehyde, and formaldehyde is preferable.

The mole ratio of the aldehyde to the phenol shown by the formula (44) preferably ranges from 0.2 to 2, more preferably from 0.3 to 2.

A preferable method for introducing a 1,2-naphthoquinone diazide sulfonyl group into the parent compound is dehydrochlorination condensation reaction of 1,2-naphthoquinone diazide sulfonyl chloride with phenolic hydroxy groups in the presence of a base catalyst. In the case that the ballast molecule shown by the formula (38'), trihydroxy benzophenone, or tetrahydroxy benzophenone is used, a hydrogen atom of its phenolic hydroxy group is preferably substituted with a 1,2-naphthoquinone diazide sulfonyl group in a proportion of 10 to 100 mol %, more preferably 50 to 100 mol %. In the case that the novolac resin shown by the formula (40) is used, a hydrogen atom of its phenolic hydroxy group is preferably substituted with 1,2-naphthoquinone diazide sulfonyl group in a proportion of 2 to 50 mol %, more preferably 3 to 27 mol %.

The adding amount of the component (B) is preferably 1 to 50 parts by mass, more preferably 10 to 40 parts by mass, with respect to 100 parts by bass of the component (A). The component (B) to be used may be one kind or a combination of two or more kinds.

When such component (B) is blended, the solubility in an aqueous alkaline solution before exposure is decreased due to the effect of dissolution inhibition by the component (B), and thus the system becomes alkali-insoluble. On the other hand, once exposure is carried out, the photosensitive agent of the component (B) generates an acid by light and increases the dissolution rate in an aqueous alkaline solution, and thus the system becomes alkali-soluble. That is, when an aqueous alkaline solution is used as a developer, an exposed part dissolves in the developer, while an unexposed part does not dissolve therein. This allows a positive pattern to be formed.

The component (C) in the inventive positive photosensitive resin composition is one or more crosslinking agents selected from an amino condensate modified with formaldehyde or formaldehyde-alcohol, a phenol compound having on average two or more methylol groups or alkoxymethyl groups per molecule, a polyhydric phenol compound in which a hydrogen atom of a phenolic hydroxy group is substituted with a glycidyl group, a polyhydric phenol compound in which a hydrogen atom of a phenolic hydroxy group is substituted with a group shown by the following formula (C-1), and a compound containing two or more nitrogen atoms bonded to a glycidyl group as shown by the following formula (C-2).

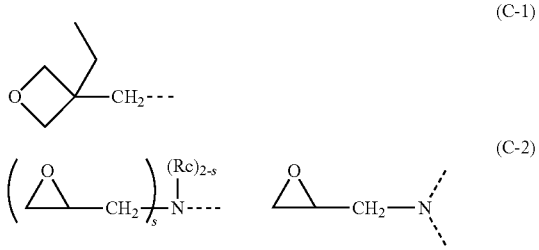

In the formulae, the dotted line represents a bond; Rc represents a linear, branched or cyclic alkyl group having 1 to 6 carbon atoms; and "s" represents 1 or 2.

The amino condensate modified with formaldehyde or formaldehyde-alcohol may be mentioned, for example, hexamethoxymethylmelamine, a melamine condensate modified with formaldehyde or formaldehyde-alcohol, or a urea condensate modified with formaldehyde or formaldehyde-alcohol.

Preparation of the melamine condensate modified with formaldehyde or formaldehyde-alcohol may be carried out, for example, by firstly according to the conventionally known method, modifying the melamine monomer with formalin to methylolation, or further modifying it with an alcohol to alkoxylation to make a modified melamine represented by the following general formula (45). The alcohol is preferably a lower alcohol, for example, an alcohol having 1 to 4 carbon atoms.

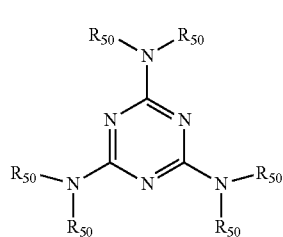

In the formula, $R_{50}$s may be the same or different from each other, and represent a methylol group, an alkoxymethyl group containing an alkoxy group having 1 to 4 carbon atoms, or a hydrogen atom, and at least one of which is a methylol group or the alkoxymethyl group.

The $R_{50}$ may be mentioned, for example, an alkoxymethyl group such as a methoxymethyl group, an ethoxymethyl group, a methylol group, and a hydrogen atom.

The modified melamine represented by the general formula (45) may be more specifically mentioned trimethoxymethylmonomethylol melamine, dimethoxymethylmonomethylol melamine, trimethylol melamine, hexamethylol melamine, hexamethoxymethylol melamine, and the like. Then, the modified melamine represented by the general formula (45) or its multimer (for example, an oligomer such as a dimer or a trimer) is subjected to addition condensation polymerization with formaldehyde until the product has a desired molecular weight according to the conventional method to obtain a melamine condensate modified with formaldehyde or formaldehyde-alcohol.

Preparation of the urea condensate modified with formaldehyde or formaldehyde-alcohol may be carried out, for example, according to the conventionally known method, by modifying the urea condensate having a desired molecular weight with formaldehyde to methylolation, or further modifying it with an alcohol to alkoxylation.

Specific examples of the urea condensate modified with formaldehyde or formaldehyde-alcohol may be mentioned, for example, a methoxymethylated urea condensate, an ethoxymethylated urea condensate, a propoxymethylated urea condensate, and the like.

These modified melamine condensates and modified urea condensates may be used one kind or in combination of two or more kinds in admixture.

Then, the phenol compound having two or more methylol groups or alkoxymethyl groups in one molecule in average may be mentioned, for example, (2-hydroxy-5-methyl)-1,3-benzenedimethanol, 2,2',6,6'-tetramethoxymethylbisphenol A, compounds represented by the following formulae (C-3) to (C-7), and the like.

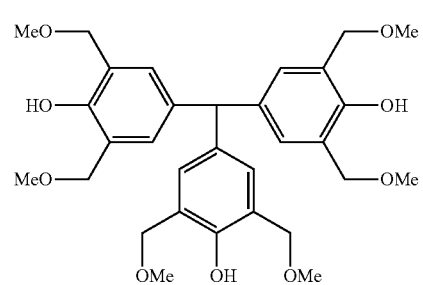

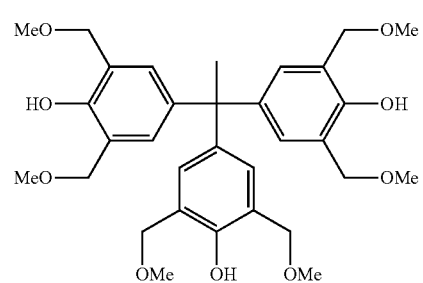

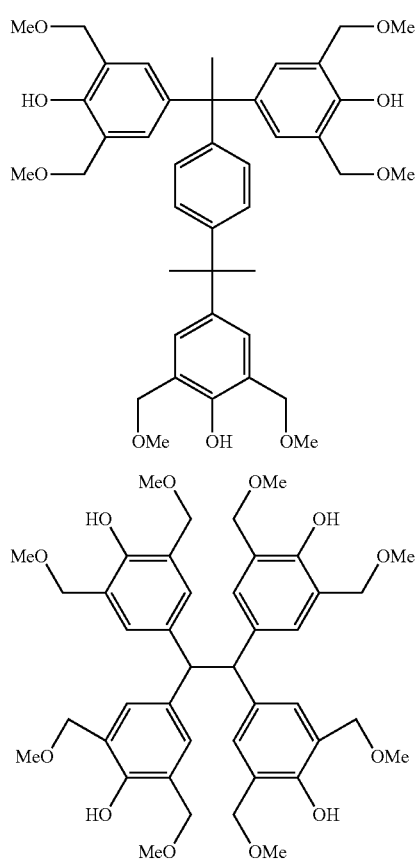

C-5

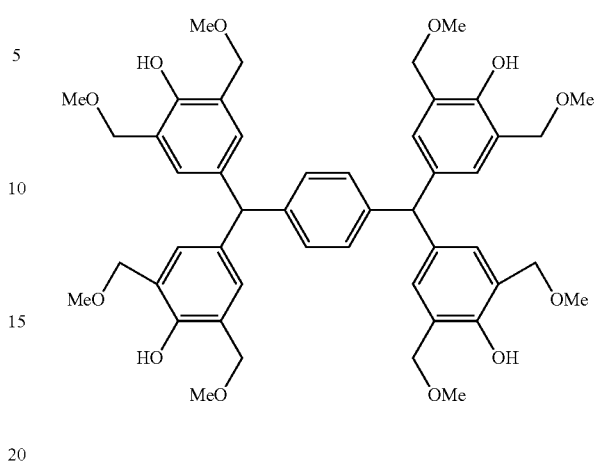

C-7

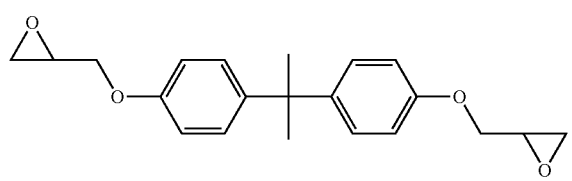

C-6

The crosslinking agents may be used one kind or in combination of two or more kinds.

The compound in which a hydrogen atom of a hydroxy group of a polyhydric phenol is substituted by a glycidyl group may be mentioned a compound obtained by reaction of the hydroxy group of bisphenol A, tris(4-hydroxyphenyl) methane, and 1,1,1-tris(4-hydroxyphenyl)ethane with epichlorohydrin in the presence of a base. Suitable examples of the compound in which a hydrogen atom of a hydroxy group of a polyhydric phenol is substituted by a glycidyl group may be mentioned the compounds represented by the following formulae (C-8) to (C-14).

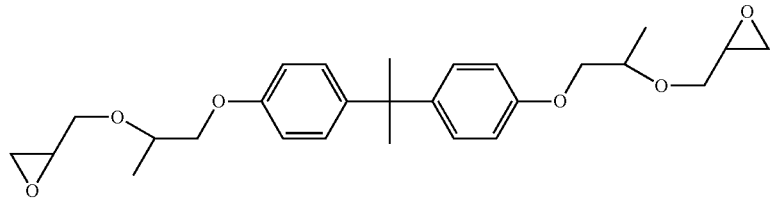

C-8

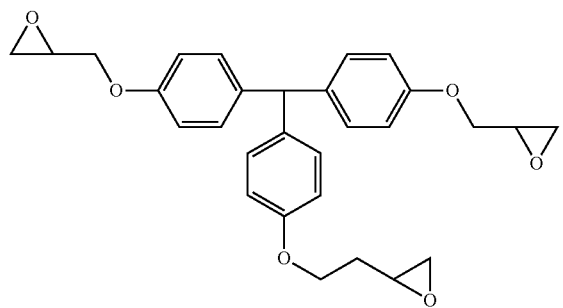

C-9

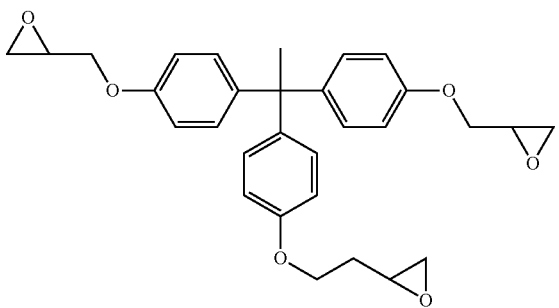

C-10

C-11

-continued

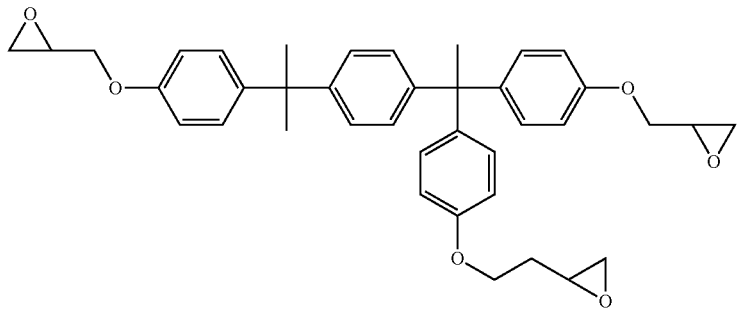
C-12

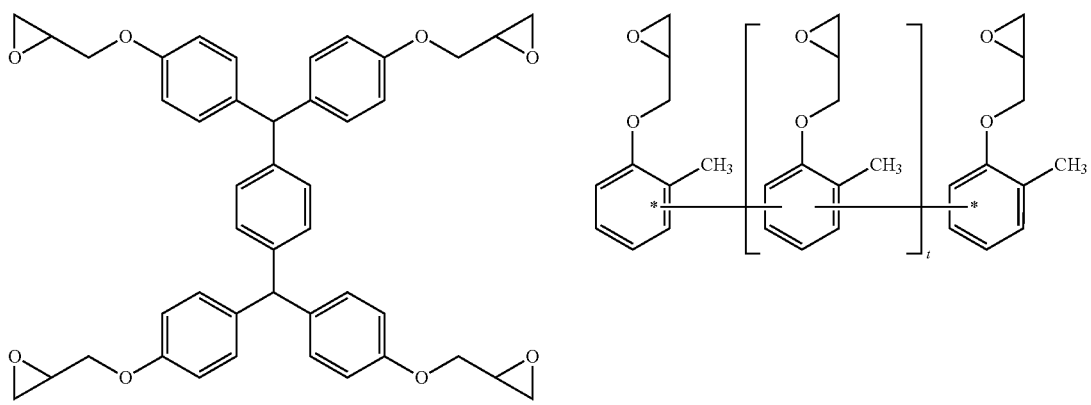
C-13

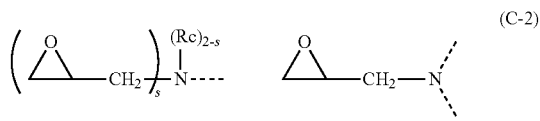
C-14

In the formula, "t" is 2≤t≤3.

One kind or two kinds of these compounds in which a hydroxy group of a polyhydric phenol is substituted by a glycidoxy group may be used as a crosslinking agent.

The compound in which a hydrogen atom of a hydroxy group of a polyhydric phenol is substituted by a substituent represented by the following formula (C-1) may be mentioned a compound having two or more of the substituents and represented by the following formula (C-15):

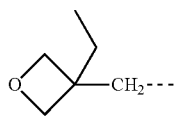
(C-1)

wherein, the dotted line represents a bond;

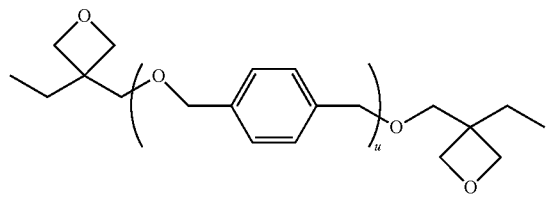
(C-15)

wherein, 1≤u≤3.

Additionally, the compound having two or more nitrogen atoms having a glycidyl group represented by the following formula (C-2) may be mentioned a compound represented by the following formula (C-16):

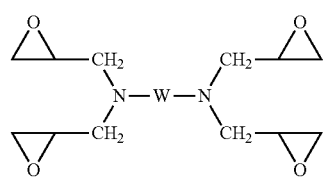
(C-2)

wherein, the dotted line represents a bond; Rc represents a linear, branched or cyclic alkyl group having 1 to 6 carbon atoms; and "s" represents 1 or 2;

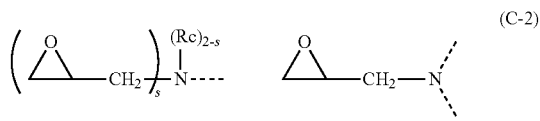
(C-16)

wherein, W represents a linear, branched, or cyclic alkylene group having 2 to 12 carbon atoms, or a divalent aromatic group.

Examples of the compound represented by the formula (C-16) may be mentioned, for example, compounds represented by the following formulae (C-17) to (C-20).

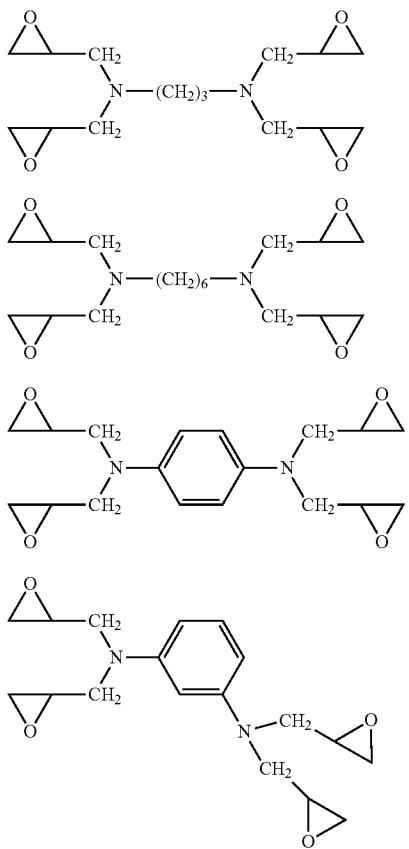

Also, the compound having two or more nitrogen atoms each of which has a glycidyl group(s) and represented by the formula (C-2) may be suitably used a compound represented by the following formula (C-21).

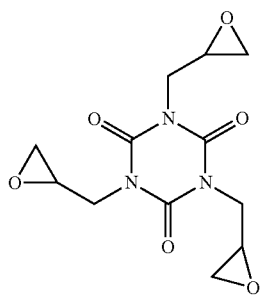

These compounds having two or more nitrogen atoms having a glycidyl group represented by the formula (C-2) may be used a single kind or two kinds thereof as a crosslinking agent(s).

The component (C) is a component that causes a crosslinking reaction upon post-curing after patterning the positive type photosensitive resin composition using the inventive polymer, and further increases the strength of the cured product. A weight average molecular weight of such a component (C) is preferably 150 to 10,000, particularly preferably 200 to 3,000 from the viewpoints of curability and heat resistance.

The component (D) in the positive photosensitive resin composition is a solvent. The solvent of the component (D) may be any solvent to dissolve the component (A) and the component (B). Illustrative examples of the solvent include ketones such as cyclohexanone, cyclopentanone, and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone. These solvents may be used one or more kinds. In particular, ethyl lactate, cyclohexanone, cyclopentanone, propylene glycol monomethyl ether acetate, and γ-butyrolactone, or a mixture thereof are preferred.

The formulation amount of the component (D) is preferably 50 to 2,000 parts by mass, more preferably 100 to 1,000 parts by mass, based on 100 parts by mass of the total amount of the component (A) and the component (B).

The inventive positive photosensitive resin composition may further contain (E) a compound capable of generating an acid or a radical by heat. The component (E), a compound capable of generating an acid or a radical by heat, can be blended in order to promote the thermal crosslinking reaction with the component (A) in the step of baking and post-curing a film at 100 to 300° C. after patterning.

In particular, the component (E) is preferably a compound that does not promote curing of a film and not prevent pattern formation until a pattern is formed by development. To this end, the component (E) preferably does not generate an acid or a radical at temperature in the step of removing and drying the solvent after applying the photosensitive resin composition, but generates an acid or a radical only by heat treatment after patterning, thereby promoting curing of the film or the pattern of the positive photosensitive resin composition. More specifically, the component (E) is preferably a compound that is decomposed by heat treatment at 100° C. to 300° C., preferably 150° C. to 300° C. and thereby generates an acid or a radical. By containing such component (E), crosslinking and curing reaction of the pattern or the film of the positive photosensitive resin composition can be further promoted in the step of baking and post-curing at 100 to 300° C. after patterning. Thus, the component (E) can further promote the crosslinking and curing reaction, thereby improving properties such as mechanical strength, chemical resistance, and adhesiveness of the obtained pattern or the film.

Preferable examples of the compound capable of generating an acid by heat include compounds described in paragraphs (0061) to (0085) of Japanese Patent Laid-Open Publication No. 2007-199653.

The formulation amount of the compound capable of generating an acid by heat is preferably 0.1 part by mass or more, more preferably 0.5 part by mass or more and preferably 30 parts by mass or less, more preferably 10 parts by mass or less, with respect to 100 parts by mass of the component (A) in the inventive positive photosensitive resin composition.

Preferable examples of the compound capable of generating a radical by heat include organic peroxides such as diisopropylbenzene hydroperoxide, 1,1,3,3-tetramethylbutyl hydroperoxide, cumene hydroperoxide, t-butyl hydroperoxide, and t-butyltrimethylsilyl peroxide; and radical initiators consisting of only carbon and hydrogen such as 2,3-dimethyl-2,3-diphenylbutane. Among them, radical initiators consisting of only carbon and hydrogen are preferable because they have high activation energy and are difficult to decompose by heat for drying.

The formulation amount of the compound capable of generating a radical by heat is preferably 0.5 to 4 parts by mass, more preferably 1 to 3 parts by mass, with respect to 100 parts by mass of the component (A) in the inventive positive photosensitive resin composition.

The inventive positive photosensitive resin composition may further contain a component (F) other than the components (A), (B), (C), (D), and (E). Examples of the component (F) includes an adhesion assistant and a surfactant. As the surfactant, the following compounds can be suitably used.

The surfactant is preferably nonionic. Examples thereof include fluorinated surfactants, specifically, perfluoroalkyl polyoxyethylene ethanol, fluorinated alkyl ester, perfluoroalkylamine oxide, and a fluorine-containing organosiloxane compound.

As these surfactants, commercially available products can be used, and illustrative examples thereof include Flolade "FC-4430" (available from Sumitomo 3M Ltd.), Surflon "S-141" and "S-145" (both are available from Asahi Glass Co., Ltd.), Unidyne "DS-401", "DS-4031", and "DS-451" (all are available from Daikin Industries, Ltd.), Megafac "F-8151" (available from DIC Co.), and "X-70-093" (available from Shin-Etsu Chemical Co., Ltd.). Among them, Flolade "FC-4430" (available from Sumitomo 3M Ltd.) and "X-70-093" (available from Shin-Etsu Chemical Co., Ltd.) are preferable.

(Patterning Process)

Then, the patterning processes using the inventive positive photosensitive resin composition will be described.

In case of using the inventive positive photosensitive resin composition, a pattern can be formed by the method including the steps of (1) applying the inventive positive photosensitive resin composition onto a substrate to form a photosensitive material film; (2) exposing the photosensitive material film to a high energy beam having a wavelength of 190 to 500 nm or an electron beam via a photomask after a heat treatment; and (3) performing development with a developer of an aqueous alkaline solution. Concretely, a well-known lithography technology can be applied. For example, the photosensitive resin composition may be applied by a spin coating method on a silicon wafer, a $SiO_2$ substrate, a SiN substrate, or a substrate having a formed pattern such as copper wiring, and pre-baked at about 80 to 130° C. for 50 to 600 seconds to form a photosensitive material film with a thickness of 1 to 50 μm, preferably 1 to 30 μm, more preferably 5 to 20 μm.

The spin coating method may be to dispense about 5 mL of the photosensitive resin composition on a silicon substrate and then rotate the substrate, thereby applying the photosensitive resin composition on the substrate. By adjusting the rotational speed during this operation, the thickness of the photosensitive material film on the substrate can be easily controlled.

Then, a mask for forming an intended pattern is put over the photosensitive material film, and the film is irradiated with a high energy beam having a wavelength of 190 to 500 nm such as i-line beam and g-line beam or an electron beam with an exposure dose of about 1 to 5,000 $mJ/cm^2$, preferably about 100 to 2,000 $mJ/cm^2$.

Then, development is performed. The inventive positive photosensitive resin composition is available for development with aqueous alkaline solution.

Examples of the aqueous alkaline solvent that can be favorably used for alkali development include 2.38% aqueous tetramethylammonium hydroxide (TMAH) solution. The development can be performed by a usual method such as spraying, puddling, or soaking in a developer. Then, if necessary, washing, rinsing, drying, and so forth may be performed to obtain a resist film having an intended pattern.

Moreover, the film having a pattern obtained by the patterning process may be baked and post-cured with an oven or a hot plate at 100 to 300° C., preferably 150 to 300° C., more preferably 180 to 250° C. to form a cured film. In this post-curing step, the post-curing temperature of 100 to 300° C. allows the film of the photosensitive resin composition to increase the crosslinking density and to remove remaining volatile components. Thus, this temperature range is preferable in view of adhesiveness to a substrate, heat resistance, strength, and electronic characteristics. The time for the post-curing can be 10 minutes to 10 hours.

(Formation of a Dry Film and Patterning Process)

With the positive photosensitive resin composition using the polymer of the present invention, it is possible to produce a photosensitive dry film having a supporting film, a protective film, and a photosensitive resin layer having a thickness of 5 to 100 μm and sandwiched between the supporting film and the protective film by the following process:

(i) continuously applying the positive photosensitive resin composition using the polymer of the present invention onto a supporting film to form a photosensitive resin layer;

(ii) continuously drying the photosensitive resin layer; and further (iii) laminating a protective film onto the photosensitive resin layer.

The above dry film cam be used for patterning through the steps of:

(i) separating the protective film from the photosensitive dry film described above and bringing the photosensitive resin layer thereby uncovered into close contact with a substrate;

(ii) exposing the photosensitive resin layer to a high energy beam having a wavelength of 190 to 500 nm or an electron beam via a photomask either through the supporting film or after removing the supporting film; and (iii) performing development with a developer.

Additionally, it is also possible to obtain a cured film that is improved in adhesiveness to a substrate, heat resistance, strength, and electric characteristics through the step of (iv) post-curing a patterned film formed by the development of the photosensitive material film at a temperature of 100 to 300° C. in the same manner as in the above.

(Protective Film for Covering Wiring, Circuit, and Substrate)

The formed pattern can be used for a protective film coating a wiring, a circuit, and a substrate, etc. Such formed pattern and a protective film have excellent insulating property and excellent adhesiveness to a metal layer of, for example, Cu of a wiring and a circuit to be coated, a metal electrode on a substrate, and an insulating substrate such as SiN substrate with a wiring and a circuit to be coated, and can significantly improve resolution performance for forming a fine pattern with an appropriate mechanical strength as a protective film.

The cured film thus obtained has excellent adhesiveness to a substrate, heat resistance, electric characteristics, mechanical strength, and chemical resistance to an alkaline removing liquid. A semiconductor device using this cured film as a protective film has excellent reliability, and especially, generation of cracks during a thermal cycle test can be prevented. Therefore, this cured film is useful for a protective film to protect electric and electronic parts, semiconductor devices, etc.

The above protective film is useful for an insulator film for a semiconductor device including rewiring use, an insulator film for a multilayer printed substrate, a solder mask, and a cover lay film, because of its heat resistance, chemical resistance, and insulating property.

EXAMPLES

Hereinafter, the present invention will be specifically described using Synthesis Examples, Comparative Synthesis Examples, Examples, and Comparative Examples, but the present invention is not limited thereto.

I. Synthesis of Resins

Regarding the compounds used in the following Synthesis Examples, the chemical structures and names are shown below.

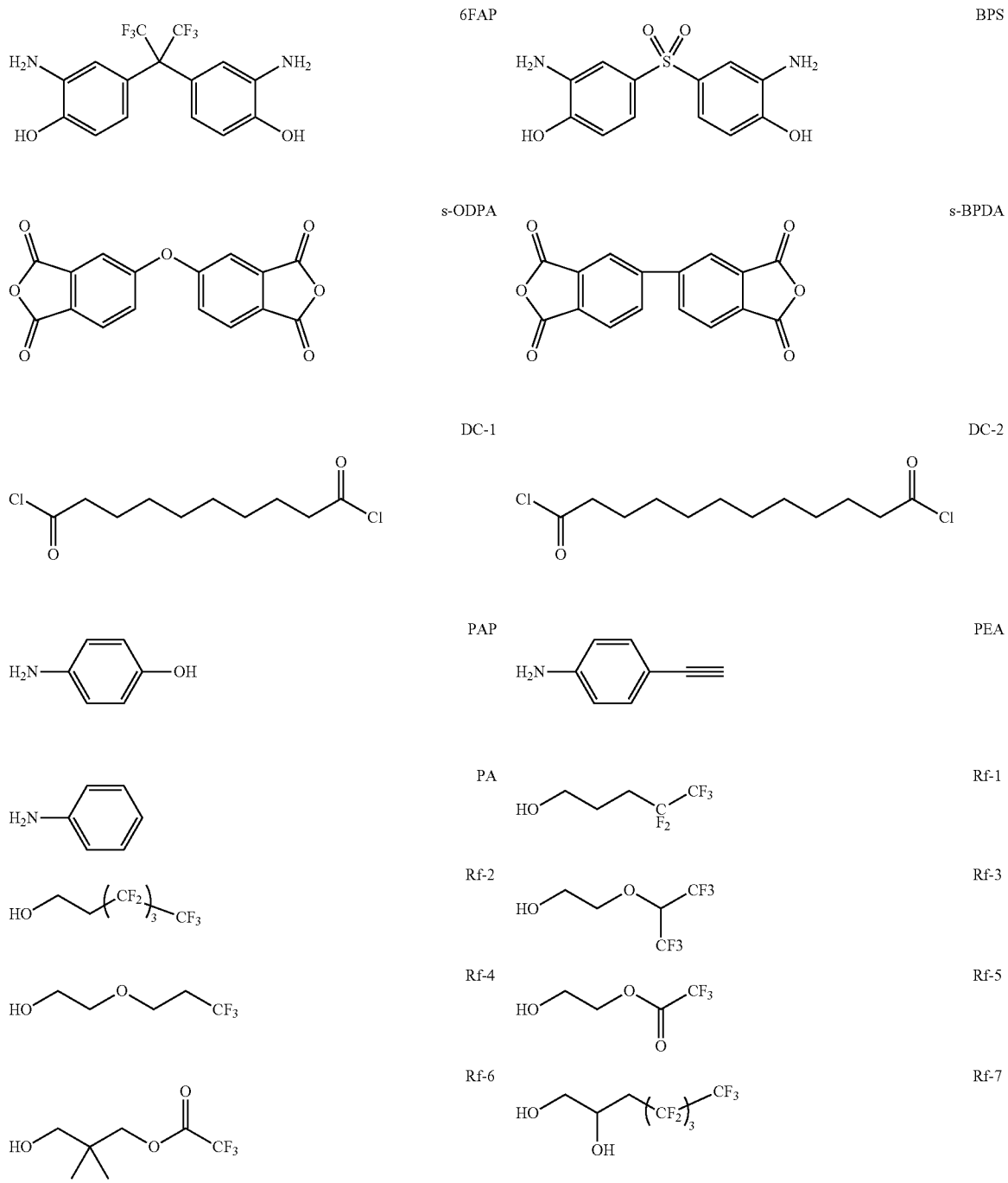

-continued
AN-1
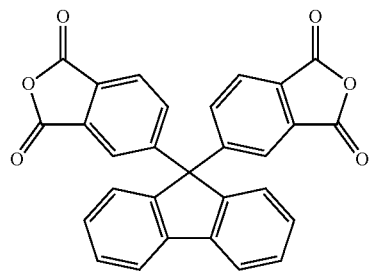
AN-2
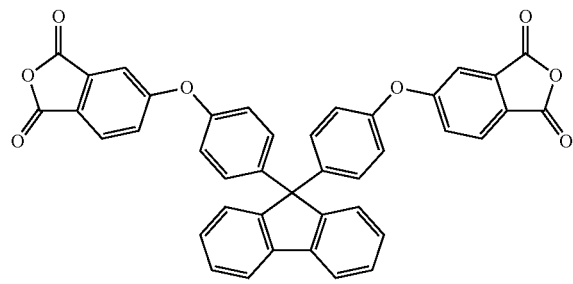
AN-3
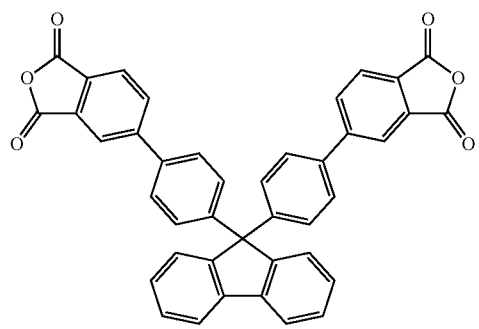
AN-4
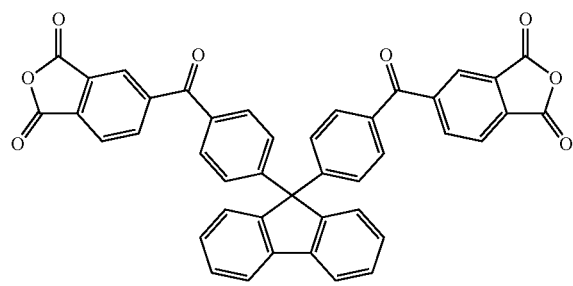
AN-5
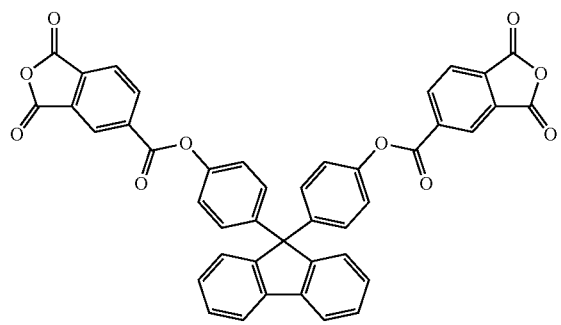
AN-6
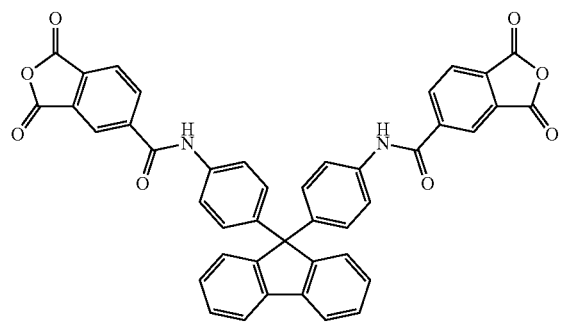
AN-7
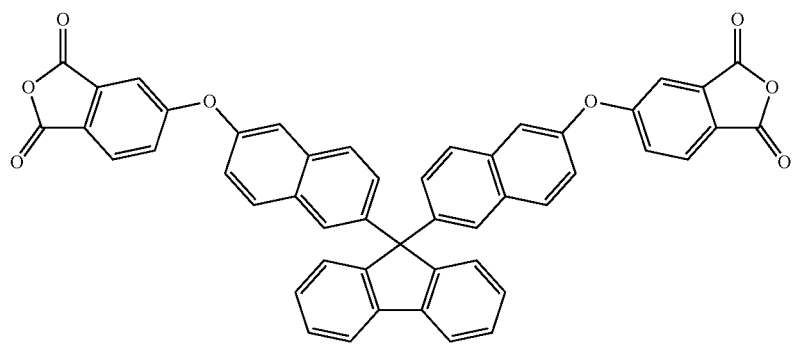
AN-8
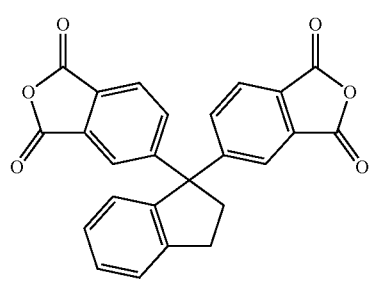
AN-9
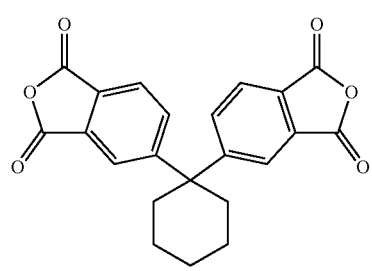

-continued
AN-10
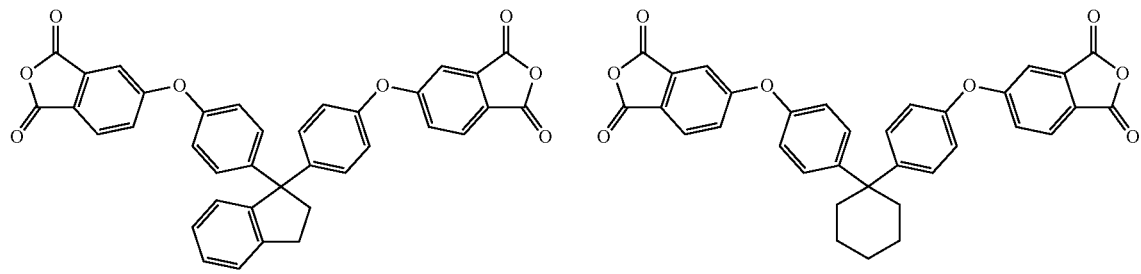
AN-11
AN-12
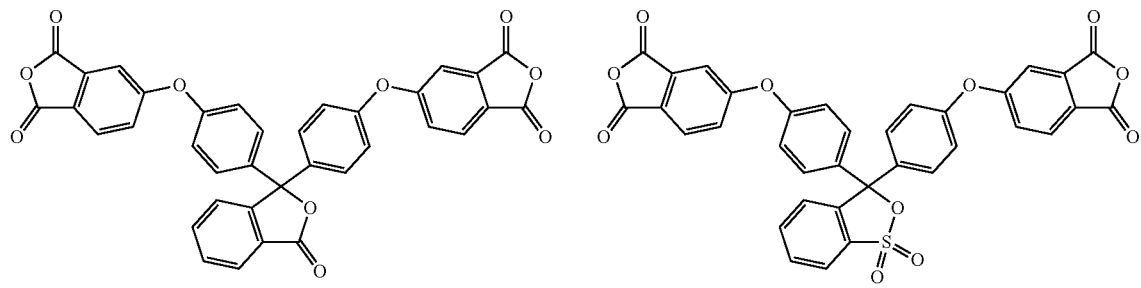
AN-13
AN-14
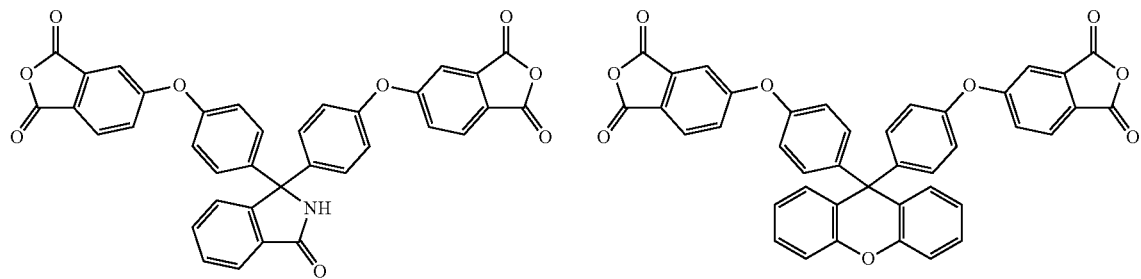
AN-15
AN-16
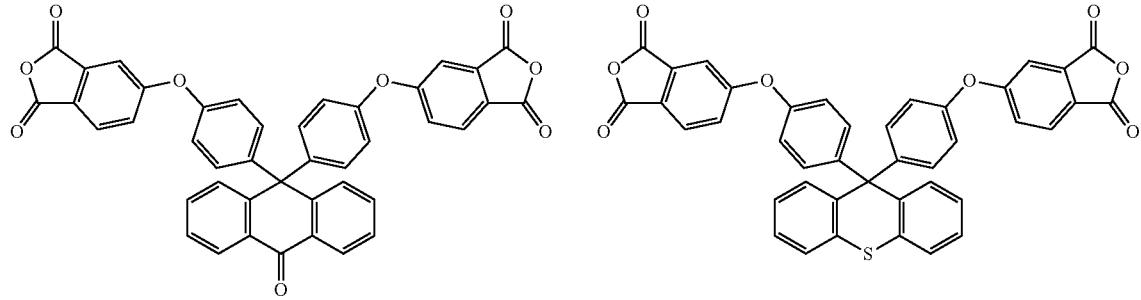
AN-17
CA-1
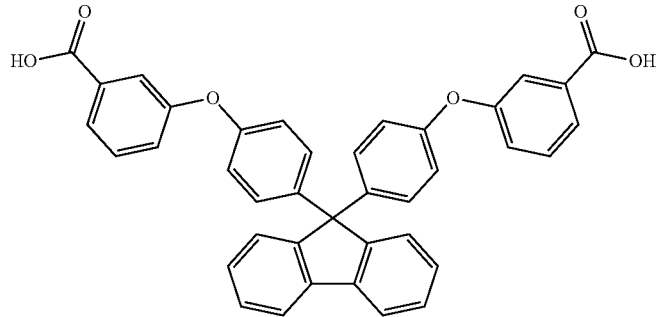

6FAP 2,2-bis(3-amino-4-hydroxyphenyl)hexafluoropropane
BPS bis(3-amino-4-hydroxyphenyl)sulfone
s-ODPA 3,3',4,4'-oxydiphthalic dianhydride
s-BPDA 3,3',4,4'-biphenyltetracarboxylic dianhydride
DC-1 sebacoyl dichloride
DC-2 dodecanedioly dichloride
PAP 4-aminophenol
PAE 4-ethylaniline
PA aniline
Rf-1 4,4,5,5,5-pentafluoropentanol
Rf-2 1H,1H,2H,2H-nonafluoro-1-hexanol
Rf-3 1-trifluoromethyl-2,2,2-trifluoroethyl-2'-hydroxyethyl ether
Rf-4 3,3,3-trifluoropropyl-2'-hydroxyethyl ether
Rf-5 hydroxyethyl trifluoroacetate
Rf-6 3-hydroxy-2,2-dimethylpropyl trifluoroacetate
Rf-7 4,4,5,5,6,6,7,7,7-nonafluoro-1,2-heptanediol

[Synthesis Example 1] Synthesis of Polyimide Resin (A-1)

Into a 1 L flask equipped with a stirrer and a thermometer, 30 g (81.9 mmol) of 2,2-bis(3-amino-4-hydroxyphenyl)hexafluoropropane (6FAP) was added, together with 170 g of N-methyl-2-pyrorridone, and dissolved by stirring at room temperature. To this, the solution of 12.7 g (41.0 mmol) of 3,3',4,4'-oxydiphthalic dianhydride (s-ODPA) and 18.8 g (41.0 mmol) of tetracarboxylic dianhydride (AN-1) dissolved into 320 g of N-methyl-2-pyrorridone was added dropwise at room temperature, and this was stirred at room temperature for 3 hours after finishing the dropping. To this reaction solution, 40 g of xylene was then added, and this was refluxed with heating at 170° C. for 3 hours while removing the generated water to outside the system. This reaction solution was cooled to room temperature, and then added dropwise to 2 L of ultrapure water with stirring to filtrate the precipitate. This was washed with water appropriately and dried under reduced pressure at 40° C. for 48 hours to give Polyimide resin (A-1). This polymer was measured for the molecular weight by GPC to reveal that the weight average molecular weight was 35,000 in terms of polystyrene.

[Synthesis Example 2] to [Synthesis Example 17] Synthesis of Polyimide Resins (A-2) to (A-17)

Polyimide resins (A-2) to (A-17) were obtained in the same manner as in Synthesis Example 1 except for using tetracarboxylic dianhydrides (AN-2) to (AN-17) in respective weight shown in the following Table 1 instead of 18.8 g of tetracarboxylic dianhydride (AN-1). Each polymer was measured for the molecular weight by GPC. Each weight average molecular weight is shown in the following Table 1 in terms of polystyrene.

[Synthesis Example 18] Synthesis of Polyimide Resin (A-18)

Polyimide resin (A-18) was obtained in the same manner as in Synthesis Example 1 except for using 23.0 g of bis(3-amino-4-hydroxyphenyl)sulfone (BPS) instead of 30 g of 2,2-bis(3-amino-4-hydroxyphenyl)hexafluoropropane (6FAP). This polymer was measured for the molecular weight by GPC to reveal that the weight average molecular weight was 33,000 in terms of polystyrene as shown in Table 1.

TABLE 1

| | | Diamine compound | | Tetracarboxylic dianhydride | | | | | | | |
|---|---|---|---|---|---|---|---|---|---|---|---|
| | | 6FAP | BPS | s-ODPA | AN-1 | AN-2 | AN-3 | AN-4 | AN-5 | AN-6 | AN-7 |
| Synthesis Example 1 | A-1 | 30.0 g (81.9 mmol) | | 12.7 g (41.0 mmol) | 18.8 g (41 mmol) | | | | | | |
| Synthesis Example 2 | A-2 | 30.0 g (81.9 mmol) | | 12.7 g (41.0 mmol) | | 26.3 g (41 mmol) | | | | | |
| Synthesis Example 3 | A-3 | 30.0 g (81.9 mmol) | | 12.7 g (41.0 mmol) | | | 25.0 g (41 mmol) | | | | |
| Synthesis Example 4 | A-4 | 30.0 g (81.9 mmol) | | 12.7 g (41.0 mmol) | | | | 27.3 g (41 mmol) | | | |
| Synthesis Example 5 | A-5 | 30.0 g (81.9 mmol) | | 12.7 g (41.0 mmol) | | | | | 28.6 g (41 mmol) | | |
| Synthesis Example 6 | A-6 | 30.0 g (81.9 mmol) | | 12.7 g (41.0 mmol) | | | | | | 28.6 g (41 mmol) | |
| Synthesis Example 7 | A-7 | 30.0 g (81.9 mmol) | | 12.7 g (41.0 mmol) | | | | | | | 30.5 g (41 mmol) |
| Synthesis Example 8 | A-8 | 30.0 g (81.9 mmol) | | 12.7 g (41.0 mmol) | | | | | | | |
| Synthesis Example 9 | A-9 | 30.0 g (81.9 mmol) | | 12.7 g (41.0 mmol) | | | | | | | |
| Synthesis Example 10 | A-10 | 30.0 g (81.9 mmol) | | 12.7 g (41.0 mmol) | | | | | | | |
| Synthesis Example 11 | A-11 | 30.0 g (81.9 mmol) | | 12.7 g (41.0 mmol) | | | | | | | |
| Synthesis Example 12 | A-12 | 30.0 g (81.9 mmol) | | 12.7 g (41.0 mmol) | | | | | | | |
| Synthesis Example 13 | A-13 | 30.0 g (81.9 mmol) | | 12.7 g (41.0 mmol) | | | | | | | |
| Synthesis Example 14 | A-14 | 30.0 g (81.9 mmol) | | 12.7 g (41.0 mmol) | | | | | | | |
| Synthesis Example 15 | A-15 | 30.0 g (81.9 mmol) | | 12.7 g (41.0 mmol) | | | | | | | |
| Synthesis Example 16 | A-16 | 30.0 g (81.9 mmol) | | 12.7 g (41.0 mmol) | | | | | | | |
| Synthesis Example 17 | A-17 | 30.0 g (81.9 mmol) | | 12.7 g (41.0 mmol) | | | | | | | |

TABLE 1-continued

| Synthesis Example 18 | A-18 | 23.0 g (81.9 mmol) | 12.7 g (41.0 mmol) | 18.8 g (41 mmol) |
|---|---|---|---|---|

| | | Tetracarboxylic dianhydride | | | | | | | | | Molecular weight |
|---|---|---|---|---|---|---|---|---|---|---|---|
| | | AN-8 | AN-9 | AN-10 | AN-11 | AN-12 | AN-13 | AN-14 | AN-15 | AN-16 | AN-17 | |
| Synthesis Example 1 | A-1 | | | | | | | | | | | 35,000 |
| Synthesis Example 2 | A-2 | | | | | | | | | | | 34,000 |
| Synthesis Example 3 | A-3 | | | | | | | | | | | 36,000 |
| Synthesis Example 4 | A-4 | | | | | | | | | | | 35,000 |
| Synthesis Example 5 | A-5 | | | | | | | | | | | 34,000 |
| Synthesis Example 6 | A-6 | | | | | | | | | | | 35,000 |
| Synthesis Example 7 | A-7 | | | | | | | | | | | 36,000 |
| Synthesis Example 8 | A-8 | 16.8 g (41 mmol) | | | | | | | | | | 37,000 |
| Synthesis Example 9 | A-9 | | 15.4 g (41 mmol) | | | | | | | | | 35,000 |
| Synthesis Example 10 | A-10 | | | 24.4 g (41 mmol) | | | | | | | | 38,000 |
| Synthesis Example 11 | A-11 | | | | 23.0 g (41 mmol) | | | | | | | 35,000 |
| Synthesis Example 12 | A-12 | | | | | 25.0 g (41 mmol) | | | | | | 36,000 |
| Synthesis Example 13 | A-13 | | | | | | 26.5 g (41 mmol) | | | | | 37,000 |
| Synthesis Example 14 | A-14 | | | | | | | 25.0 g (41 mmol) | | | | 38,000 |
| Synthesis Example 15 | A-15 | | | | | | | | 27.0 g (41 mmol) | | | 34,000 |
| Synthesis Example 16 | A-16 | | | | | | | | | 27.5 g (41 mmol) | | 33,000 |
| Synthesis Example 17 | A-17 | | | | | | | | | | 27.7 g (41 mmol) | 35,000 |
| Synthesis Example 18 | A-18 | | | | | | | | | | | 33,000 |

[Synthesis Example 19] Synthesis of Tetracarboxylic Acid Diester Dichloride (X-1)

Into a 3 L flask equipped with a stirrer and a thermometer, 100 g (322 mmol) of 3,3',4,4'-oxydiphthalic dianhydride (s-ODPA), 65.2 g (644 mmol) of triethylamine, 39.3 g (322 mmol) of N,N-dimethyl-4-aminopyridine, and 400 g of γ-butyrolactone were added and stirred at room temperature. To this, 114.7 g (644 mmol) of 4,4,5,5,5-pentafluoropentanol (Rf-1) was added dropwise and stirred at room temperature for additional 24 hours. Then, 370 g of 10% aqueous hydrochloric acid solution was added dropwise with ice-cooling to stop the reaction. To the reaction solution, 800 g of 4-methyl-2-pentanone was added to separate the organic layer. This was washed with 600 g of ultrapure water for 6 times, and the solvent was distilled out from the obtained organic layer to give 193 g of tetracarboxylic acid diester compound. The obtained tetracarboxylic acid diester compound was dissolved in 772 g of N-methyl-2-pyrorridone added thereto by stirring at room temperature. Then, 75.8 g (637 mmol) of thionyl chloride was added dropwise with ice-cooling so as to keep the temperature of the reaction solution to 10° C. or less. This was stirred with ice-cooling at 2 hours after finishing the dropping to give a solution of tetracarboxylic acid diester dichloride (X-1) in N-methyl-2-pyrorridone.

[Synthesis Example 20] Synthesis of Tetracarboxylic Acid Diester Dichloride (X-2)

The solution of Tetracarboxylic acid diester dichloride (X-2) in N-methyl-2-pyrorridone was obtained in the same manner as in Synthesis Example 19 except for using 94.8 g (322 mmol) of 3,3',4,4'-biphenyltetracarboxylic dianhydride (s-BPDA) instead of 3,3',4,4'-oxydiphthalic dianhydride (s-ODPA).

[Synthesis Example 21] Synthesis of Tetracarboxylic Acid Diester Dichloride (X-3)

The solution of Tetracarboxylic acid diester dichloride (X-3) in N-methyl-2-pyrorridone was obtained in the same manner as in Synthesis Example 19 except for using 170.1 g (644 mmol) of 1H,1H,2H,2H-nonafluoro-1-hexanol (Rf-2) instead of 4,4,5,5,5-pentafluoropentanol (Rf-1).

[Synthesis Example 22] Synthesis of Tetracarboxylic Acid Diester Dichloride (X-4)

The solution of Tetracarboxylic acid diester dichloride (X-4) in N-methyl-2-pyrorridone was obtained in the same manner as in Synthesis Example 19 except for using 136.6 g (644 mmol) of 1-trifluoromethyl-2,2,2-trifluoroethyl-2'-hydroxyethyl ether (Rf-3) instead of 4,4,5,5,5-pentafluoropentanol (Rf-1).

[Synthesis Example 23] Synthesis of Tetracarboxylic Acid Diester Dichloride (X-5)

The solution of Tetracarboxylic acid diester dichloride (X-5) in N-methyl-2-pyrorridone was obtained in the same manner as in Synthesis Example 19 except for using 112.2 g (644 mmol) of 3,3,3-trifluoropropyl-2'-hydroxyethyl ether (Rf-4) instead of 4,4,5,5,5-pentafluoropentanol (Rf-1).

[Synthesis Example 24] Synthesis of Tetracarboxylic Acid Diester Dichloride (X-6)

The solution of Tetracarboxylic acid diester dichloride (X-6) in N-methyl-2-pyrorridone was obtained in the same manner as in Synthesis Example 19 except for using 101.8 g (644 mmol) of 2-hydroxyethyl trifluoroacetate (Rf-5) instead of 4,4,5,5,5-pentafluoropentanol (Rf-1).

[Synthesis Example 25] Synthesis of Tetracarboxylic Acid Diester Dichloride (X-7)

The solution of Tetracarboxylic acid diester dichloride (X-7) in N-methyl-2-pyrorridone was obtained in the same manner as in Synthesis Example 19 except for using 101.8 g (644 mmol) of 3-hydroxy-2,2-dimethylpropyl trifluoroacetate (Rf-6) instead of 4,4,5,5,5-pentafluoropentanol (Rf-1).

[Synthesis Example 26] Synthesis of Tetracarboxylic Acid Diester Dichloride (X-8)

The solution of Tetracarboxylic acid diester dichloride (X-8) in N-methyl-2-pyrorridone was obtained in the same manner as in Synthesis Example 19 except for using 189.4 g (644 mmol) of 4,4,5,5,6,6,7,7,7-nonafluoro-1,2-heptanediol (Rf-7) instead of 4,4,5,5,5-pentafluoropentanol (Rf-1).

[Synthesis Example 27] Synthesis of Polyamide-Imide Resin (A-19)

Into a 500 ml flask equipped with a stirrer and a thermometer, 30 g (81.9 mmol) of 2,2-bis(3-amino-4-hydroxyphenyl)hexafluoropropane (6FAP) was added, together with 170 g of N-methyl-2-pyrorridone, and dissolved by stirring at room temperature. To this, the solution of 12.7 g (41.0 mmol) of 3,3',4,4'-oxydiphthalic dianhydride (s-ODPA) and 5.6 g (12.3 mmol) of tetracarboxylic dianhydride (AN-1) dissolved into 185 g of N-methyl-2-pyrorridone was added dropwise at room temperature, and this was stirred at room temperature for 3 hours after finishing the dropping. To this reaction solution, 40 g of xylene was then added, and this was refluxed with heating at 170° C. for 3 hours while removing the generated water to outside the system. After this was cooled to room temperature, 1.4 g (18.0 mmol) of pyridine was added thereto, and the mixture solution of 14.7 g of the solution of tetracarboxylic acid diester dichloride (X-1) in N-methyl-2-pyrorridone (4.1 mmol as a tetracarboxylic acid diester dichloride) and 5.9 g (24.6 mmol) of sebacoyl dichloride (DC-1) prepared separately was added dropwise so as to keep the temperature to 5° C. or less. After finishing the dropping, this reaction solution was warmed to room temperature, and then added dropwise to 2 L of ultrapure water with stirring to filtrate the precipitate. This was washed with water appropriately and dried under reduced pressure at 40° C. for 48 hours to give Polyamide-imide resin (A-19). This polymer was measured for the molecular weight by GPC to reveal that the weight average molecular weight was 38,000 in terms of polystyrene.

[Synthesis Example 28] to [Synthesis Example 34]

Synthesis of Polyamide-Imide Resins (A-20) to (A-26)
Polyamide-imide resins (A-20) to (A-26) were obtained in the same manner as in Synthesis Example 27 except for using the solutions of tetracarboxylic diester dichlorides (X-2) to (X-8) in N-methyl-2-pyrorridone in respective weight shown in the column of Synthesis Example 28 to Synthesis Example 34 of the following Table 2 instead of the solution of tetracarboxylic diester dichloride (X-1) in N-methyl-2-pyrorridone. Each polymer was measured for the molecular weight by GPC. Each weight average molecular weight is shown in the following Table 2 in terms of polystyrene.

[Synthesis Example 35] Synthesis of Polyamide-Imide Resin (A-27)

Polyamide-imide resin (A-27) was obtained in the same manner as in Synthesis Example 27 except for using 7.9 g of tetracarboxylic dianhydride (AN-2) instead of 5.6 g of tetracarboxylic dianhydride (AN-1). This polymer was measured for the molecular weight by GPC to reveal that the weight average molecular weight was 39,000 in terms of polystyrene as shown in Table 2.

[Synthesis Example 36] Synthesis of Polyimide Resin (A-28)

Polyimide resin (A-28) was obtained in the same manner as in Synthesis Example 27 except for using 6.9 g of dodecanedioyl dichloride (DC-2) instead of 5.9 g of sebacoyl dichloride (DC-1). This polymer was measured for the molecular weight by GPC to reveal that the weight average molecular weight was 39,000 in terms of polystyrene as shown in Table 2.

[Synthesis Example 37] Synthesis of Polyimide Resin (A-29)

Polyimide resin (A-29) was obtained in the same manner as in Synthesis Example 27 except for using 23.0 g of bis(3-amino-4-hydroxyphenyl)sulfone (BPS) instead of 30 g of 2,2-bis(3-amino-4-hydroxyphenyl)hexafluoropropane (6FAP). This polymer was measured for the molecular weight by GPC to reveal that the weight average molecular weight was 35,000 in terms of polystyrene as shown in Table 2.

[Synthesis Example 38] Synthesis of Polyamide-Imide Resin (A-30)

Into a 500 ml flask equipped with a stirrer and a thermometer, 27.0 g (73.7 mmol) of 2,2-bis(3-amino-4-hydroxyphenyl)hexafluoropropane (6FAP) was added, together with 108 g of N-methyl-2-pyrorridone, and dissolved by stirring at room temperature. To this, the solution of 12.7 g (41.0 mmol) of 3,3',4,4'-oxydiphthalic dianhydride (s-ODPA) and 5.6 g (12.3 mmol) of tetracarboxylic dianhydride (AN-1) dissolved into 185 g of N-methyl-2-pyrorridone was added dropwise at room temperature, and this was stirred at room temperature for 3 hours after finishing the dropping. To this reaction solution, 40 g of xylene was then added, and this was refluxed with heating at 170° C. for 3 hours while removing the generated water to outside the system. After this was cooled to room temperature, 0.9 g (8.2 mmol) of 4-aminophenol (PAP) and 1.4 g (18.0 mmol) of pyridine was added thereto, and the mixture solution of 14.7 g of the solution of tetracarboxylic acid diester dichloride (X-1) in N-methyl-2-pyrrolidone (4.1 mmol as a tetracarboxylic acid diester dichloride) and 5.9 g (24.6 mmol) of sebacoyl dichloride (DC-1) prepared separately was added dropwise so as to keep the temperature to 5° C. or less. After finishing the dropping, this reaction solution was warmed to room temperature, and then added dropwise to 2 L of ultrapure water with stirring to filtrate the precipitate. This was washed with water appropriately and dried under reduced pressure at 40° C. for 48 hours to give Polyamide-imide resin (A-30). This polymer was measured for the molecular weight by GPC to reveal that the weight average molecular weight was 30,000 in terms of polystyrene as shown in Table 2.

[Synthesis Example 39] Synthesis of Polyamide-Imide Resin (A-31)

Polyamide-imide resin (A-31) was obtained in the same manner as in Synthesis Example 38 except for using 1.0 g of 4-ethynylaniline (PAE) instead of 0.9 g of 4-aminophenol (PAP). This polymer was measured for the molecular weight by GPC to reveal that the weight average molecular weight was 29,000 in terms of polystyrene as shown in Table 2.

[Synthesis Example 40] Synthesis of Polyamide-Imide Resin (A-32)

Polyamide-imide resin (A-32) was obtained in the same manner as in Synthesis Example 38 except for using 0.8 g of aniline (PA) instead of 0.9 g of 4-aminophenol (PAP). This polymer was measured for the molecular weight by GPC to reveal that the weight average molecular weight was 28,000 in terms of polystyrene as shown in Table 2.

[Synthesis Example 41] Synthesis of Polyamide-Imide Resin (A-33)

Polyamide-imide resin (A-33) was obtained in the same manner as in Synthesis Example 27 except for using the dicarboxylic acid solution prepared separately after Synthesis Example 19 using 14.5 g of dicarboxylic acid (CA-1) instead of 5.9 g of sebacoyl dichloride (DC-1). This polymer was measured for the molecular weight by GPC to reveal that the weight average molecular weight was 37,000 in terms of polystyrene as shown in Table 2.

[Comparative Synthesis Example 1] Synthesis of Polyamide-Imide Resin (B-1)

Into a 500 ml flask equipped with a stirrer and a thermometer, 30 g (81.9 mmol) of 2,2-bis(3-amino-4-hydroxyphenyl)hexafluoropropane (6FAP) was added, together with 170 g of N-methyl-2-pyrrolidone, and dissolved by stirring at room temperature. To this, the solution of 12.7 g (41.0 mmol) of 3,3',4,4'-oxydiphthalic dianhydride (s-ODPA) dissolved into 128 g of N-methyl-2-pyrrolidone was added dropwise at room temperature, and this was stirred at room temperature for 3 hours after finishing the dropping. To this reaction solution, 40 g of xylene was then added, and this was refluxed with heating at 170° C. for 3 hours while removing the generated water to outside the system. After this was cooled to room temperature, the solution of 9.8 g (41.0 mmol) of sebacoyl dichloride (DC-1) was added dropwise so as to keep the temperature to 5° C. or less. After finishing the dropping, this reaction solution was warmed to room temperature, and then added dropwise to 2 L of ultrapure water with stirring to filtrate the precipitate. This was washed with water appropriately and dried under reduced pressure at 40° C. for 48 hours to give Polyamide-imide resin (B-1). This polymer was measured for the molecular weight by GPC to reveal that the weight average molecular weight was 34,000 in terms of polystyrene.

[Comparative Synthesis Example 2] Synthesis of Polyamide-Imide Resin (B-2)

Polyamide-imide resin (B-2) was obtained in the same manner as in Comparative Synthesis Example 1 except for using 23.0 g of bis(3-amino-4-hydroxyphenyl)sulfone (BPS) instead of 30 g of 2,2-bis(3-amino-4-hydroxyphenyl) hexafluoropropane (6FAP). This polymer was measured for the molecular weight by GPC to reveal that the weight average molecular weight was 33,000 in terms of polystyrene as shown in Table 2.

[Comparative Synthesis Example 3] Synthesis of Polyamide-Imide Resin (B-3)

Polyamide-imide resin (B-3) was obtained in the same manner as in Comparative Synthesis Example 1 except for using 12.1 g of 3,3',4,4'-biphenyltetracarboxylic dianhydride (s-BPDA) instead of 12.7 g of 3,3',4,4'-oxydiphthalic dianhydride (s-ODPA). This polymer was measured for the molecular weight by GPC to reveal that the weight average molecular weight was 35,000 in terms of polystyrene as shown in Table 2.

[Comparative Synthesis Example 4] Synthesis of Polyamide-Imide Resin (B-4)

Polyamide-imide resin (B-4) was obtained in the same manner as in Comparative Synthesis Example 1 except for using 23.0 g of bis(3-amino-4-hydroxyphenyl)sulfone (BPS) instead of 30 g of 2,2-bis(3-amino-4-hydroxyphenyl) hexafluoropropane (6FAP) and 12.1 g of 3,3',4,4'-biphenyltetracarboxylic dianhydride (s-BPDA) instead of 12.7 g of 3,3',4,4'-oxydiphthalic dianhydride (s-ODPA). This polymer was measured for the molecular weight by GPC to reveal that the weight average molecular weight was 34,000 in terms of polystyrene as shown in Table 2.

TABLE 2

|  |  | Diamine compound | | Monoamine compound | | | Tetracarboxylic dianhydride | |
|---|---|---|---|---|---|---|---|---|
|  |  | 6FAP | BPS | PAP | PEA | PA | s-ODPA | s-BPDA |
| Synthesis Example 27 | A-19 | 30.0 g (81.9 mmol) |  |  |  |  | 12.7 g (41.0 mmol) |  |
| Synthesis Example 28 | A-20 | 30.0 g (81.9 mmol) |  |  |  |  | 12.7 g (41.0 mmol) |  |
| Synthesis Example 29 | A-21 | 30.0 g (81.9 mmol) |  |  |  |  | 12.7 g (41.0 mmol) |  |

TABLE 2-continued

| | | Tetracarboxylic dianhydride | Dicarboxylic dichloride | Dicarboxylic acide | Solution of tetracarboxylic diester dichloride in NMP (molar number as tetracarboxylic dichloride) |
|---|---|---|---|---|---|
| Synthesis Example 30 | A-22 | 30.0 g (81.9 mmol) | | | 12.7 g (41.0 mmol) |
| Synthesis Example 31 | A-23 | 30.0 g (81.9 mmol) | | | 12.7 g (41.0 mmol) |
| Synthesis Example 32 | A-24 | 30.0 g (81.9 mmol) | | | 12.7 g (41.0 mmol) |
| Synthesis Example 33 | A-25 | 30.0 g (81.9 mmol) | | | 12.7 g (41.0 mmol) |
| Synthesis Example 34 | A-26 | 30.0 g (81.9 mmol) | | | 12.7 g (41.0 mmol) |
| Synthesis Example 35 | A-27 | 30.0 g (81.9 mmol) | | | 12.7 g (41.0 mmol) |
| Synthesis Example 36 | A-28 | 30.0 g (81.9 mmol) | | | 12.7 g (41.0 mmol) |
| Synthesis Example 37 | A-29 | | 23.0 g (81.9 mmol) | | 12.7 g (41.0 mmol) |
| Synthesis Example 38 | A-30 | 27.0 g (73.7 mmol) | 0.9 g (8.2 mmol) | | 12.7 g (41.0 mmol) |
| Synthesis Example 39 | A.31 | 27.0 g (73.7 mmol) | | 1.0 g (8.2 mmol) | 12.7 g (41.0 mmol) |
| Synthesis Example 40 | A-32 | 27.0 g (73.7 mmol) | | 0.8 g (8.2 mmol) | 12.7 g (41.0 mmol) |
| Synthesis Example 41 | A.33 | 30.0 g (81.9 mmol) | | | 12.7 g (41.0 mmol) |
| Comparative Synthesis Example 1 | B-1 | 30.0 g (81.9 mmol) | | | 12.7 g (41.0 mmol) |
| Comparative Synthesis Example 2 | B-2 | | 23.0 g (81.9 mmol) | | 12.7 g (41.0 mmol) |
| Comparative Synthesis Example 3 | B-3 | 30.0 g (81.9 mmol) | | | 12.1 g (41.0 mmol) |
| Comparative Synthesis Example 4 | B-4 | | 23.0 g (81.9 mmol) | | 12.1 g (41.0 mmol) |

| | | Tetracarboxylic dianhydride | | Dicarboxylic dichloride | | Dicarboxylic acide | Solution of tetracarboxylic diester dichloride in NMP (molar number as tetracarboxylic dichloride) | |
|---|---|---|---|---|---|---|---|---|
| | | | | | | | Synthesis Example 19 | Synthesis Example 20 |
| | | AN-1 | AN-2 | DC-1 | DC-2 | CA-1 | X-1 | X-2 |
| Synthesis Example 27 | A-19 | 5.6 g (12.3 mmol) | | 5.9 g (24.6 mmol) | | | 14.7 g (4.1 mmol) | |
| Synthesis Example 28 | A-20 | 5.6 g (12.3 mmol) | | 5.9 g (24.6 mmol) | | | | 14.4 g (4.1 mmol) |
| Synthesis Example 29 | A-21 | 5.6 g (12.3 mmol) | | 5.9 g (24.6 mmol) | | | | |
| Synthesis Example 30 | A-22 | 5.6 g (12.3 mmol) | | 5.9 g (24.6 mmol) | | | | |
| Synthesis Example 31 | A-23 | 5.6 g (12.3 mmol) | | 5.9 g (24.6 mmol) | | | | |
| Synthesis Example 32 | A-24 | 5.6 g (12.3 mmol) | | 5.9 g (24.6 mmol) | | | | |
| Synthesis Example 33 | A-25 | 5.6 g (12.3 mmol) | | 5.9 g (24.6 mmol) | | | | |
| Synthesis Example 34 | A-26 | 5.6 g (12.3 mmol) | | 5.9 g (24.6 mmol) | | | | |
| Synthesis Example 35 | A-27 | | 7.9 g (12.3 mmol) | 5.9 g (24.6 mmol) | | | 14.7 g (4.1 mmol) | |
| Synthesis Example 36 | A-28 | 5.6 g (12.3 mmol) | | | 6.9 g (24.6 mmol) | | 14.7 g (4.1 mmol) | |
| Synthesis Example 37 | A-29 | 5.6 g (12.3 mmol) | | 5.9 g (24.6 mmol) | | | 14.7 g (4.1 mmol) | |
| Synthesis Example 38 | A-30 | 5.6 g (12.3 mmol) | | 5.9 g (24.6 mmol) | | | 14.7 g (4.1 mmol) | |
| Synthesis Example 39 | A.31 | 5.6 g (12.3 mmol) | | 5.9 g (24.6 mmol) | | | 14.7 g (4.1 mmol) | |
| Synthesis Example 40 | A-32 | 5.6 g (12.3 mmol) | | 5.9 g (24.6 mmol) | | | 14.7 g (4.1 mmol) | |
| Synthesis Example 41 | A.33 | 5.6 g (12.3 mmol) | | | | 14.5 g (24.6 mmol) | 14.7 g (4.1 mmol) | |

TABLE 2-continued

| | | 9.8 g (41.0 mmol) |
|---|---|---|
| Comparative Synthesis Example 1 | B-1 | 9.8 g (41.0 mmol) |
| Comparative Synthesis Example 2 | B-2 | 9.8 g (41.0 mmol) |
| Comparative Synthesis Example 3 | B-3 | 9.8 g (41.0 mmol) |
| Comparative Synthesis Example 4 | B-4 | 9.8 g (41.0 mmol) |

| | | Solution of tetracarboxylic diester dichloride in NMP (molar number as tetracarboxylic dichloride) | | | | | | |
|---|---|---|---|---|---|---|---|---|
| | | Synthesis Example 21 X-3 | Synthesis Example 22 X-4 | Synthesis Example 23 X-5 | Synthesis Example 24 X-6 | Synthesis Example 25 X-7 | Synthesis Example 26 X-8 | Molecular weight |
| Synthesis Example 27 | A-19 | | | | | | | 38,000 |
| Synthesis Example 28 | A-20 | | | | | | | 37,000 |
| Synthesis Example 29 | A-21 | 17.9 g (4.1 mmol) | | | | | | 38,000 |
| Synthesis Example 30 | A-22 | | 14.3 g (4.1 mmol) | | | | | 38,000 |
| Synthesis Example 31 | A-23 | | | 11.8 g (4.1 mmol) | | | | 38,000 |
| Synthesis Example 32 | A-24 | | | | 12.3 g (4.1 mmol) | | | 37,000 |
| Synthesis Example 33 | A-25 | | | | | 13.9 g (4.1 mmol) | | 36,000 |
| Synthesis Example 34 | A-26 | | | | | | 17.4 g (4.1 mmol) | 37,000 |
| Synthesis Example 35 | A-27 | | | | | | | 39,000 |
| Synthesis Example 36 | A-28 | | | | | | | 39,000 |
| Synthesis Example 37 | A-29 | | | | | | | 35,000 |
| Synthesis Example 38 | A-30 | | | | | | | 30,000 |
| Synthesis Example 39 | A.31 | | | | | | | 29,000 |
| Synthesis Example 40 | A-32 | | | | | | | 28,000 |
| Synthesis Example 41 | A.33 | | | | | | | 37,000 |
| Comparative Synthesis Example 1 | B-1 | | | | | | | 34,000 |
| Comparative Synthesis Example 2 | B-2 | | | | | | | 33,000 |
| Comparative Synthesis Example 3 | B-3 | | | | | | | 35,000 |
| Comparative Synthesis Example 4 | B-4 | | | | | | | 34,000 |

II. Preparation of Photosensitive Resin Composition

Resin compositions each containing 40 mass % of resin were prepared using Polyimide resins (A-1) to (A-18) synthesized in Synthesis Examples 1 to 18 as well as Polyamide-imide resins and Polyimide resins (A-19) to (A-33) synthesized in Synthesis Examples 27 to 41 and Polyamide-imide resins synthesized in Comparative Synthesis Examples 1 to 4 as base resins, with the composition and the formulation amount shown in Tables 3A to 3F. The resin compositions were each stirred, mixed, dissolved, and filtered through a 0.5-μm filter made of Teflon (registered trademark) for microfiltration to obtain photosensitive resin compositions. In Tables, the solvent "PGMEA" represents propylene glycol monomethyl ether acetate, and the unit "phr" represents per hundred resin by mass.

TABLE 3A

|  | Photosensitive resin composition 1 | Photosensitive resin composition 2 | Photosensitive resin composition 3 | Photosensitive resin composition 4 | Photosensitive resin composition 5 | Photosensitive resin composition 6 | Photosensitive resin composition 7 |
| --- | --- | --- | --- | --- | --- | --- | --- |
| Base resin | A-1 100 phr | A-2 100 phr | A-3 100 phr | A-4 100 phr | A-5 100 phr | A-6 100 phr | A-7 100 phr |
| Photosensitive agent | Photosensitive agent 1 15 phr | Photosensitive agent 1 15 phr | Photosensitive agent 1 15 phr | Photosensitive agent 1 15 phr | Photosensitive agent 1 15 phr | Photosensitive agent 1 15 phr | Photosensitive agent 1 15 phr |
| Crosslinking agent 1 | CL-1 5 phr | CL-1 5 phr | CL-1 5 phr | CL-1 5 phr | CL-1 5 phr | CL-1 5 phr | CL-1 5 phr |
| Crosslinking agent 2 | CL-2 15 phr | CL-2 15 phr | CL-2 15 phr | CL-2 15 phr | CL-2 15 phr | CL-2 15 phr | CL-2 15 phr |
| Solvent | PGMEA 150 phr | PGMEA 150 phr | PGMEA 150 phr | PGMEA 150 phr | PGMEA 150 phr | PGMEA 150 phr | PGMEA 150 phr |

TABLE 3B

|  | Photosensitive resin composition 8 | Photosensitive resin composition 9 | Photosensitive resin composition 10 | Photosensitive resin composition 11 | Photosensitive resin composition 12 | Photosensitive resin composition 13 | Photosensitive resin composition 14 |
| --- | --- | --- | --- | --- | --- | --- | --- |
| Base resin | A-8 100 phr | A-9 100 phr | A-10 100 phr | A-11 100 phr | A-12 100 phr | A-13 100 phr | A-14 100 phr |
| Photosensitive agent | Photosensitive agent 1 15 phr | Photosensitive agent 1 15 phr | Photosensitive agent 1 15 phr | Photosensitive agent 1 15 phr | Photosensitive agent 1 15 phr | Photosensitive agent 1 15 phr | Photosensitive agent 1 15 phr |
| Crosslinking agent 1 | CL-1 5 phr | CL-1 5 phr | CL-1 5 phr | CL-1 5 phr | CL-1 5 phr | CL-1 5 phr | CL-1 5 phr |
| Crosslinking agent 2 | CL-2 15 phr | CL-2 15 phr | CL-2 15 phr | CL-2 15 phr | CL-2 15 phr | CL-2 15 phr | CL-2 15 phr |
| Solvent | PGMEA 150 phr | PGMEA 150 phr | PGMEA 150 phr | PGMEA 150 phr | PGMEA 150 phr | PGMEA 150 phr | PGMEA 150 phr |

TABLE 3C

|  | Photosensitive resin composition 15 | Photosensitive resin composition 16 | Photosensitive resin composition 17 | Photosensitive resin composition 18 | Photosensitive resin composition 19 | Photosensitive resin composition 20 | Photosensitive resin composition 21 |
| --- | --- | --- | --- | --- | --- | --- | --- |
| Base resin | A-15 100 phr | A-16 100 phr | A-17 100 phr | A-18 100 phr | A-19 100 phr | A-20 100 phr | A-21 100 phr |
| Photosensitive agent | Photosensitive agent 1 15 phr | Photosensitive agent 1 15 phr | Photosensitive agent 1 15 phr | Photosensitive agent 1 15 phr | Photosensitive agent 1 15 phr | Photosensitive agent 1 15 phr | Photosensitive agent 1 15 phr |
| Crosslinking agent 1 | CL-1 5 phr | CL-1 5 phr | CL-1 5 phr | CL-1 5 phr | CL-1 5 phr | CL-1 5 phr | CL-1 5 phr |
| Crosslinking agent 2 | CL-2 15 phr | CL-2 15 phr | CL-2 15 phr | CL-2 15 phr | CL-2 15 phr | CL-2 15 phr | CL-2 15 phr |
| Solvent | PGMEA 150 phr | PGMEA 150 phr | PGMEA 150 phr | PGMEA 150 phr | PGMEA 150 phr | PGMEA 150 phr | PGMEA 150 phr |

TABLE 3D

|  | Photo-sensitive resin composition 22 | Photo-sensitive resin composition 23 | Photo-sensitive resin composition 24 | Photo-sensitive resin composition 25 | Photo-sensitive resin composition 26 | Photo-sensitive resin composition 27 | Photo-sensitive resin composition 28 |
|---|---|---|---|---|---|---|---|
| Base resin | A-22 100 phr | A-23 100 phr | A-24 100 phr | A-25 100 phr | A-26 100 phr | A-27 100 phr | A-28 100 phr |
| Photo-sensitive agent | Photosensitive agent 1 15 phr | Photosensitive agent 1 15 phr | Photosensitive agent 1 15 phr | Photosensitive agent 1 15 phr | Photosensitive agent 1 15 phr | Photosensitive agent 1 15 phr | Photosensitive agent 1 15 phr |
| Crosslinking agent 1 | CL-1 5 phr | CL-1 5 phr | CL-1 5 phr | CL-1 5 phr | CL-1 5 phr | CL-1 5 phr | CL-1 5 phr |
| Crosslinking agent 2 | CL-2 15 phr | CL-2 15 phr | CL-2 15 phr | CL-2 15 phr | CL-2 15 phr | CL-2 15 phr | CL-2 15 phr |
| Solvent | PGMEA 150 phr | PGMEA 150 phr | PGMEA 150 phr | PGMEA 150 phr | PGMEA 150 phr | PGMEA 150 phr | PGMEA 150 phr |

TABLE 3E

|  | Photo-sensitive resin composition 29 | Photo-sensitive resin composition 30 | Photo-sensitive resin composition 31 | Photo-sensitive resin composition 32 | Photo-sensitive resin composition 33 |
|---|---|---|---|---|---|
| Base resin | A-29 100 phr | A-30 100 phr | A-31 100 phr | A-32 100 phr | A-33 100 phr |
| Photo-sensitive agent | Photosensitive agent 1 15 phr | Photosensitive agent 1 15 phr | Photosensitive agent 1 15 phr | Photosensitive agent 1 15 phr | Photosensitive agent 1 15 phr |
| Crosslinking agent 1 | CL-1 5 phr | CL-1 5 phr | CL-1 5 phr | CL-1 5 phr | CL-1 5 phr |
| Crosslinking agent 2 | CL-2 15 phr | CL-2 15 phr | CL-2 15 phr | CL-2 15 phr | CL-2 15 phr |
| Solvent | PGMEA 150 phr | PGMEA 150 phr | PGMEA 150 phr | PGMEA 150 phr | PGMEA 150 phr |

TABLE 3F

|  | Comparative Photo-sensitive resin composition 1 | Comparative Photo-sensitive resin composition 2 | Comparative Photo-sensitive resin composition 3 | Comparative Photo-sensitive resin composition 4 |
|---|---|---|---|---|
| Base resin | B-1 100 phr | B-2 100 phr | B-3 100 phr | B-4 100 phr |
| Photo-sensitive agent | Photosensitive agent 1 15 phr | Photosensitive agent 1 15 phr | Photosensitive agent 1 15 phr | Photosensitive agent 1 15 phr |
| Crosslinking agent 1 | CL-1 5 phr | CL-1 5 phr | CL-1 5 phr | CL-1 5 phr |
| Crosslinking agent 2 | CL-2 15 phr | CL-2 15 phr | CL-2 15 phr | CL-2 15 phr |
| Solvent | PGMEA 150 phr | PGMEA 150 phr | PGMEA 150 phr | PGMEA 150 phr |

Comparative photosensitive resin compositions shown in Table 3F, which used (B-1) to (B-4) as respective base resins, were insoluble into PGMEA used as a solvent. The base resins of (B-1) to (B-4) do not contain polyamide-imide resin or polyimide resin derived by the reaction of at least one of a tetracarboxylic dianhydride shown by the general formula (3) as well as a dicarboxylic acid and a dicarboxylic halide shown by the general formula (4) of the present invention, thereby being insoluble in widely used solvent like PGMEA.

As shown in the following Table 4, photosensitive resin compositions were produced using (B-1) to (B-4) as base resins in the same manner in Comparative photosensitive resin compositions described above except for changing the solvent to GBL. In case of using (B-3) or (B-4) as a base resin, however, the composition was insoluble also in the GBL solvent. Herein, the solvent "GBL" represents γ-butyrolactone.

TABLE 4

|  | Comparative Photo-sensitive resin composition 5 | Comparative Photo-sensitive resin composition 6 | Comparative Photo-sensitive resin composition 7 | Comparative Photo-sensitive resin composition 8 |
|---|---|---|---|---|
| Base resin | B-1 100 phr | B-2 100 phr | B-3 100 phr | B-4 100 phr |
| Photo-sensitive agent | Photosensitive agent 1 15 phr | Photosensitive agent 1 15 phr | Photosensitive agent 1 15 phr | Photosensitive agent 1 15 phr |
| Crosslinking agent 1 | CL-1 5 phr | CL-1 5 phr | CL-1 5 phr | CL-1 5 phr |
| Crosslinking agent 2 | CL-2 15 phr | CL-2 15 phr | CL-2 15 phr | CL-2 15 phr |
| Solvent | GBL 150 phr | GBL 150 phr | GBL 150 phr | GBL 150 phr |

Photosensitive resin compositions 34 to 38 shown in Table 5 relate to the particular form of the inventive positive photosensitive resin composition described above having the component (E).

TABLE 5

|  | Photo-sensitive resin composition 34 | Photo-sensitive resin composition 35 | Photo-sensitive resin composition 36 | Photo-sensitive resin composition 37 | Photo-sensitive resin composition 38 |
|---|---|---|---|---|---|
| Base resin | A-1 100 phr | A-2 100 phr | A-19 100 phr | A-27 100 phr | A-33 100 phr |
| Photo-sensitive agent | Photosensitive agent 1 15 phr | Photosensitive agent 1 15 phr | Photosensitive agent 1 15 phr | Photosensitive agent 1 15 phr | Photosensitive agent 1 15 phr |

TABLE 5-continued

|  | Photosensitive resin composition 34 | Photosensitive resin composition 35 | Photosensitive resin composition 36 | Photosensitive resin composition 37 | Photosensitive resin composition 38 |
|---|---|---|---|---|---|
| Crosslinking agent 1 | CL-1 5 phr | CL-1 5 phr | CL-1 5 phr | CL-1 5 phr | CL-1 5 phr |
| Crosslinking agent 2 | CL-2 15 phr | CL-2 15 phr | CL-2 15 phr | CL-2 15 phr | CL-2 15 phr |
| Thermal acid generator | E-1 2 phr | E-1 2 phr | E-1 2 phr | E-1 2 phr | E-1 2 phr |
| Solvent | PGMEA 150 phr | PGMEA 150 phr | PGMEA 150 phr | PGMEA 150 phr | PGMEA 150 phr |

Incidentally, in Tables 3 to 5, the specifics of the photosensitive agent of a quinonediazide compound (Photosensitive agent 1), the crosslinking agents (CL-1) and (CL-2), and the thermal acid generator (E-1) are as follows.

Photosensitive Agent (Photosensitive Agent 1)

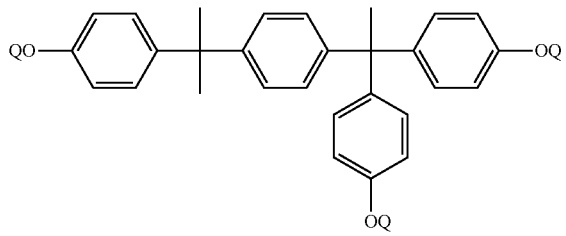

In the formula, Q represents a 1,2-naphthoquinone diazide sulfonyl group shown by the following formula or a hydrogen atom, provided that 90% of Q is substituted with a 1,2-naphthoquinone diazide sulfonyl group shown by the following formula.

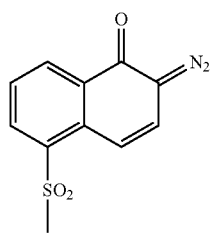

Crosslinking Agent (CL-1)

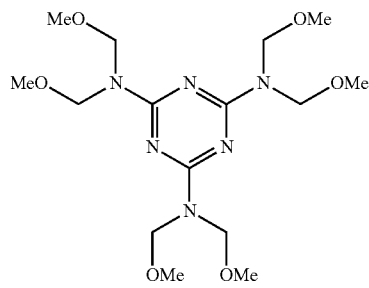 [SMILES: COCN(COC)c1nc(N(COC)COC)nc(N(COC)COC)n1]

Crosslinking Agent (CL-2):
epoxy resin EP4000L manufactured by ADEKA CORPORATION Thermal Acid Generator (E-1)

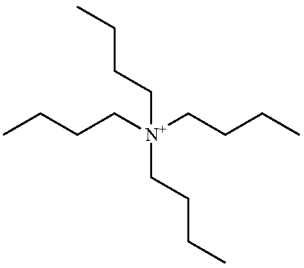

$CF_3CF_2CF_2CF_2SO_3^-$

III. Patterning 5 mL of Photosensitive resin compositions 1 to 38 and Comparative photosensitive resin compositions 5 and 6 were each dispensed and applied onto a silicon substrate by rotating the substrate, i.e., by the spin coating method so as to give a film thickness of 10 µm after patterning and baking for post-curing. That is, the rotational speed during applying was adjusted such that a post-cured film had a thickness of 10 µm, in consideration of an expected reduction in film thickness after the post-curing step.

Then, pre-baking was performed on a hot plate at 100° C. for 2 minutes. The film was then exposed to an i-line beam with an i-line stepper, NSR-2205i11, manufactured by Nikon Corporation, to form a pattern. In the patterning, a mask for positive pattern was used. The mask had a pattern capable of forming 20 µm holes arranged with a 1:1 ratio lengthwise and breadthwise, and permitted to form a hole pattern of 50 µm to 20 µm holes with 10-µm pitch, 20 µm to 10 µm holes with 5-µm pitch, and 10 µm to 1 µm holes with 1-µm pitch.

In the development step, 2.38% aqueous tetramethylammonium hydroxide solution was used as an aqueous alkaline developer. Puddling development with 2.38% aqueous tetramethylammonium hydroxide (TMAH) solution was performed for 1 minute for the appropriate number of times shown in Table 6, followed by rinsing with ultrapure water.

The obtained pattern on the substrate was then post-cured with an oven at 180° C. for 2 hours while purging with nitrogen.

Then, each substrate was cut to observe the profile of the obtained hole pattern, and the hole pattern profile was observed with a scanning electron microscope (SEM). A minimum diameter of the opening holes was measured on the post-cured film having a thickness of 10 µm, and the pattern profile was evaluated. Tables 6 and 7 show these results and sensitivity at which a minimum pattern could be formed.

The hole pattern profile was evaluated based on the following criterion. The evaluation results are shown in Tables 6 and 7.

Good: The holes were rectangular or forward tapered (the upper part of the hole is larger than the bottom).

Poor: The holes were reverse tapered (the upper part of the hole is smaller than the bottom) or overhanging (the upper part of the hole is protruded; gross film loss or residues in the hole bottom were observed.

IV. Film Shrinkage

Photosensitive resin compositions 1 to 38 and Comparative photosensitive resin compositions 5 and 6 were each spin coated on a silicone wafer so as to have a finished film thickness of 10 μm after curing. Then, pre-baking was performed at 100° C. for 3 minutes on a hot plate to give a photosensitive resin film. Subsequently, the film thickness of each obtained film was measured with an optical film thickness gauge (VM-1210 manufactured by Dainippon Screen Mfg. Co., Ltd.).

Then, curing was performed at 180° C. for 2 hours using an oven while being purged with nitrogen to give a cured film of photosensitive resin. Subsequently, the film thickness of the obtained film was measured with the optical film thickness gauge. The difference between the film thicknesses before and after the curing was divided by the film thickness after the pre-baking, and the value shown in percentage was determined as a cure shrinkage. As the value is smaller, the shrinkage factor is smaller. The obtained values were compared to evaluate each film shrinkage due to heat curing. The results are shown in Tables 6 and 7.

TABLE 6A

| | Composition | Development conditions | Hole profile | Minimum hole diameter (μm) | Sensitivity (mJ/cm$^2$) | Shrinkage (%) |
|---|---|---|---|---|---|---|
| Example 1 | Photosensitive resin composition 1 | Puddling 60 sec. 2 times | Good | 5 | 640 | 7 |
| Example 2 | Photosensitive resin composition 2 | Puddling 60 sec. 3 times | Good | 5 | 400 | 8 |
| Example 3 | Photosensitive resin composition 3 | Puddling 60 sec. 2 times | Good | 5 | 600 | 7 |
| Example 4 | Photosensitive resin composition 4 | Puddling 60 sec. 3 times | Good | 5 | 420 | 8 |
| Example 5 | Photosensitive resin composition 5 | Puddling 60 sec. 3 times | Good | 5 | 400 | 9 |
| Example 6 | Photosensitive resin composition 6 | Puddling 60 sec. 3 times | Good | 5 | 380 | 8 |
| Example 7 | Photosensitive resin composition 7 | Puddling 60 sec. 3 times | Good | 5 | 400 | 8 |
| Example 8 | Photosensitive resin composition 8 | Puddling 60 sec. 2 times | Good | 5 | 580 | 7 |
| Example 9 | Photosensitive resin composition 9 | Puddling 60 sec. 2 times | Good | 5 | 560 | 9 |
| Example 10 | Photosensitive resin composition 10 | Puddling 60 sec. 2 times | Good | 5 | 540 | 7 |
| Example 11 | Photosensitive resin composition 11 | Puddling 60 sec. 3 times | Good | 6 | 380 | 7 |
| Example 12 | Photosensitive resin composition 12 | Puddling 60 sec. 3 times | Good | 6 | 340 | 7 |
| Example 13 | Photosensitive resin composition 13 | Puddling 60 sec. 3 times | Good | 6 | 360 | 9 |
| Example 14 | Photosensitive resin composition 14 | Puddling 60 sec. 3 times | Good | 6 | 360 | 9 |
| Example 15 | Photosensitive resin composition 15 | Puddling 60 sec. 3 times | Good | 6 | 400 | 7 |
| Example 16 | Photosensitive resin composition 16 | Puddling 60 sec. 3 times | Good | 6 | 420 | 8 |
| Example 17 | Photosensitive resin composition 17 | Puddling 60 sec. 3 times | Good | 5 | 420 | 8 |
| Example 18 | Photosensitive resin composition 18 | Puddling 60 sec. 4 times | Good | 7 | 500 | 7 |
| Example 19 | Photosensitive resin composition 19 | Puddling 60 sec. 3 times | Good | 5 | 420 | 8 |
| Example 20 | Photosensitive resin composition 20 | Puddling 60 sec. 3 times | Good | 5 | 440 | 9 |
| Example 21 | Photosensitive resin composition 21 | Puddling 60 sec. 3 times | Good | 5 | 400 | 9 |
| Example 22 | Photosensitive resin composition 22 | Puddling 60 sec. 3 times | Good | 5 | 400 | 7 |
| Example 23 | Photosensitive resin composition 23 | Puddling 60 sec. 3 times | Good | 5 | 420 | 8 |
| Example 24 | Photosensitive resin composition 24 | Puddling 60 sec. 3 times | Good | 5 | 380 | 6 |

TABLE 6B

| | Composition | Development conditions | Hole profile | Minimum hole diameter (μm) | Sensitivity (mJ/cm$^2$) | Shrinkage (%) |
|---|---|---|---|---|---|---|
| Example 25 | Photosensitive resin composition 25 | Puddling 60 sec. 3 times | Good | 5 | 400 | 7 |
| Example 26 | Photosensitive resin composition 26 | Puddling 60 sec. 3 times | Good | 5 | 460 | 7 |
| Example 27 | Photosensitive resin composition 27 | Puddling 60 sec. 3 times | Good | 5 | 460 | 10 |
| Example 28 | Photosensitive resin composition 28 | Puddling 60 sec. 3 times | Good | 5 | 420 | 9 |
| Example 29 | Photosensitive resin composition 29 | Puddling 60 sec. 3 times | Good | 5 | 500 | 7 |
| Example 30 | Photosensitive resin composition 30 | Puddling 60 sec. 3 times | Good | 5 | 420 | 7 |
| Example 31 | Photosensitive resin composition 31 | Puddling 60 sec. 3 times | Good | 5 | 440 | 8 |
| Example 32 | Photosensitive resin composition 32 | Puddling 60 sec. 3 times | Good | 5 | 420 | 8 |
| Example 33 | Photosensitive resin composition 33 | Puddling 60 sec. 3 times | Good | 5 | 500 | 7 |
| Example 34 | Photosensitive resin composition 34 | Puddling 60 sec. 3 times | Good | 5 | 460 | 6 |
| Example 35 | Photosensitive resin composition 35 | Puddling 60 sec. 3 times | Good | 5 | 640 | 5 |
| Example 36 | Photosensitive resin composition 36 | Puddling 60 sec. 3 times | Good | 5 | 400 | 6 |
| Example 37 | Photosensitive resin composition 37 | Puddling 60 sec. 3 times | Good | 5 | 420 | 7 |
| Example 38 | Photosensitive resin composition 38 | Puddling 60 sec. 3 times | Good | 5 | 460 | 7 |

TABLE 7

| | Composition | Development conditions | Hole profile | Minimum hole diameter (μm) | Sensitivity (mJ/cm$^2$) | Shrinkage (%) |
|---|---|---|---|---|---|---|
| Comparative Example 5 | Comparative photosensitive resin composition 5 | Puddling 60 sec. 2 times | Poor | 10 | 380 | 24 |
| Comparative Example 6 | Comparative photosensitive resin composition 6 | Puddling 60 sec. 2 times | Poor | 10 | 380 | 23 |

As shown in Tables 6A and 6B, in the development with alkaline solution, the inventive positive photosensitive resin composition showed a good pattern profile and a small minimum hole dimension, compared to a final film thickness of 10 It was thus revealed that an aspect ratio of 1 or more could be achieved. It is conceivable that the improvement of the base resin in solubility in a developer, as in Examples, improved the resolution performance in patterning.

On the other hand, Comparative photosensitive resin compositions 5 and 6 showed gross film loss as in Table 7, together with poor resolution performance. One reason for the gross film loss is that the solvent of Comparative photosensitive resin compositions 5 and 6 was GBL, which is a high boiling point solvent to remain in a patterning process, thereby accelerating dissolution of the film when the much solvent remained in the development to cause large film loss. Another reason is the large heat shrinkage in the heat curing step as shown in Table 7. This is probably due to heat shrinkage caused by losing the remained GBL solvent. The gross film loss of a pattern can be prevented by the inventive polyamide-imide or polyimide resins described above, derived from reaction of at least one of a tetracarboxylic dianhydride shown by the general formula (3) as well as a dicarboxylic acid and a dicarboxylic halide shown by the general formula (4), because they are readily soluble in low boiling point solvents such as PGMEA.

As described above, the inventive polymer makes it possible to obtain a photosensitive resin composition that can achieve high resolution, which is required to accommodate increase of density and integration of chips, without losing excellent characteristics such as mechanical strength and adhesiveness of a pattern and a protective film of the resin. This photosensitive resin composition is highly usable for actual uses because it forms an insulating protective film with heat resistance and resistance to various chemicals in various processes after patterning and curing.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A polymer having a polyamide structural unit, a polyamide-imide structural unit, or a polyimide structural unit, the polymer being selected from the group consisting of a polyamide, a polyamide-imide, a polyimide, a polyimide precursor, a polybenzoxazole, and a polybenzoxazole precursor, comprising a reaction product of a diamine and at least one of a tetracarboxylic dianhydride, a dicarboxylic acid, and a dicarboxylic halide;

the diamine comprising at least one of a diamine shown by the following general formula (1) and a diamine shown by the following general formula (2);

the tetracarboxylic dianhydride comprising phthalic anhydride structures, shown by the following general formula (3); and the dicarboxylic acid and the dicarboxylic halide each comprising benzoic acid structures, shown by the following general formula (4):

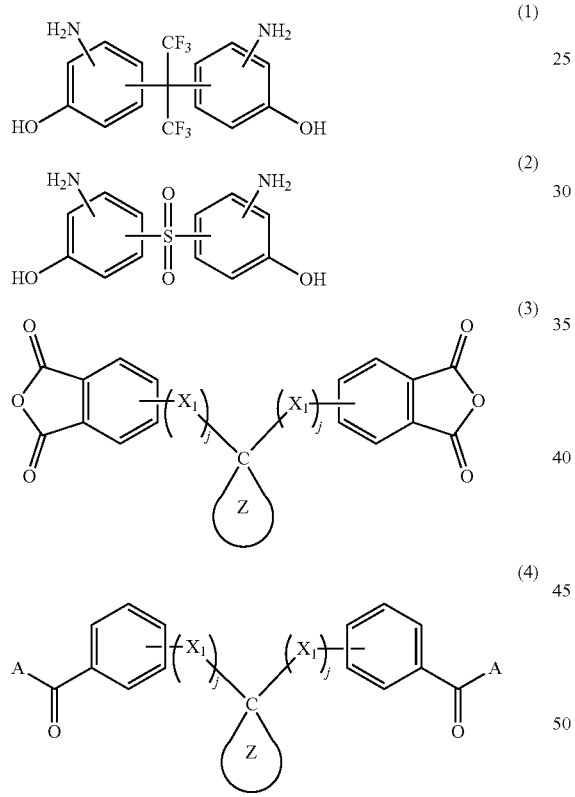

wherein Z in the general formula (3), when "j" is 1, represents a cyclic structure having 3 to 20 carbon atoms selected from an alicyclic structure, an alicyclic structure having an aromatic ring linked therewith, an alicyclic structure having a heteroatom contained or inserted therein, and an alicyclic structure having an aromatic ring linked therewith and a heteroatom contained or inserted therein, and, Z in the general formula (3), when "j" is 0, and Z in the general formula (4) each represents any one of cyclic structures shown by the following general formulae (I);

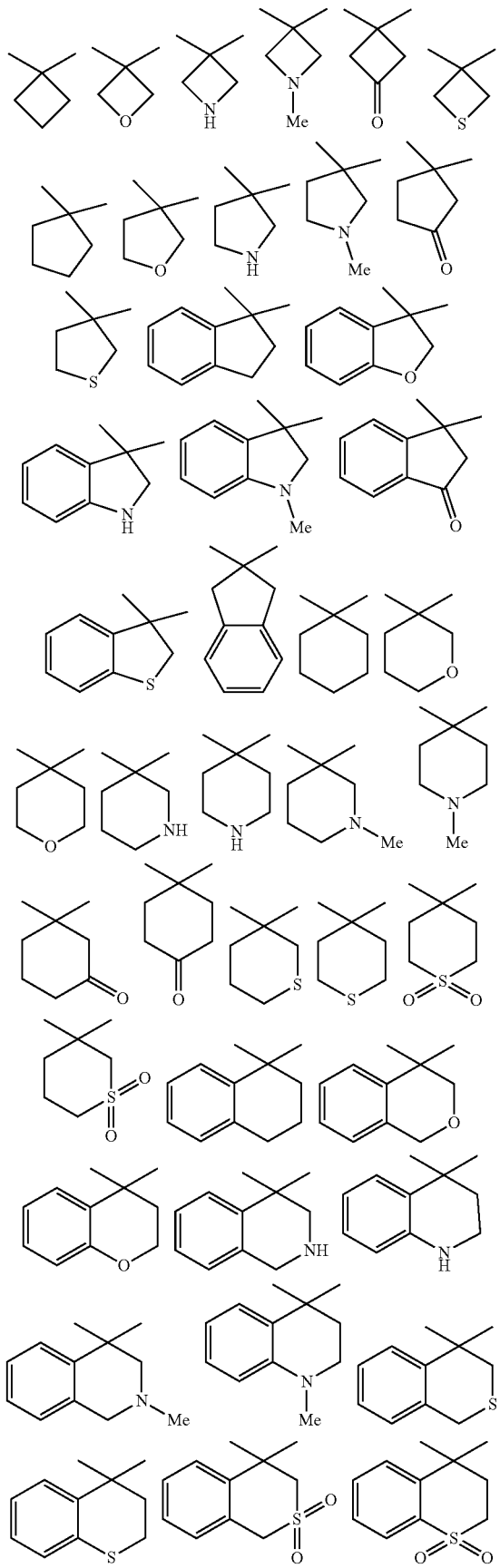

109
-continued

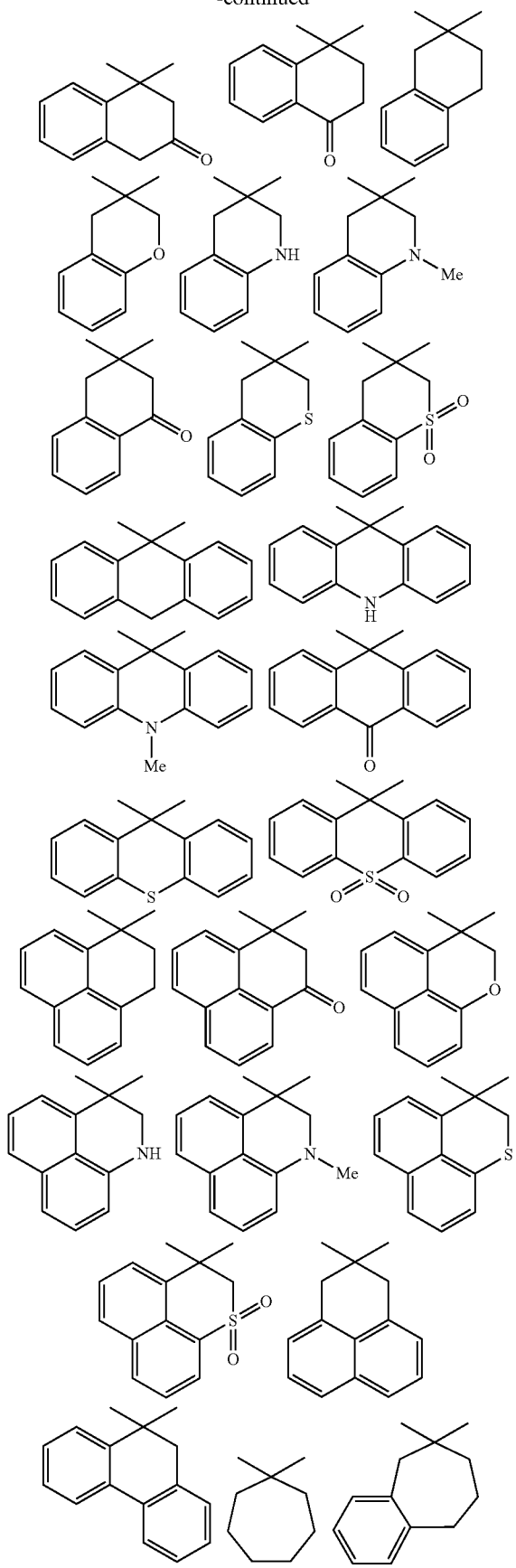

110
-continued

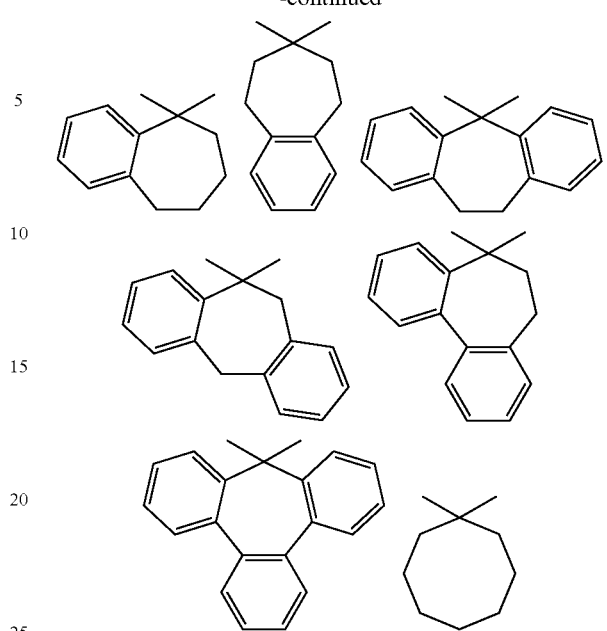

where the dotted line represents a bond; "A" represents a hydroxy group or a halogen atom; "j" represents 0 or 1; when "j" is 0, each cyclic structure Z is directly linked to the phthalic anhydride structures in the general formula (3) or the benzoic acid structures in the general formula (4); and when "j" is 1, $X_2$ represents a divalent linking group, and $X_1$ represents any one of the following general formulae (5), (6), (7), (9), and (10),

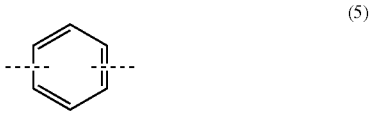 (5)

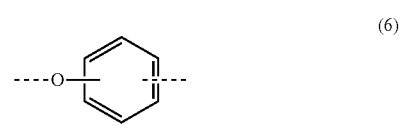 (6)

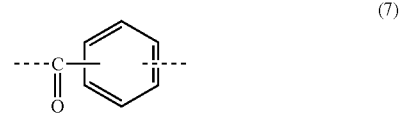 (7)

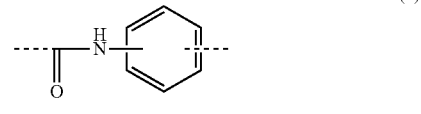 (9)

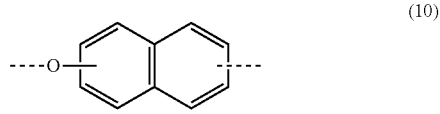 (10)

where the dotted line represents a bond.

2. The polymer according to claim 1, wherein the cyclic structure Z in the general formula (3) is represented by the following general formula (11) or (12):

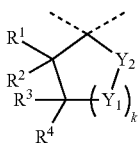
(11)

wherein the dotted line represents a bond; "k" represents an integer of 0 or more; $Y_2$ represents a divalent group selected from groups shown by the following general formulae (13), (14), (15), and (16); when "k" is 1, $Y_1$ represents a divalent group selected from groups shown by the following general formulae (17), (18), (19), and (20); and when "k" is 2 or more, $Y_1$ represents a divalent group shown by the following general formula (17):

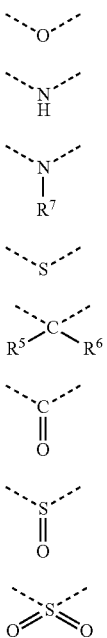

(13)
(14)
(15)
(16)
(17)
(18)
(19)
(20)

wherein the dotted line represents a bond; $R^1, R^2, R^3, R^4, R^5$, and $R^6$ are the same or different and each represent a hydrogen atom or a substituent selected from a methyl group, an ethyl group, and a linear, branched, or cyclic alkyl group having 3 to 12 carbon atoms, or alternatively, $R^1, R^2, R^3, R^4, R^5$, and $R^6$ are bonded with each other to form an alicycle or an aromatic ring; and $R^7$ represents a methyl group, an ethyl group, or a linear, branched, or cyclic alkyl group having 3 to 12 carbon atoms,

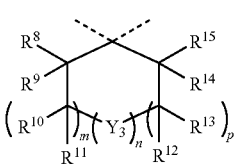
(12)

wherein the dotted line represents a bond; $R^8, R^9, R^{10}, R^{11}, R^{12}, R^{13}, R^{14}$, and $R^{15}$ are the same or different and each represent a hydrogen atom or a substituent selected from a methyl group, an ethyl group, and a linear, branched, or cyclic alkyl group having 3 to 12 carbon atoms, or alternatively, $R^8, R^9, R^{10}, R^{11}, R^{12}, R^{13}, R^{14}$, and $R^{15}$ are bonded with each other to form an alicyclic structure or an aromatic ring structure; "m" and "p" each represent an integer of 0 to 9; "n" represents 0 or 1; and $Y_3$ represents a divalent group selected from groups shown by the general formulae (13), (14), (15), (16), (17), (18), (19), and (20).

3. The polymer according to claim 1, wherein the divalent linking group $X_2$ in the general formula (4) is represented by any of the following general formulae (5), (6), (7), (8), (9), and (10):

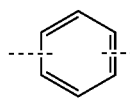
(5)

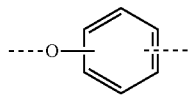
(6)

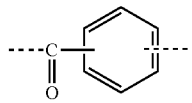
(7)

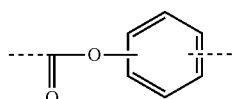
(8)

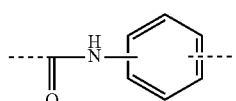
(9)

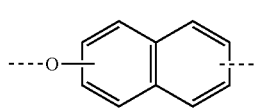
(10)

wherein the dotted line represents a bond.

4. The polymer according to claim 2, wherein the divalent linking group $X_2$ in the general formula (4) is represented by any of the following general formulae (5), (6), (7), (8), (9), and (10):

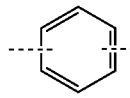
(5)

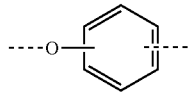
(6)

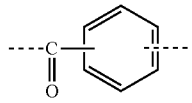
(7)

-continued

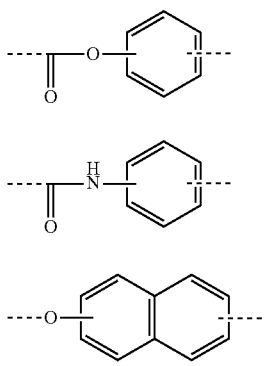
(8)

(9)

(10)

wherein the dotted line represents a bond.

5. The polymer according to claim 1, wherein the diamine shown by the general formula (1) is represented by the following general formula (21).

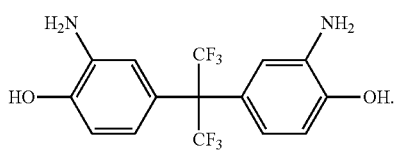
(21)

6. The polymer according to claim 1, wherein the reaction product further contains a tetracarboxylic acid diester unit shown by the following general formula (22):

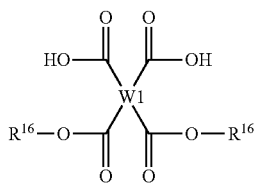
(22)

wherein W1 represents a tetravalent organic group, and $R^{16}$ represents a group shown by the following general formula (23):

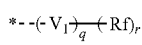
(23)

wherein the dotted line represents a bond; $V_1$ represents an organic group with a valency of r+1; Rf represents a linear, branched, or cyclic alkyl group or an aromatic group having 1 to 20 carbon atoms, with the aromatic group optionally substituted by an alkyl group, provided that all of or a part of the hydrogen atoms is substituted by a fluorine atom; "r" represents 1, 2, or 3; and "q" represents 0 or 1.

7. The polymer according to claim 6, wherein $R^{16}$ in the general formula (22) is an organic group selected from groups shown by the following general formulae (24), (25), (26), and (27):

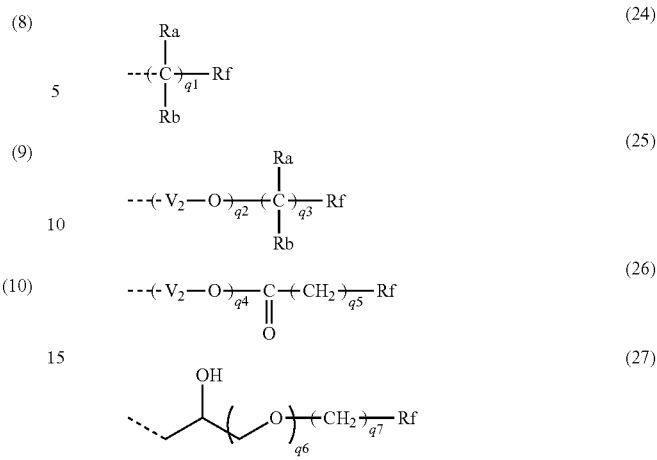
(24)

(25)

(26)

(27)

wherein the dotted line represents a bond; Rf is as defined above; Ra and Rb each represent a hydrogen atom or an alkyl group having 1 to 3 carbon atoms; $V_2$ and $V_3$ each represent a linear or branched alkylene group having 1 to 6 carbon atoms; q1 represents an integer of 0 to 6, q2 represents an integer of 1 to 6, q3 represents an integer of 0 to 6, q4 represents an integer of 1 to 6, q5 represents an integer of 0 to 6, q6 represents 0 or 1, and q7 represents 0 or 1.

8. The polymer according to claim 6, wherein $R^{16}$ in the general formula (22) is a group shown by the following general formula (23-1):

(23-1)

wherein the dotted line represents a bond; and Rf is as defined above.

9. A positive photosensitive resin composition, comprising:
(A) a polymer;
(B) a compound having a quinonediazide structure for serving as a photosensitive agent to generate an acid by light; and
(D) a solvent;
the polymer having a polyamide structural unit, a polyamide-imide structural unit, or a polyimide structural unit, the polymer being selected from the group consisting of a polyamide, a polyamide-imide, a polyimide, a polyimide precursor, a polybenzoxazole, and a polybenzoxazole precursor, comprising a reaction product of a diamine and at least one of a tetracarboxylic dianhydride, a dicarboxylic acid, and a dicarboxylic halide;
the diamine comprising at least one of a diamine shown by the following general formula (1) and a diamine shown by the following general formula (2);
the tetracarboxylic dianhydride comprising phthalic anhydride structures, shown by the following general formula (3); and
the dicarboxylic acid and the dicarboxylic halide each comprising benzoic acid structures, shown by the following general formula (4):

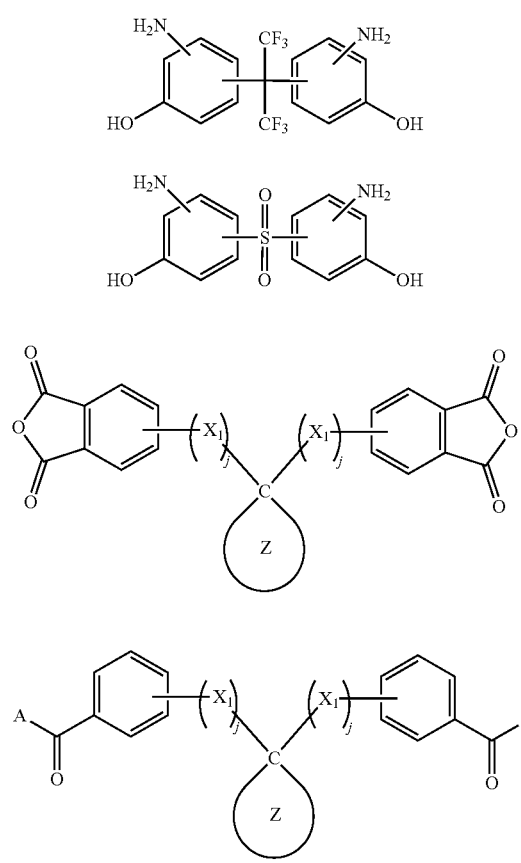

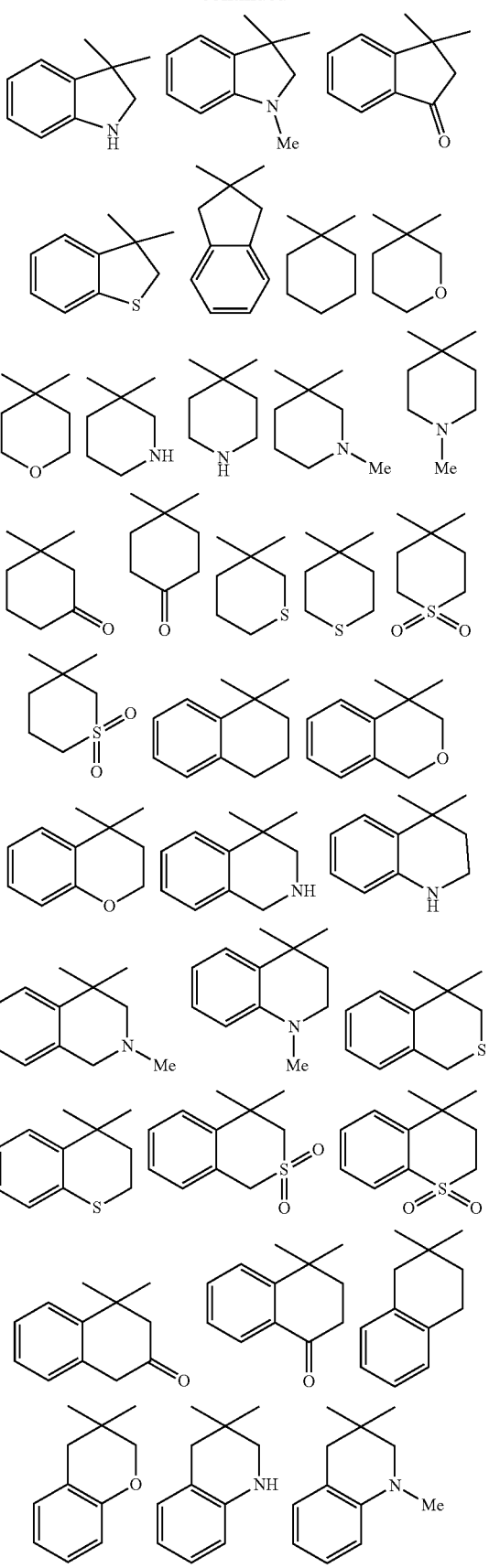

wherein Z in the general formula (3), when "j" is 1, represents a cyclic structure having 3 to 20 carbon atoms selected from an alicyclic structure, an alicyclic structure having an aromatic ring linked therewith, an alicyclic structure having a heteroatom contained or inserted therein, and an alicyclic structure having an aromatic ring linked therewith and a heteroatom contained or inserted therein, and, Z in the general formula (3), when "j" is 0, and Z in the general formula (4) each represents any one of cyclic structures shown by the following general formulae (I);

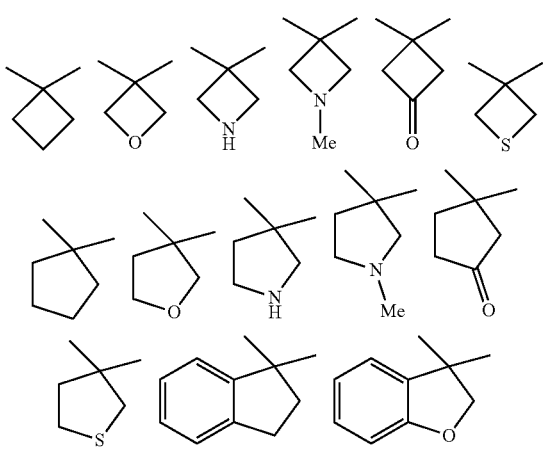

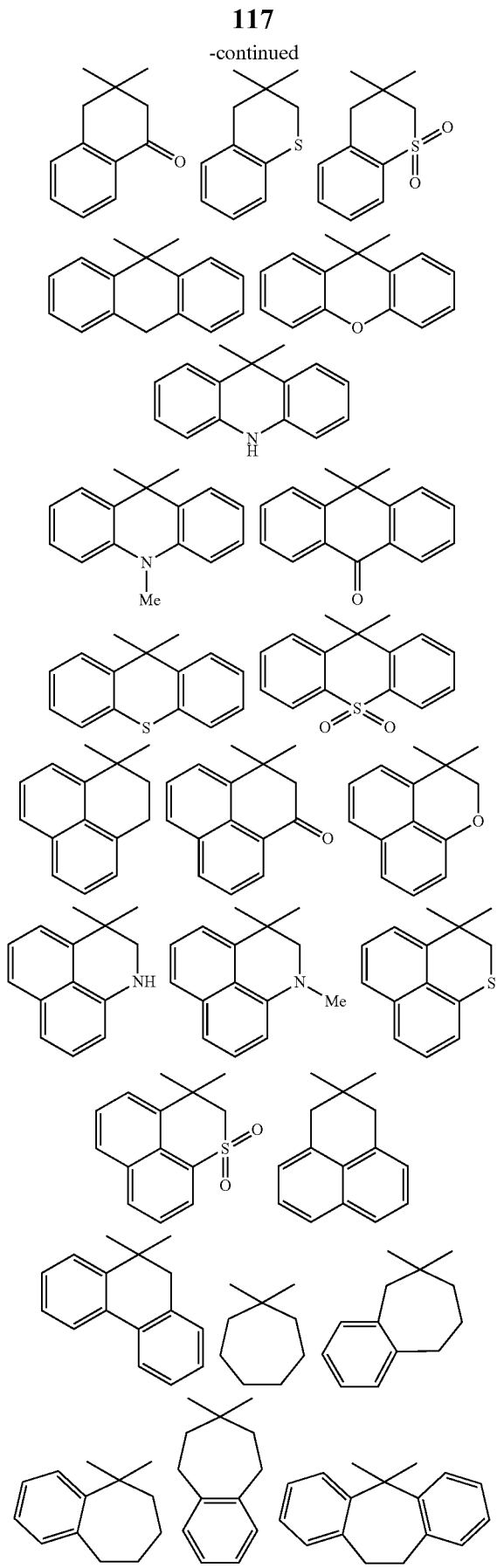

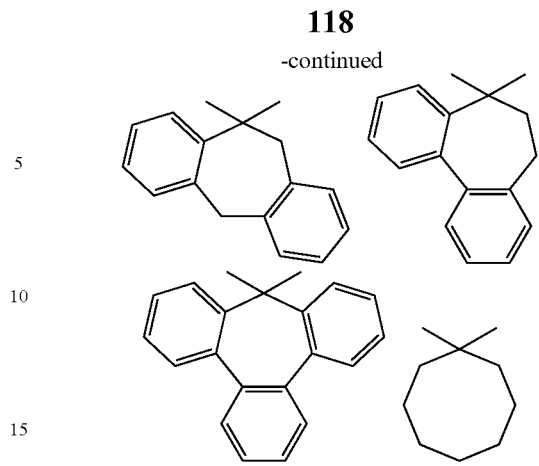

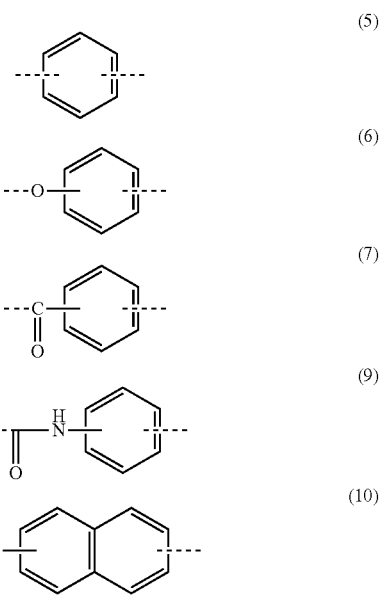

where the dotted line represents a bond; "A" represents a hydroxy group or a halogen atom; "j" represents 0 or 1; when "j" is 0, each cyclic structure Z is directly linked to the phthalic anhydride structures in the general formula (3) or the benzoic acid structures in the general formula (4); and when "j" is 1, $X_2$ represents a divalent linking group, and $X_1$ represents any one of the following general formulae (5), (6), (7), (9), and (10), (5)

(6)

(7)

(9)

(10)

where the dotted line represents a bond.

10. The positive photosensitive resin composition according to claim 9, further comprising:

(C) one or more crosslinking agents selected from an amino condensate modified with formaldehyde or formaldehyde-alcohol, a phenol compound having on average two or more methylol groups or alkoxymethyl groups per molecule, a polyhydric phenol compound in which a hydrogen atom of a phenolic hydroxy group thereof is substituted with a glycidyl group, a polyhydric phenol compound in which a hydrogen atom of a phenolic hydroxy group is substituted with a substituent shown by the following formula (C-1), and a compound containing two or more nitrogen atoms having a glycidyl group as shown by the following formula (C-2),

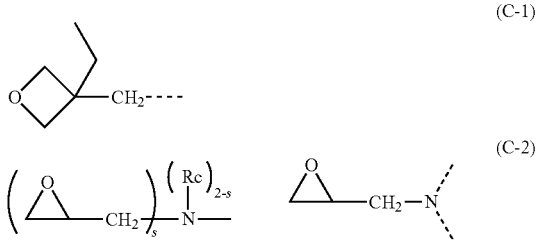

wherein, the dotted line represents a bond; Rc represents a linear, branched or a cyclic alkyl group having 1 to 6 carbon atoms; and "s" represents 1 or 2.

11. The positive photosensitive resin composition according to claim 9, further comprising
(E) a compound to generate an acid or a radical by heat.

12. A patterning process comprising:
(1) applying the positive photosensitive resin composition according to claim 9 onto a substrate to form a photosensitive material film;
(2) exposing the photosensitive material film to a high energy beam having a wavelength of 190 to 500 nm or an electron beam via a photomask after a heat treatment; and
(3) performing development with a developer of an aqueous alkaline solution.

13. The patterning process according to claim 12, further comprising:
(4) post-curing a patterned film formed by the development of the photosensitive material film at a temperature of 100 to 300° C.

14. A photosensitive dry film comprising a supporting film, a protective film, and a photosensitive resin layer having a thickness of 5 to 100 μm and sandwiched between the supporting film and the protective film, wherein the photosensitive resin layer is formed from the positive photosensitive resin composition according to claim 9.

15. A method for producing a photosensitive dry film, comprising:
(i) continuously applying the positive photosensitive resin composition according to claim 9 onto a supporting film to form a photosensitive resin layer;
(ii) continuously drying the photosensitive resin layer; and further
(iii) laminating a protective film onto the photosensitive resin layer.

16. A patterning process comprising:
(i) separating the protective film from the photosensitive dry film according to claim 14 and bringing the photosensitive resin layer thereby uncovered into close contact with a substrate;
(ii) exposing the photosensitive resin layer to a high energy beam having a wavelength of 190 to 500 nm or an electron beam via a photomask either through the supporting film or after removing the supporting film; and
(iii) performing development with a developer.

17. The patterning process according to claim 16, further comprising:
(iv) post-curing a patterned film formed by the development of the photosensitive material film at a temperature of 100 to 300° C.

18. A protective film for electric and electronic parts, comprising a cured film obtained by coating the positive photosensitive resin composition according to claim 9 on a substrate and curing the film.

19. A polymer having a polyamide structural unit, a polyamide-imide structural unit, or a polyimide structural unit, the polymer being selected from the group consisting of a polyamide, a polyamide-imide, a polyimide, a polyimide precursor, a polybenzoxazole, and a polybenzoxazole precursor, comprising a reaction product of a diamine and at least one of a tetracarboxylic dianhydride, a dicarboxylic acid, and a dicarboxylic halide;

the diamine comprising at least one of a diamine shown by the following general formula (1) and a diamine shown by the following general formula (2);

the tetracarboxylic dianhydride comprising phthalic anhydride structures, shown by the following general formula (3); and the dicarboxylic acid and the dicarboxylic halide each comprising benzoic acid structures, shown by the following general formula (4):

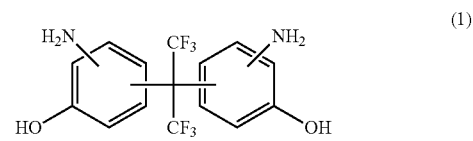

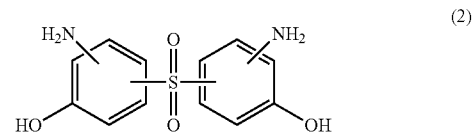

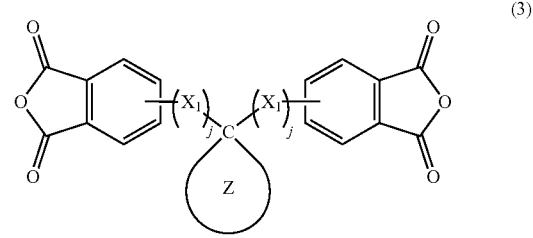

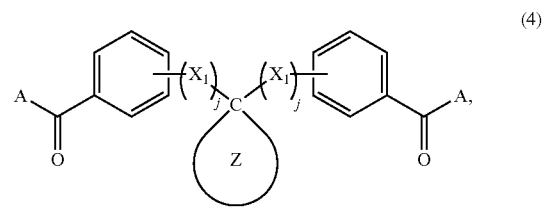

wherein the cyclic structure Z in the general formula (3) is a tetracarboxylic dianhydride structure shown by the following general formula (Z-1) or (Z-2):

121

-continued

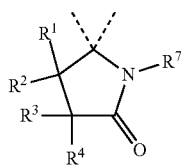
(Z-2)

wherein the dotted line represents a bond; $R^1$, $R^2$, $R^3$ and $R^4$ are the same or different and each represent a hydrogen atom or a substituent selected from a methyl group, an ethyl group, and a linear, branched, or cyclic alkyl group having 3 to 12 carbon atoms, or alternatively, $R^1$, $R^2$, $R^3$ and $R^4$ are bonded with each other to form an alicycle or an aromatic ring; $R^7$ represents a methyl group, an ethyl group, or a linear, branched, or cyclic alkyl group having 3 to 12 carbon atoms, and wherein the cyclic Z in the general formula (4) represents any one of cyclic structures shown by the following general formulae:

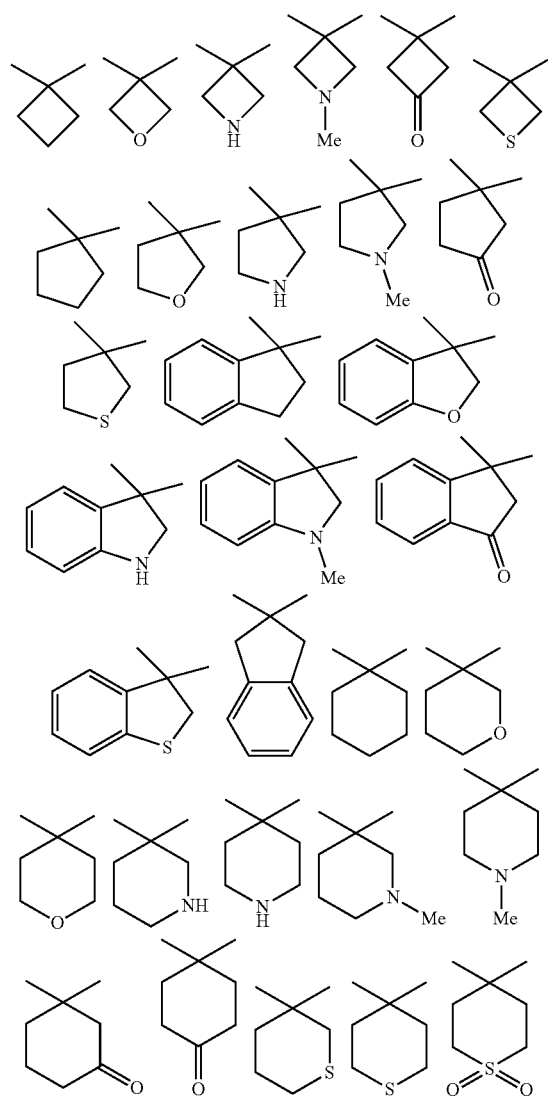

122

-continued

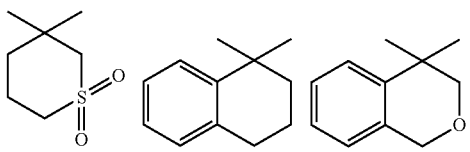
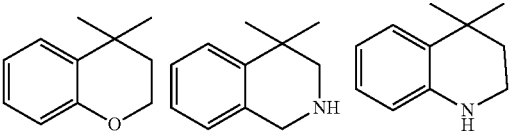
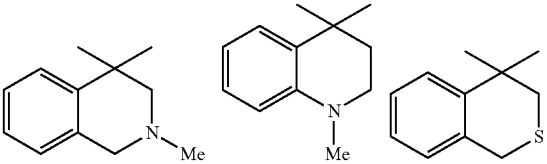
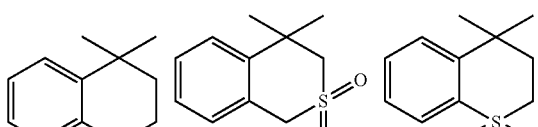
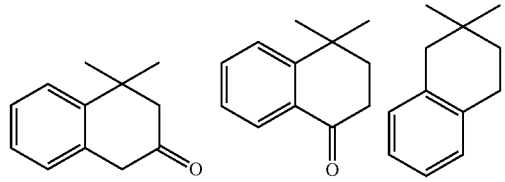
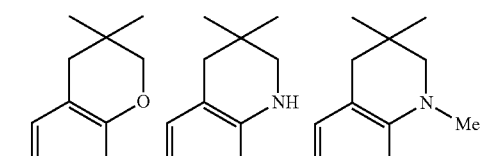
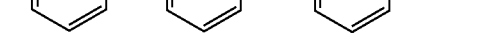
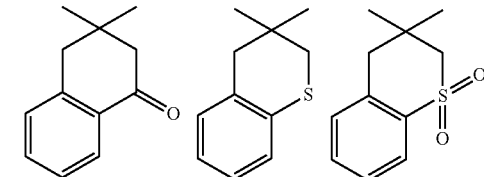
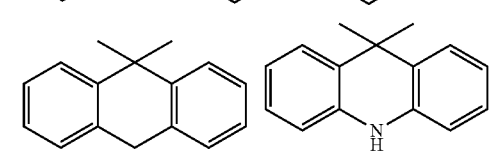
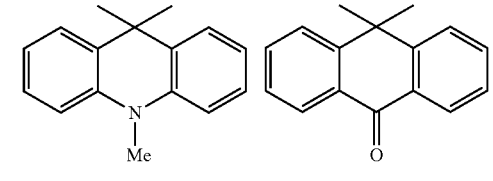
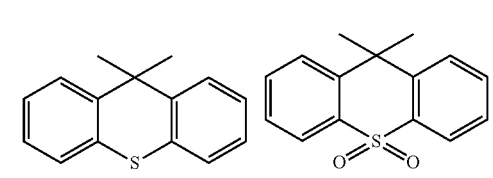

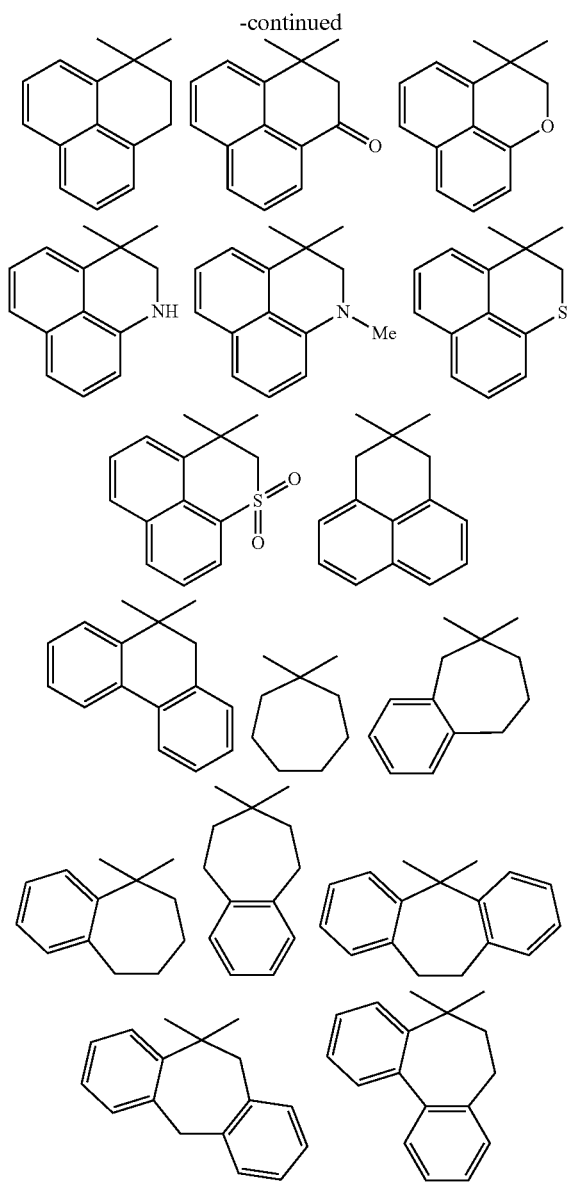

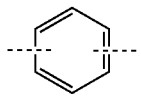

where the dotted line represents a bond; "A" represents a hydroxy group or a halogen atom; "j" represents 0 or 1; when "j" is 0, each cyclic structure Z is directly linked to the phthalic anhydride structures in the general formula (3) or the benzoic acid structures in the general formula (4); and when "j" is 1, $X_2$ represents a divalent linking group, and $X_1$ represents any one of the following general formulae (5), (6), (7), (9), and (10),

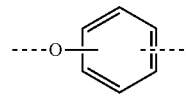 (5)

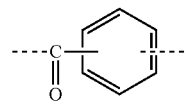 (6)

(7)

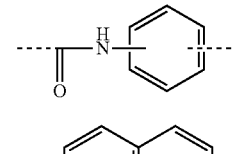

(9)

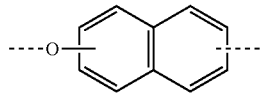 (10)

where the dotted line represents a bond.

\* \* \* \* \*